(12) United States Patent
Guo et al.

(10) Patent No.: US 12,368,278 B2
(45) Date of Patent: Jul. 22, 2025

(54) CHIP-INTEGRATED MODE-LOCKED LASERS BASED ON THIN-FILM NONLINEAR WAVEGUIDES

(71) Applicant: California Institute of Technology, Pasadena, CA (US)

(72) Inventors: Qiushi Guo, Pasadena, CA (US); Alireza Marandi, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 778 days.

(21) Appl. No.: 17/500,425

(22) Filed: Oct. 13, 2021

(65) Prior Publication Data
US 2022/0123516 A1 Apr. 21, 2022

Related U.S. Application Data

(60) Provisional application No. 63/255,118, filed on Oct. 13, 2021, provisional application No. 63/090,942, filed on Oct. 13, 2020.

(51) Int. Cl.
*H01S 3/1118* (2023.01)
*H01S 3/063* (2006.01)
(Continued)

(52) U.S. Cl.
CPC .......... *H01S 3/1118* (2013.01); *H01S 3/0632* (2013.01); *H01S 3/0637* (2013.01);
(Continued)

(58) Field of Classification Search
CPC ........ H01S 3/083; H01S 3/0632; H01S 3/109; H01S 3/1108; H01S 3/1112; H01S 3/115; H01S 3/1118
See application file for complete search history.

(56) References Cited

U.S. PATENT DOCUMENTS 7,050,212 B2 * 5/2006 Matsko ................... H01S 3/063
359/239
8,194,709 B2 * 6/2012 Kaertner ................. H01S 3/067
372/99

(Continued)

OTHER PUBLICATIONS

Wang, "Incorporation of erbium ions into thin-film lithium niobate integrated photonics," Apr. 2020, Appl. Phys. Lett. 116, 151103-1-151103-5 (Year: 2020).*

(Continued)

*Primary Examiner* — Michael Carter
(74) *Attorney, Agent, or Firm* — GATES & COOPER LLP

(57) ABSTRACT

A chip-scale mode-locked laser including a cavity including a gain medium for amplifying signal electromagnetic radiation (signal) through stimulated emission, the signal comprising a signal wavelength; and a passive or active mode-locking device to enforce pulse formation in the laser. The mode-locking device includes a thin-film waveguide having a thickness on the order of the signal wavelength so as to confine and guide the signal along the thin-film waveguide, and a material comprising a second-order nonlinear susceptibility to enable active or passive mode-locking of the signal. The mode-locking device leads to generation of pulses of the signal outputted from the mode-locked laser.

18 Claims, 45 Drawing Sheets

(51) Int. Cl.
| | |
|---|---|
| H01S 3/083 | (2006.01) |
| H01S 3/094 | (2006.01) |
| H01S 3/109 | (2006.01) |
| H01S 3/1109 | (2023.01) |
| H01S 3/1112 | (2023.01) |

(52) U.S. Cl.
CPC ...... H01S 3/094026 (2013.01); H01S 3/1109 (2013.01); H01S 3/1112 (2013.01); H01S 3/083 (2013.01); H01S 3/109 (2013.01)

(56) References Cited

U.S. PATENT DOCUMENTS

| | | | | |
|---|---|---|---|---|
| 2005/0063426 | A1* | 3/2005 | Sparacin | H01S 3/0632 372/6 |
| 2009/0015906 | A1* | 1/2009 | Kimerling | H01S 3/0632 359/341.5 |
| 2014/0269800 | A1* | 9/2014 | Purnawirman | H01S 3/17 359/344 |
| 2022/0311201 | A1* | 9/2022 | Sun | H01S 3/0637 |

OTHER PUBLICATIONS

Schibli, T.R., et al., "Phase-locked widely tunable optical single-frequency generator based on a femtosecond comb" Optics Letters, Sep. 2005, pp. 2323-2325, vol. 30, No. 17.

Diddams, S.A., et al., "An Optical Clock Based on a Single Trapped 199Hg1 Ion", Science, Aug. 2001, pp. 825-828, vol. 293.

McMahon, P.L., et al., "A fully programmable 100-spin coherent Ising machine with all-to-all connections" Science, Nov. 2016, pp. 614-617, vol. 354, Issue 6312.

Inagaki, T., et al., "A coherent Ising machine for 2000-node optimization problems", Science, Nov. 2016, pp. 603-606, vol. 354, Issue 6312.

Picque, N., et al., "Frequency comb spectroscopy", Nature Photonics, 2019, pp. 146-157, vol. 13.

Frankis, H.C., et al., "Erbium-doped TeO2-coated Si3N4 waveguide amplifiers with 5 dB net gain", Photonics Research, Feb. 2020, pp. 127-134, vol. 8, No. 2.

Kik, P.G., et al., "Erbium doped optical waveguide amplifiers on silicon", MRS Bulletin, Apr. 1998, pp. 48-54, vol. 23, No. 4.

Singh, N., et al., "Towards CW modelocked laser on chip—large mode area and NLI for stretched pulse mode locking", arXiv preprint arXiv:2006.00942, 2020, pp. 1-12.

Ronn, J., et al., "Ultra-high on-chip optical gain in erbium-based hybrid slot waveguides", Nature Communications, 2019, pp. 1-9, vol. 10, No. 432.

Gallo, K., et al., "All-optical diode in a periodically poled lithium niobate waveguide", Applied Physics Letters, Jul. 2001, pp. 314-316, vol. 79, No. 3.

Ledezma, L., et al., "Intense optical parametric amplification in dispersion-engineered nanophotonic lithium niobate waveguides", Optica, 2021, arXiv preprint arXiv:2104.08262, pp. 1-6.

Wang, C., et al., "Ultrahigh-efficiency wavelength conversion in nanophotonic periodically poled lithium niobate waveguides", Optica, Nov. 2018, pp. 1438-1441, vol. 5, No. 11.

Chen, J-Y, et al., Ultra-efficient frequency conversion in quasiphase-matched lithium niobate microrings, Optica, Sep. 2019, pp. 1244-1245, vol. 6, No. 9.

Jankowski, M., et al., "Ultrabroadband nonlinear optics in nanophotonic periodically poled lithium niobate waveguides", Optica, Jan. 2020, pp. 40-46, vol. 7, No. 1.

He, Y., et al., "Self-starting bi-chromatic LiNbO3 soliton microcomb", Optica, Sep. 2019, pp. 1138-1144, vol. 6, No. 9.

Wittig, C., "The Landau-Zener Formula", J. Phys. Chem. B, 2005, pp. 8428-8430, vol. 109.

Phillips, C.R., et al., "Supercontinuum generation in quasi-phasematched waveguides", Optics Express, Sep. 2011, pp. 18754-18773, vol. 19, No. 20.

Jundt, D.H., "Temperature-dependent Sellmeier equation for the index of refraction, ne, in congruent lithium niobate", Optics Letters, Oct. 1997, pp. 1553-1555, vol. 22, No. 20.

Guo, X., et al., "70 dB long-pass filter on a nanophotonic chip", Optics Express, Sep. 2016, pp. 21167-21176, vol. 24, No. 18.

Ono, M., et al., "Ultrafast and energy-efficient all-optical switching with graphene-loaded deep-subwavelength plasmonic waveguides", Nature Photonics, Jan. 2020, pp. 37-43, vol. 14.

Zhao, J., et al., "Shallow-etched thin-film lithium niobate waveguides for highly-efficient second-harmonic generation", Optics Express, Jun. 2020, pp. 19669-19682, vol. 28, No. 13.

Nozaki, K., et al., "Sub-femtojoule all-optical switching using a photonic-crystal nanocavity", Nature Photonics, Jul. 2010, pp. 477-483, vol. 4.

Tanabe, T., et al., "Fast all-optical switching using ionimplanted silicon photonic crystal nanocavities", Applied Physics Letters, 2007, pp. 031115-1-031115-3, vol. 90.

Hiu, X., et al., "Picosecond and low-power all-optical switching based on an organic photonic-bandgap microcavity", Nature Photonics, Mar. 2008, pp. 185-189, vol. 2.

Zhang, M., et al., "Broadband electro-optic frequency comb generation in a lithium niobate microring resonator", Nature, Apr. 2019, pp. 373-377, vol. 568.

Demirtas, M., et al., "High-Gain Er3+:Al2O3 On-Chip Waveguide Amplifiers", IEEE Journal of Selected Topics in Quantum Electronics, Sep./Oct. 2020, pp. 1-8, vol. 26, No. 5.

Husko, C., et al., "Ultrafast all-optical modulation in GaAs photonic crystal cavities", Applied Physics Letters, 2009, pp. 021111-1-021111-3, vol. 94.

Ibrahim, T.A., et al., "All-Optical Switching in a Laterally Coupled Microring Resonator by Carrier Injection", IEEE Photonics Technology Letters, Jan. 2003, pp. 36-38, vol. 15, No. 1.

Li, Y., et al., "Ultrafast all-optical switching with low saturation energy via intersubband transitions in GaN/AlN quantum-well waveguides", Optics Express, Dec. 2007, pp. 17922-17927, vol. 15, No. 26.

Simoyama, T., et al., "Absorption Dynamics in All-Optical Switch Based on Intersubband Transition in InGaAs—AlAs—AlAsSb Coupled Quantum Wells", IEEE Photonics Technology Letters, Apr. 2007, pp. 604-606, vol. 19, No. 8.

Cong, G.W., et al., "Low-saturation-energy-driven ultrafast alloptical switching operation in (CdS/ZnSe)/BeTe intersubband transition", Optics Express, Sep. 2007, pp. 12123-12130, vol. 15, No. 19.

Ilzuka, N., et al., "All-Optical Switch Utilizing Intersubband Transition in GaN Quantum Wells", IEEE Journal of Quantum Electronics, Aug. 2006, pp. 765-771, vol. 42, No. 8.

Pelc, J.S., et al., "Picosecond all-optical switching in hydrogenated amorphous silicon microring resonators", Optics Express, Feb. 2014, pp. 3797-3810, vol. 22, No. 4.

Martinez, A., et al., "Ultrafast All-Optical Switching in a Silicon-Nanocrystal-Based Silicon Slot Waveguide at Telecom Wavelengths", Nano Letters, 2010, pp. 1506-1511, vol. 10.

Waldow, M., et al., "25ps all-optical switching in oxygen implanted silicon-on-insulator microring resonator", Optics Express, May 2008, pp. 7693-7702, vol. 16, No. 11.

\* cited by examiner

CHIP-INTEGRATED MODE-LOCKED LASERS BASED ON THIN-FILM NONLINEAR WAVEGUIDES

CROSS REFERENCE TO RELATED APPLICATIONS

This application claims the benefit under 35 USC 119(e) of the commonly assigned U.S. Provisional Patent Applications:

U.S. Provisional Patent Ser. No. 63/090,942, filed Oct. 13, 2020, by Qiushi Guo and Alireza Marandi, entitled "CHIP-INTEGRATED MODE-LOCKED LASERS BASED ON THIN-FILM NONLINEAR WAVEGUIDES," (CIT-8553), and U.S. Provisional Patent Ser. No. 63/255,118, filed Oct. 13, 2021, by Qiushi Guo and Alireza Marandi, entitled "FEMTOJOULE, FEMTOSECOND ALL-OPTICAL SWITCHING IN NANO-WAVEGUIDES WITH ENGINEERED QUASI-PHASE MATCHING AND DISPERSION," (CIT-8553-P2), both of which applications are incorporated by reference herein.

STATEMENT REGARDING FEDERALLY SPONSORED RESEARCH AND DEVELOPMENT

This invention was made with government support under grant no. W911NF-18-1-0285 awarded by the Army Research Office (ARO), Grant nos. 1846273 and 1918549 awarded by the National Science Foundation (NSF), and grant Nos. FA9550-20-1-0040 awarded by the Air Force Office of Scientific Research (AFOSR). The government has certain rights in the invention.

BACKGROUND OF THE INVENTION

1. Field of the Invention

The present invention relates to mode-locked lasers and methods of making the same.

2. Description of the Related Art

A mode-locked laser (MLL) is a laser that emits a periodic train of ultrashort pulses with high peakpower with low timing jitter. Since its discovery, it has enabled numerous optical technologies such as nonlinear optical signal generation, optical frequency synthesis and broadband coherent communication [1], optical atomic clocks [2], photonic analog computing [3, 4], optical frequency combs and spectroscopic sensing systems [5], to name a few. Today's state-of-the-art MLLs based on fiber, and free-space optical components are expensive and bulky table-top systems built upon discrete components, including the gain medium, semiconductor or nonlinear saturable absorbers and passive optical components such as fibres or cavity mirrors. The chip-scale integration of MLL can revolutionize the field of ultrafast by reducing the device footprint, cost, and power consumption by many orders of magnitude, thus transforming the lab-based table-top systems into power-efficient portable light sources for more widespread w applications. Moreover, the compact size of the gain cavity integrated on a chip together with an on-chip passive mode-locking technique could provide GHz-level pulse repetition rates with pulse durations in the femtosecond regime without any external repetition rate multiplication. Therefore, the chip-scale MLL is expected to make a major impact in applications such as two-photon microscopy, LIDAR systems and on-chip photonic microsystems for sensing and computing.

Despite the technological importance of chip-scale MLL and the successful demonstrations of various integrated photonic devices in recent years, a few obstacles have significantly impeded the development of chip-scale MLL. First, obtaining high optical gain on chip remains challenging. Typical rare earth ion-based integrated waveguide amplifiers exhibit modest small-signal gain ~1-2 dB/cm[6, 7], as the rare-earth ion is limited to less than one atomic percent due to quenching and up-conversion effects of active ions at higher concentration levels. Such a low gain significantly limits the output power and the power efficiency of the laser. Second, there is a lack of energy-efficient saturable absorbers that can be fully integrated on chip. The fabrication of semiconductor based saturable absorbers is usually not CMOS compatible. Although on-chip artificial saturable absorbers based on Kerr optical nonlinearity have also been proposed and demonstrated [8], they in general require high peak power when operating because of the weak third-order nonlinearity, and therefore sets a high requirement on the active gain material as well as the quality factor of the laser cavity.

SUMMARY OF THE INVENTION

Embodiments of the present invention utilize the strong second-order nonlinearities of specific thin-film material platforms (such as lithium niobate, aluminium nitride, GaP, etc.) to realize an integrated nonlinear mode-locking scheme as the building block of on-chip mode-locked lasers. Illustrative embodiments using thin-film waveguides (comprising e.g., lithium niobate) are characterized experimentally and numerically using linear and nonlinear numerical simulations. Specifically, we show proof of designs for a chip-scale, highly efficient MLL which can generate femtosecond pulses at a high repetition rate (>1 GHz). The example devices are fabricated on thin-film lithium niobate (TFLN), an emerging photonic material platform.

In one design, a central aspect of our innovation is the combination of (1) the integrated photonic waveguides and resonators based on TFLN with low propagation loss (2) an integrated mode-locking device ultralow saturation energy on the order of femto joules (fJ) that leverages the strong quadratic nonlinearity of the nanoscale periodically poled lithium niobate (PPLN) waveguides, and (3) highly efficient Erbium-doped Al2O3 gain medium grown by the state-of-the-art atomic layer deposition (ALD) technique, which exhibits net modal gain more than 10 dB/cm according to recent reports [9, 10]. Although the MLLs discussed here operate at telecom wavelengths using Erbium-doped Al2O3 as the gain medium, they can easily be adapted to any other rare-earth ion-doped materials which emit light at other wavelengths, for instance, Yb, Ti, Nd, Ho, and Tm.

In another MLL design, the integrated nonlinear mirror saturable absorber based on TFLN can be butt-coupled with an external gain medium such as a semiconductor optical amplifier (SOA), thus enabling the realization of a compact MLL, module. Given the diverse light-emitting spectral ranges of the SOAs, this second design can provide diversity in operational wavelength.

In another MLL design, the integrated nonlinear mirror saturable absorber based on TFLN can be butt-coupled with an external gain medium such as a semiconductor optical amplifier (SOA), thus enabling the realization of a compact MLL module. Given the diverse light-emitting spectral ranges of the SOAs, this second design can provide diversity in operational wavelength.

In another embodiment, we demonstrate all-optical switching using an integrated nonlinear splitter device based on lithium niobate nanophotonic waveguides, which combines quasi-phase match engineering and dispersion engineering. We demonstrate the all-optical switching with ultra-low energies down to tens of femtojoules, a near-instantaneous switching time of 18 fs, and a large extinction ratio of more than 5 dB. Our nonlinear splitter enables the simultaneous realization of switch-on and -off operations and features the switching energy-time product down to $1.4 \times 10^{-27}$ J s, which is an order of magnitude lower than previous demonstrations. Our results represent an essential step toward the development of on-chip ultrafast all-optical information processing, computing and light sources.

Fabrication techniques are further disclosed.

Illustrative embodiments of the present invention include, but are not limited to, the following.

1. A chip-scale mode-locked laser, comprising:
   a cavity comprising:
      a gain medium for amplifying signal electromagnetic radiation (signal) through stimulated emission, the signal comprising a signal wavelength; and
      a passive or active mode-locking device to enforce pulse formation in the laser, the mode-locking device comprising:
         a thin-film waveguide having a thickness on the order of the signal wavelength so as to confine and guide the signal along the thin-film waveguide,
         a material comprising a second-order nonlinear susceptibility to enable active or passive mode-locking of the signal, and
      wherein the mode-locking device leads to generation of pulses of the signal outputted from the mode-locked laser.

2. The mode-locked laser of example 1, wherein the gain medium comprises a second material deposited on or integrated with the thin-film waveguide, providing the stimulated emission of the signal in a presence of a pump electromagnetic radiation (pump) pumping the second material.

3. The mode-locked laser of example 2, wherein the gain medium comprises a rare-earth ion-doped oxide.

4. The mode-locked laser of example 2, wherein the second material comprises a rare-earth ion-doped oxide gain grown on top of the waveguide by atomic layer deposition (ALD) process or rare-earth ions diffused into the waveguide at a high temperature.

5. The mode-locked laser of example 1, wherein the thin-film waveguide comprises a ridge having a width and the thickness guiding a mode associated with the signal, or a pump electromagnetic radiation optically pumping the gain medium to form the signal, with most of the mode's energy confined in a transverse cross-sectional area of the waveguide smaller than 3 micrometers by 3 micrometers.

6. The mode-locked laser of example 1, wherein:
   the signal is formed in response to an input pump electromagnetic radiation pumping the gain medium,
   the input pump is continuous wave, and
   the pulses each have a pulse width of less than 100 picoseconds.

7. The mode-locked laser of example 1, wherein:
   the gain medium comprises a semiconductor material that can be pumped either by pump electromagnetic radiation or electric current, and
   the gain medium is integrated with the thin-film waveguide either through evanescent coupling or butt coupling.

8. The mode-locked laser of example 7, wherein the thin-film waveguide is butt-coupled to the gain medium and an input port of the thin-film waveguide is adiabatically tapered in width in order to match one or more mode sizes of the pump electromagnetic radiation in the thin-film waveguide and in the gain medium.

9. The mode-locked laser of example 7, wherein the thin-film waveguide is heterogeneously integrated with the gain medium through wafer bonding or micro-transfer-printing process and so that a transfer of the signal between the thin-film waveguide and the gain medium is through evanescent coupling.

10. The mode-locked laser of example 7, wherein the mode-locking device is a passive mode-locking device that provides an intensity-dependent transmission or reflection for the signal, further comprising:
   a thin-film waveguide having a thickness on the order of the signal wavelength so as to confine and guide the signal along the thin-film waveguide,
   the material comprising the second-order nonlinear susceptibility enabling second harmonic generation and optical parametric amplification of the signal along the waveguide; and
   an output directional coupler providing:
   different coupling ratios for the signal and a second harmonic of the signal (second harmonic).

11. The mode-locked laser of example 7, wherein the mode-locking device comprises an nonlinear mirror to enforce the pulse formation and passive mode-locking of the signal electromagnetic radiation.

12. The mode-locked laser of example 11, wherein the nonlinear mirror comprises metal electrodes next to the thin-film waveguide, a relative phase between the signal and the second harmonic of the signal can be adjusted by applying a voltage on the electrodes according to an electro-optical effect.

13. The mode-locked laser of example 11, wherein an output facet of the nonlinear mirror is mechanically polished and coated with a dielectric coating, and the dielectric coating ensures partial reflection of the signal and unity reflection of the second harmonic.

14. The mode-locked laser of example 7, wherein the mode-locking device is an active mode-locking device comprising an electro-optic modulator comprising metal electrodes next to the thin-film waveguide, wherein a radio-frequency voltage source applied on the electrodes applies an electric field across the thin-film waveguide so as to periodically modulate a refractive index of the thin-film according to an electro-optical effect.

15. The mode-locked laser of example 14, wherein the waveguide further comprises an output coupler comprising a loop mirror.

16. The mode-locked laser of example 1, wherein the material of the thin-film waveguide comprises lithium niobate, lithium tantalate, Potassium Titanyl Phosphate (KTP), aluminum nitride, gallium arsenide, indium phosphide, or aluminum gallium arsenide.

17. The mode-locked laser of example 1, wherein: the mode-locking device comprises a passive mode-locking device;
   the waveguide comprises a plurality of quasi-phase-matched regions through spatially varying nonlinear susceptibility, for instance through ferroelectric poling or orientation patterning, that ensures phase-matched second-order nonlinear interactions:

in a first region of the waveguide, wherein the mode locking device generates a second harmonic electromagnetic radiation comprising a second harmonic of the signal wavelength through the non-linear interaction comprising second harmonic generation, in a second region, wherein the device down-converts at least a portion of the second harmonic electromagnetic radiation into the signal wavelength through the non-linear interaction comprising optical parametric amplification;

the device further comprising an output coupler that preferentially couples the signal out of the laser cavity, as compared to the second harmonic, so as to selectively enhance resonance of higher intensity signal modes of the signal while suppressing resonance of lower-intensity signal modes in the cavity due to the stronger second harmonic generation processes in the first region of the waveguide and the stronger optical parametric amplification process in the second region of the waveguide for the higher intensity modes as compared to the lower intensity modes, and the electromagnetic radiation coupled out of the cavity through the output coupler comprises a train of the mode-locked pulses each having a pulse duration of less than 100 picoseconds.

18. The mode-locked laser of example 11, wherein the waveguide comprises:

a first quasi-phase-matched region phase-matched nonlinear process is the second harmonic generation of signal, a second quasi-phase-matched region wherein the signal is parametrically amplified by the second harmonic, a third region between the first region and the second region to provide an approximately 180 phase shift in the relative phase of the signal and the second harmonic.

BRIEF DESCRIPTION OF THE DRAWINGS

For a fuller understanding of the nature and desired objects of the present invention, reference is made to the following detailed description taken in conjunction with the accompanying drawing Figure wherein like reference characters denote corresponding parts throughout the several views.

FIG. 1A-1B depict the chip-scale integrated mode-locked laser fabricated on thin-film lithium niobate on insulator (LNOI) substrate, wherein FIG. 1A is a first view and FIG. 1B is a second view.

FIGS. 2B and 2C present the simulated optical mode profile of 980 nm pump light (Fundamental TM mode) and 1550 nm (Fundamental TE mode) in the gain region, respectively. In the design, the top width of the LN waveguide is 1.3 μm and the slant angle of the waveguide sidewall is 60°. The etching depth of the waveguide is 250 nm and the total thickness of the TFLN is 350 nm. The top $Er^{3+}$: $Al_2O_3$ cladding has a thickness of 100 nm. Both 980 pump light and 1550 nm signal have significant modal overlapping with the $Er^{3+}$: $Al_2O_3$ cladding layer, thus ensuring efficient pumping of the gain medium and signal amplification

FIG. 4A-4B depicts the on-chip WDMs, wherein FIG. 4A is the top-view of a WDM, which guides the 1550 nm signal light (Fundamental TE mode) and the 980 nm pump light (Fundamental TM mode) into two independent channels, and FIG. 4B shows the coupling efficiency from port 1 to port 2 as a function of coupling length (L) for 980 and 1550 nm light simulated an FDE solver (Lumerical MODE). In the design, $W_1$=0.8 μm, $W_2$=1.0 μm, g=300 nm and the etching depth of the TFLN waveguide is 250 nm. The total thickness of the TFLN is 350 nm. When the L is greater than 200 μm, the coupling efficiency of 1550 nm signal light to port 2 is greater than 99%, while maintaining a low coupling efficiency for 980 nm pump light.

FIG. 6A shows the simulated transmission of 1 ps 1550 nm signal light pulse as a function of the pulse energy using a split-step Fourier method (SSFM). The inset shows the transmission for low energy pulse. FIG. 6B shows the calculated transmission of 1 ps 1550 nm signal light pulse as a function of the peak power. In the calculation, we assumed L1=L2=650 μm, the group velocity mismatch (GVM) between the 1550 nm and 775 nm light is 350 fs/mm, the group velocity dispersion (GVD) of 1550 nm and 775 nm are 500 $fs^2$/mm and 220 $fs^2$/mm, respectively. The effective mode area for 1550 nm TE mode is 0.6 $μm^2$. The GVM, GVD and mode area values were obtained from an FDE solver (Lumerical MODE).

FIG. 7A illustrates the pulse evolution of the pulse in the time domain for 200 roundtrips. The mode-locking is self-starting from the amplified spontaneous emission (ASE) noise. FIG. 7B shows the evolution and saturation of the laser gain. FIG. 7C shows the evolution of the pulse duration. The results shown in FIG. 7 A-C were simulated using a split-step Fourier method (SSFM) and by assuming a small signal gain of 5 dB in the gain region and a net normal GVD of 7000 $fs^2$ per roundtrip in the laser cavity.

FIG. 11A shows an SEM image of the fabricated nonlinear splitter device. The device has a 2.5-mm-long SHG region and a 3.5-mm-long DOPA region. The directional coupler has a coupling length of 70 μm and a gap of 650 nm; FIG. 11B shows the atomic force microscope image of the waveguide. FIG. 11C shows two-photon microscope image showing the inverted domains and the poling defect along the waveguides. FIG. 11D shows simulated group velocity mismatch (GVM, red) and group velocity dispersion (GVD, blue) for the quasi-TE modes of the dispersion-engineered lithium niobate waveguide. The optimized waveguide has a top width of 1,650 nm, an etching depth of 350 nm and a total thin-film thickness of 700 nm. The waveguide exhibits low GVM between the pump at 1045 nm and the signal around 2090 nm, and low GVD for both wavelengths. Inset: Electric field distributions of the fundamental quasi-TE modes for the dispersion-engineered waveguide at 1045 nm and 2090 nm.

FIG. 12B, upper panel shows average output power of FH from the main waveguide as a function of input average power/pulse energy. Lower panel: normalized transmittance of the FH from the main waveguide. In both FIG. 12A and FIG. 12B, the blue solid lines are the simulation results. The black symbols are the measurement results.

FIG. 13A shows the experimental setup for femtosecond all-optical switching measurement. 46-fs pulses at 2.09 μm generated from a free-space optical parametric oscillator (OPO) were used to characterize the device. A pump and probe field with relative time delay Δτ is injected into the waveguide via the objective lens. Probe transmission depends on whether the two pulses excite the device simultaneously or at different times. LPF: long-pass filter; MM: motorized mirror; PZT: piezoelectric transducer; NDF: neutral density filter; BS: beam splitter; OBJ: objective lens; LIA: lock-in amplifier; PD: photodetector. FIG. 13B shows the measured switching-on dynamics of the nonlinear splitter device in the main waveguide. FIG. 13C shows the measured switching-off dynamics in the output coupler. Switch-off and switch-on regimes are shown in FIG. 13B and FIG. 13C, respectively.

FIG. 13D and FIG. 13E show the normalized extinction ratio at different input pulse energies for the "switch-on" and "switch-off".

FIGS. 20A-20B. Deterministically finding the quasi-phase matching condition, wherein FIG. 20A shows simulated output FH power at the drop port as a function input FH power and the phase mismatch. App denotes the offset to the nominal poling period (pp). FIG. 20B shows measured output FH power at the output coupler as function of input FH power and temperature.

FIG. 21A. Measured (black symbols) and simulated (solid lines) output FH power at the drop port as a function of input FH power. The simulation assumes different combinations of input/output coupling losses, while the total coupling loss is fixed at 25.6 dB. FIG. 21B. Measured (black symbols) and simulated (solid lines) output FH power at the drop port. The simulation results assuming a GDD of input pulse of 362 fs$^2$, 0$^2$ and −362 fs$^2$ are shown in green, red and blue. All simulations assume 21.6 dB/4 dB input/output coupling losses FIG. 22A-22B. Ultrafast nonlinear dynamics in the SHG region.

FIG. 23A: simulated time-domain output of the fundamental (FH) and the second harmonic (SH) under various input pulse energies. The FH and SH pulses are represented by the red and the blue pulses. FIG. 23B: simulated output spectra under various input pulse energies (blue solid lines). The dashed lines are the spectra of the input pulses. In the simulation, the device has a 2.5-mm-long SHG region, a 3.5-mm-long DOPA region, 85% (5%) of outcoupling of the FH (SH) in the directional coupler. We also assume the propagation loss of FH and SH are both 1 dB/cm.

FIG. 25A Upper panel: average output power of 2.09 μm FH from the drop port as a function of on-chip input average power/pulse energy. Lower panel: normalized transmittance of the FH at the drop port. FIG. 25B. Upper panel: average output power of FH from the through port as a function of input average power/pulse energy. Lower panel: normalized transmittance of the FH from the through port. In both FIG. 25A and FIG. 25B, the blue solid lines are the simulation results. The black symbols are the measurement results. The regions highlighted in yellow are the all-optical switching regimes.

FIG. 28A Simulated power evolution of the fundamental (FH) and the second harmonic (SH) as a function of the propagation distance. FIG. 28B Simulated FH output power versus the input power. FIG. 28C. Normalized transmittance as a function of input pulse energy in the sub-fJ regime.

DETAILED DESCRIPTION OF THE INVENTION

Figure 1A:
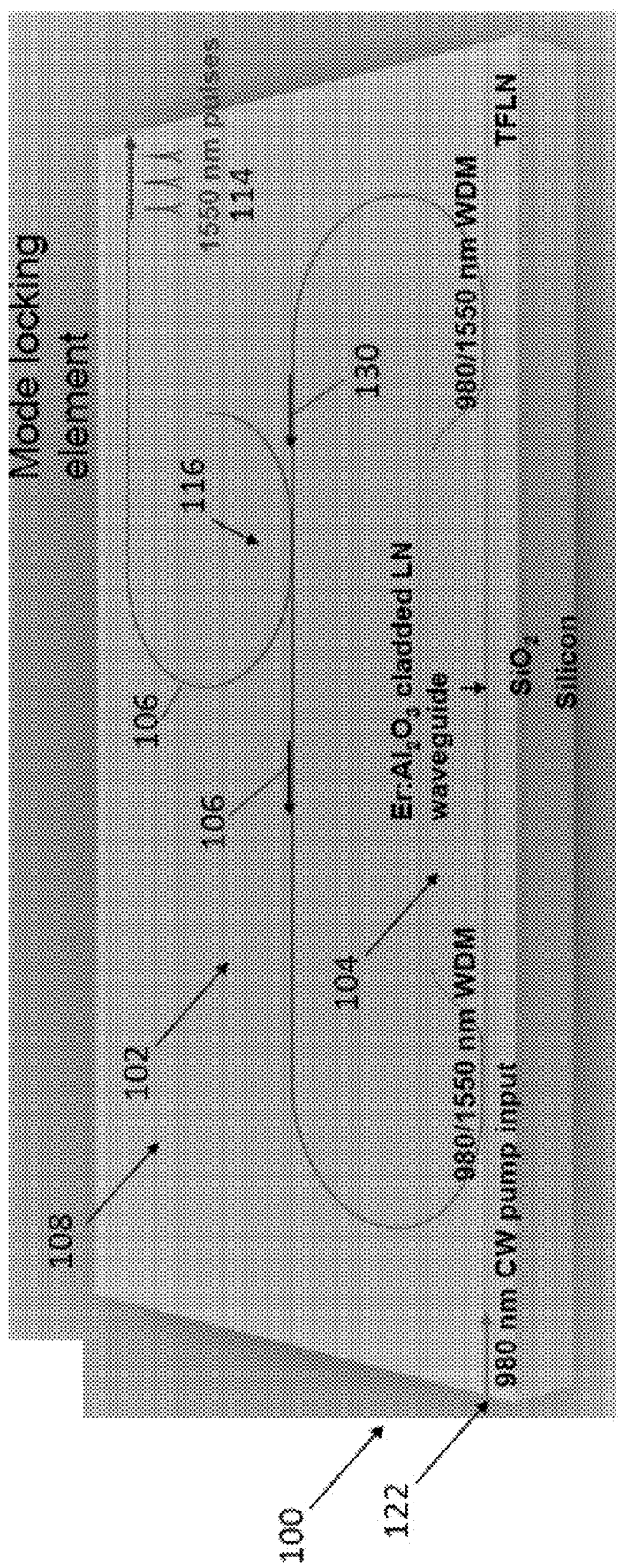

In the following description of the preferred embodiment, reference is made to the accompanying drawings which form a part hereof, and in which is shown by way of illustration a specific embodiment in which the invention may be practiced. It is to be understood that other embodiments may be utilized, and structural changes may be made without departing from the scope of the present invention.
Technical Description FIGS. 1-10 illustrate a mode-locked laser 100 comprising a cavity 102 comprising gain medium 104 for amplifying signal electromagnetic radiation (signal) 106 through stimulated emission; and a mode-locking device 108 comprising a thin-film waveguide 110. The thin-film waveguide comprises a material 112 comprising a second-order nonlinear susceptibility to enable active or passive mode-locking. The thin-film waveguide has a thickness T on the order of the signal wavelength so as to tightly confine and guide the signal along the thin-film waveguide. The mode-locking device leads to generation of pulses 114 of electromagnetic radiation of the signal by the mode-locked laser.

FIGS. 1-7 illustrate examples wherein the second order non-linear susceptibility enables second harmonic generation and optical parametric amplification of the signal along the waveguide. The mode-locking device further comprises an output coupler 116 that preferentially couples the signal 106 out of the laser cavity, as compared to the second harmonic, so as to selectively enhance the resonance of the higher intensity signal modes while suppressing resonance of the lower-intensity signal modes in the cavity due to the stronger second harmonic generation processes in the first region of the waveguide and the stronger optical parametric amplification process in the second region of the waveguide. The electromagnetic radiation coupled out of the cavity through the output coupler comprises a train of the mode-locked pulses each having a pulse duration of less than 100 picoseconds.

Figure 8:
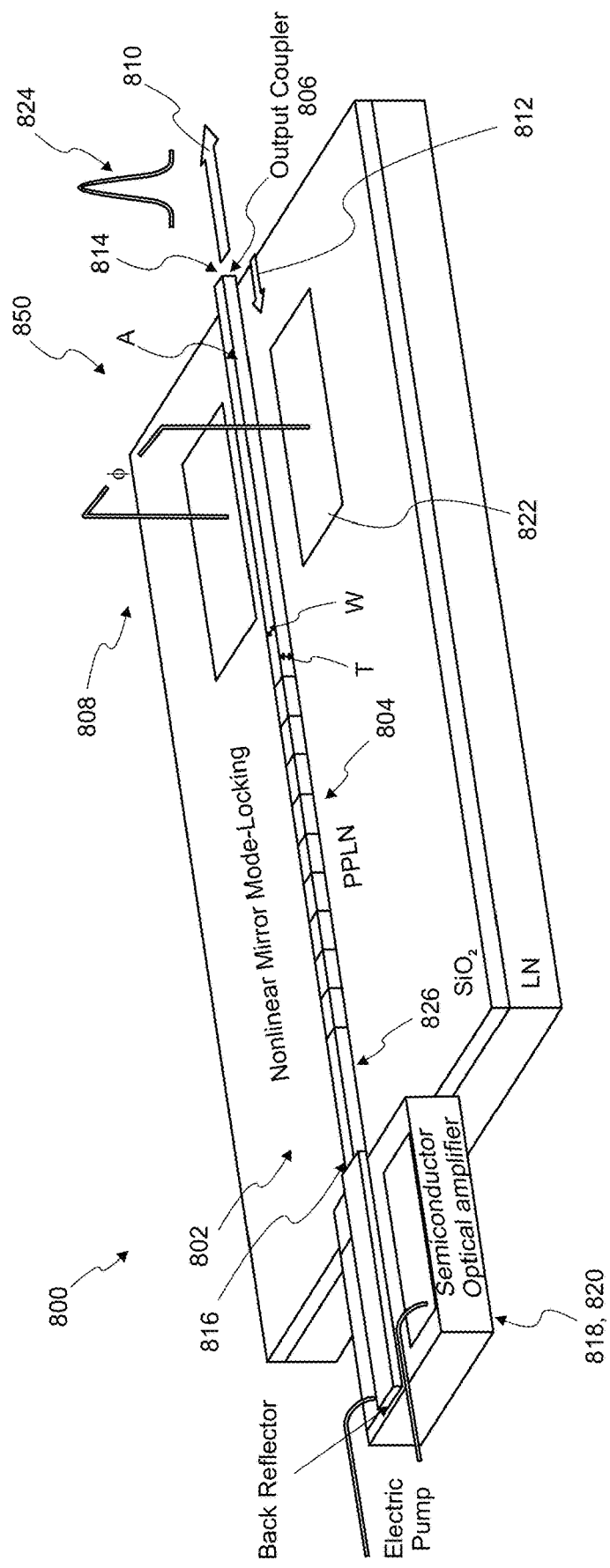
FIG. 8 depicts another design of MLL module by integrating an integrated nonlinear mirror SA with a semiconductor optical amplifier (SOA) chip. An electro-optical modulator is used to control the relative phase between the fundamental and second harmonic.
Figure 9:
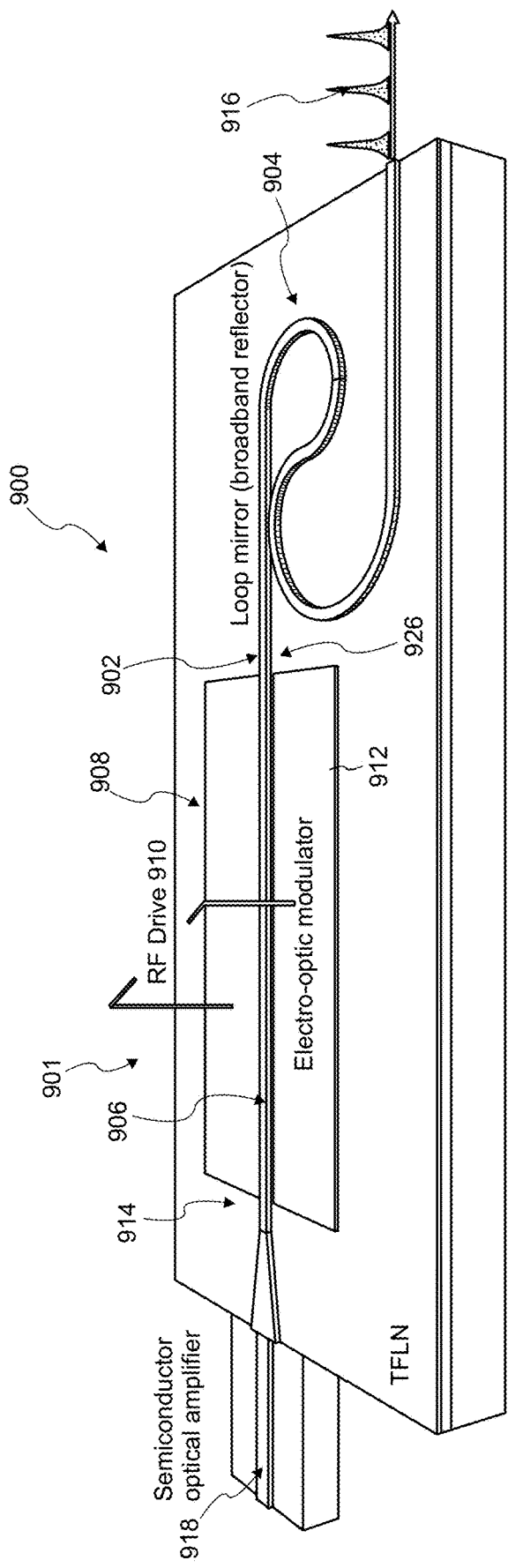
FIG. 9 illustrates an active mode-locking example. The active mode-locking device is composed of an electro-optic modulator comprising metal electrodes next to the thin-film waveguide, wherein the radio-frequency voltage source applied on the electrodes applies an electric field across the thin-film waveguide so as to periodically modulate the refractive index of the thin-film according to an electro-optical effect.

FIG. 8 illustrates an embodiment including a nonlinear mirror and FIG. 9 illustrates and active mode-locking embodiment.

Various examples of the mode-locked laser are described in the following sections.

First Example: Mode-Locking Using a Waveguide Coupled to Laser Gain Medium Made of a Rare-Earth Ion Doped Oxides FIG. 1 illustrates a laser composed of the gain region 104 made of a long LN waveguide cladding by Erbium-doped $Al_2O_3$ thin film, two on-chip wavelength-division multiplexers (WDMs) and an integrated mode-locking device 108.

Figure 2B:
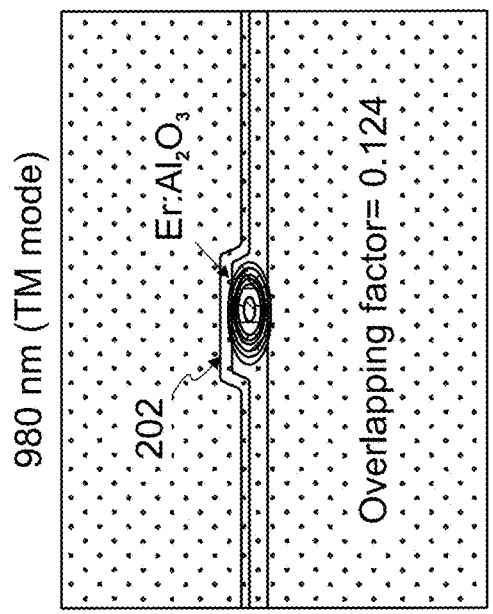
FIG. 2A-C depict the gain region of the chip-scale MLL, wherein shows a cross-sectional view of the gain region, which is composed of a LN waveguide cladding by 100 nm Erbium-doped $Al_2O_3$ ($Er^{3+}$: $Al_2O_3$) thin film. The $Er^{3+}$: $Al_2O_3$ thin film is grown by atomic layer deposition (ALD) process and is composed of layers of $Al_2O_3$ and $Er_2O_3$ (shown in FIG. 2A inset). The resulting thin-film can have an $Er^{3+}$ concentration greater than $2.0 \times 10^{21}$ $cm^{-3}$.
Figure 2C:
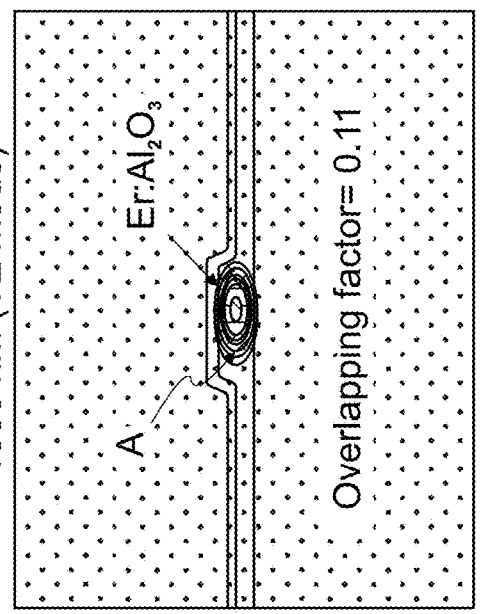
Figure 2A:
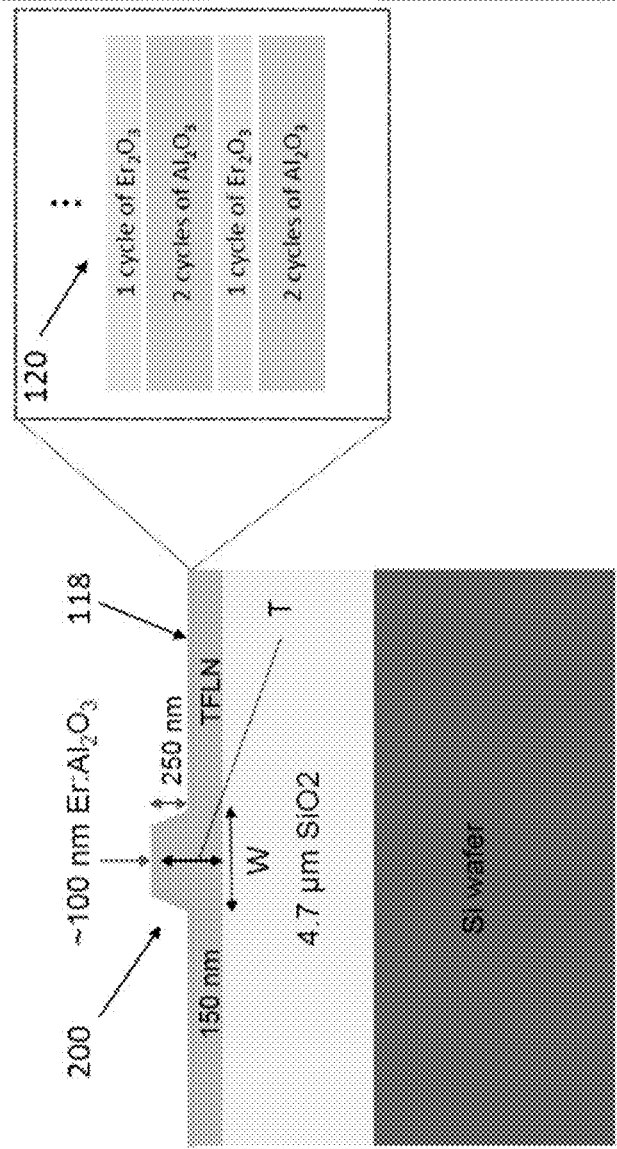
Figure 3:
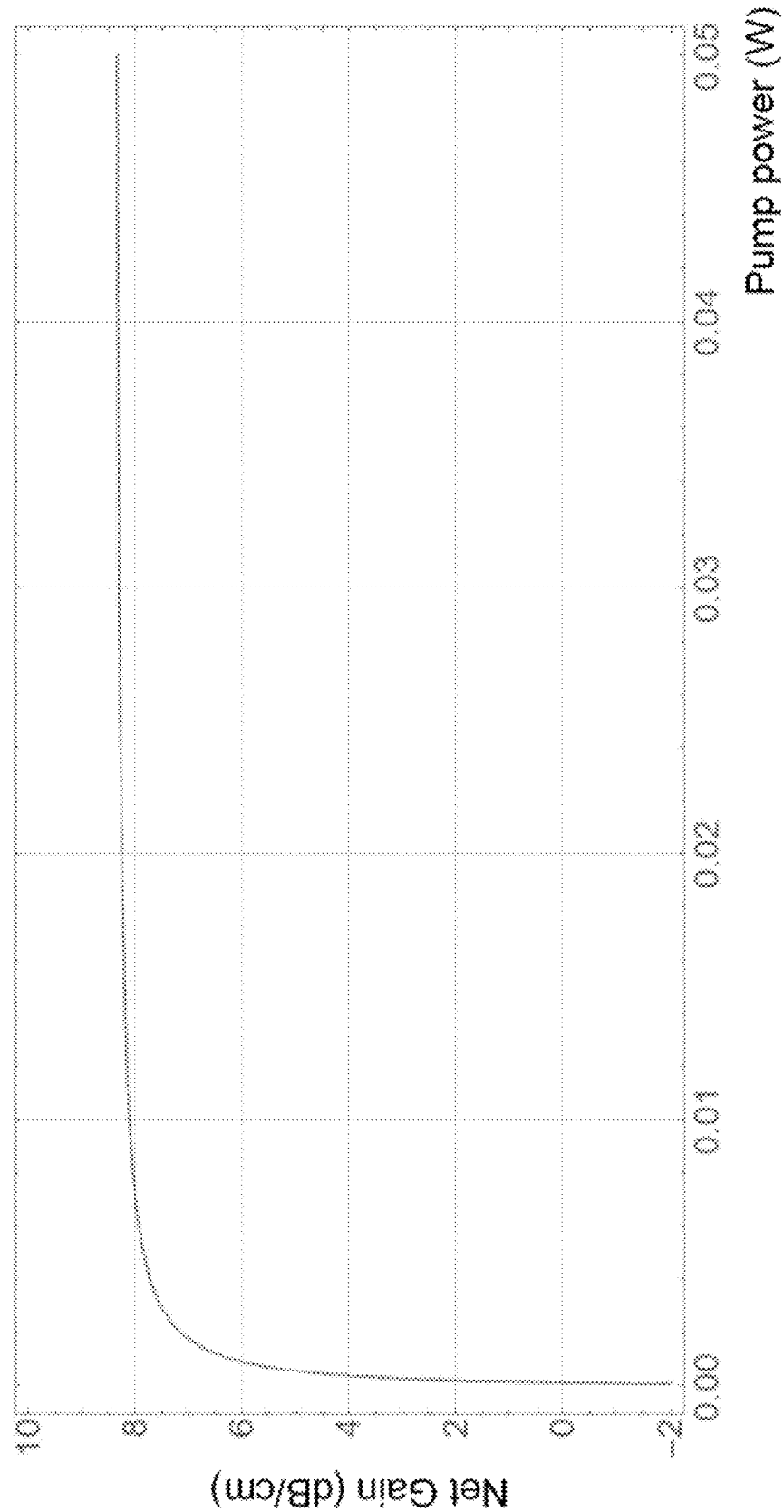
FIG. 3 depicts the calculated small-signal gain per unit length (dB/cm) as a function of pump power for the designed gain region shown in FIG. 2. The calculation ignores the up-conversion effects of active ions and assumes a waveguide propagation loss of 0.2 dB/cm.

FIG. 2A shows a cross-sectional view of the gain region, which is composed of a LN waveguide cladded by a material 118 comprising a rare earth ion doped oxide 120 (e.g., 100 nm Erbium-doped $Al_2O_3$ ($Er^{3+}$: $Al_2O_3$)) thin film. The $Er^{3+}$: $Al_2O_3$ thin film is grown by atomic layer deposition and is composed of layers of $Al_2O_3$ and $Er_2O_3$ (shown in FIG. 2A inset). Both 980 nm pump light 122 and 1550 nm signal 106 have significant modal overlapping with the $Er^{3+}$: $Al_2O_3$ cladding layer, thus ensuring efficient pumping of the gain medium and signal amplification. Variations to this design include (i) using a strip-loaded waveguide instead of the ridge waveguide, (ii) using a multi-mode waveguide for the short-wavelength pump and utilizing one or a combination of its higher-order modes to achieve high overlap with the long-wavelength mode, and (iii) using a resonator for the pump to enhance the efficiency of the laser.

FIGS. 2A-2C further illustrates the thin-film waveguide 110 comprises a ridge 200 having a width W and the thickness T guiding a mode 202 associated with the pump or signal electromagnetic radiation 106, 122 with most of the mode's energy confined in a transverse cross-sectional area A smaller than 3 micrometers by 3 micrometers. In one or more examples the thickness is of the order (e.g., 10 times or less) of the signal wavelength.

Figure 4A:
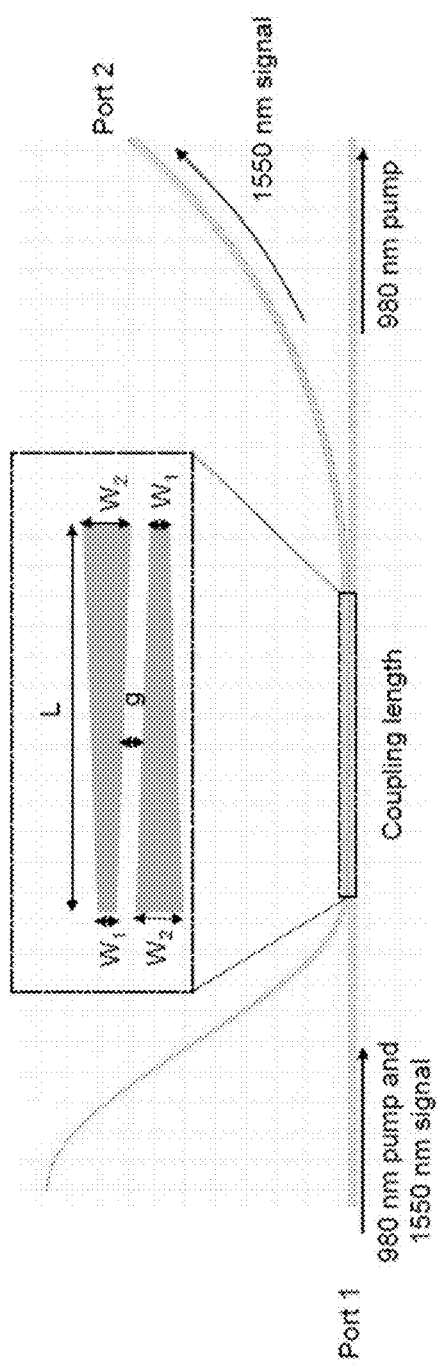
Figure 4B:
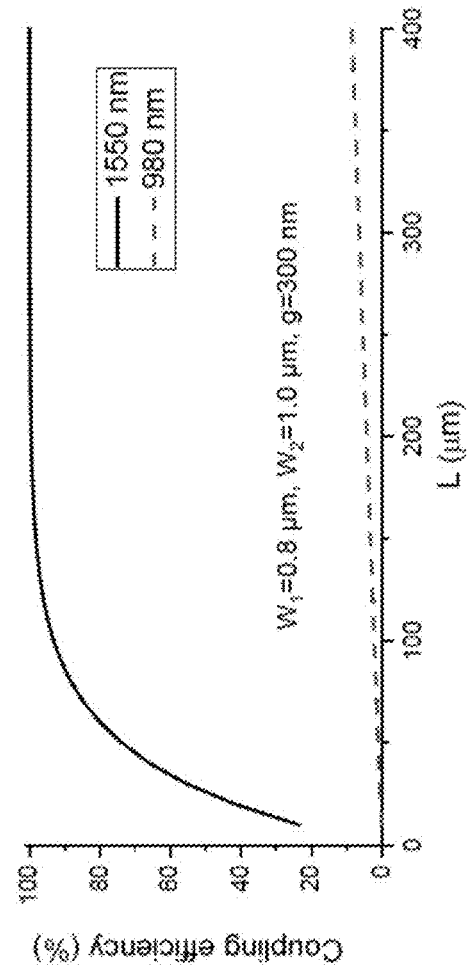

FIG. 4A is the top-view of a WDM, which splits the 1550 nm signal light (Fundamental TE mode) and the 980 nm pump light (Fundamental TM mode) into two independent channels. The WDM consists of two linearly tapered coupled waveguides (shown in the inset) with one waveguide tapered to be narrower, the other to be wider. The gap (g) between the two waveguides and the coupling length (L) can be adjusted to control the coupling efficiency of 980 (TM mode) and 1550 nm (TE mode) light. FIG. 4B shows the coupling efficiency from port 1 to port 2 as a function of coupling length (L) for 980 and 1550 nm light simulated an FDE solver (Lumerical MODE).

Figure 5:
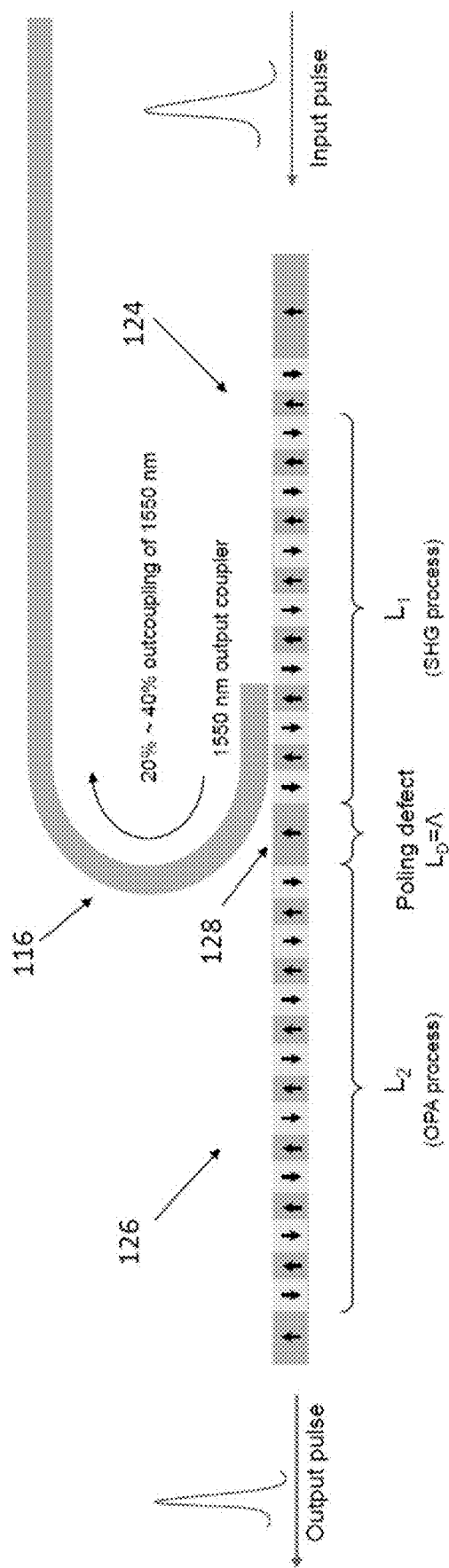
FIG. 5 depicts the integrated artificial saturable absorber (SA) of the chip-scale MLL and its operating principle.

FIG. 5 illustrates the mode-locking device 108 comprises an integrated saturable absorber composed of the thin film waveguide 110 comprising two periodically poled LN (PPLN) waveguides with lengths of L1 (first region 124) and L2 (second region 126) separated by an unpoled region (third region 128) with a length LD equal to the poling periodicity A, and an output coupler 116 that can partially couple out the 1550 nm signal light. When the 1550 nm signal light enters the SA from the right end, it experiences a second harmonic generation (SHG) process so that part of the 1550 nm light 106 gets converted to 775 nm (second harmonic radiation 130) and part of the remaining 1550 nm light 106 is extracted out by the output coupler 116. Then, the unpoled region applies a 180° phase shift to the 775 nm light. Due to the 180° phase difference between the 775 and 1550 nm light, in the next PPLN region the nonlinear frequency conversion process is the optical parametric amplification (OPA) during which the 775 nm light 130 is converted back to 1550 nm 106. Higher intensity pulses at 1550 nm signal light result in higher SHG efficiency in the first pass and subsequently, a larger portion of 1550 nm light is converted to 775 nm light, which is insensitive to the output coupler 116. Therefore, the designed structure favours the transmission of higher intensity 1550 nm light signal and functions as an integrated artificial SA.

Figure 6B:
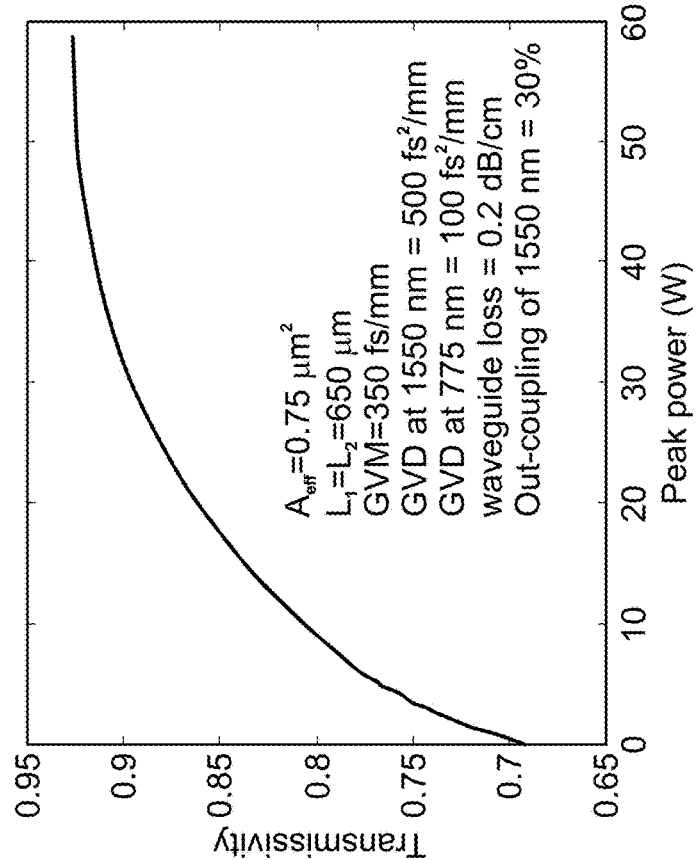
FIG. 6A-6B depict the performance of the integrated SA based on the design shown in FIG. 5.
Figure 6A:
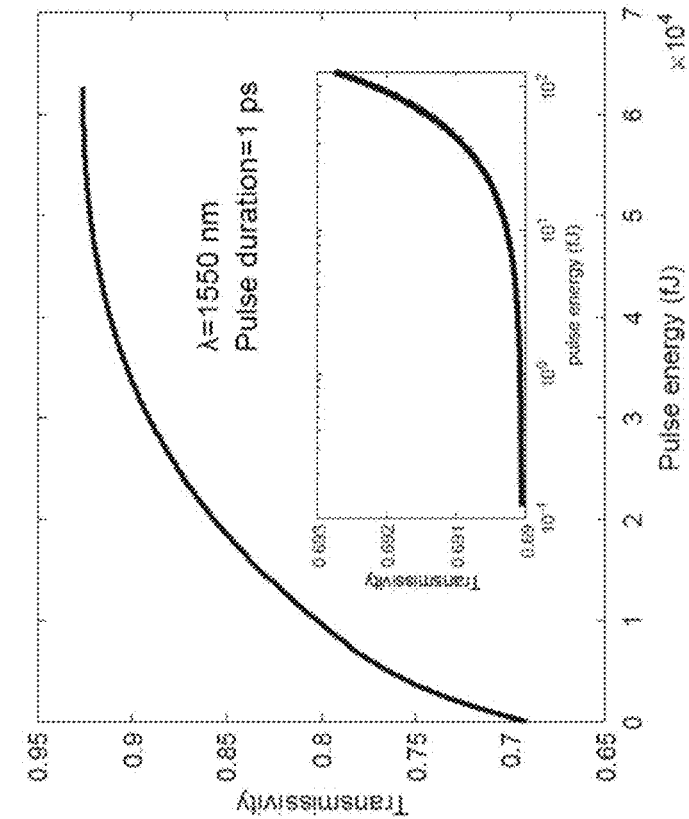

FIG. 6A-6B shows the simulated/calculated transmission of 1 ps 1550 nm signal light pulse as a function of the pulse energy and peak power.

Figure 7A:
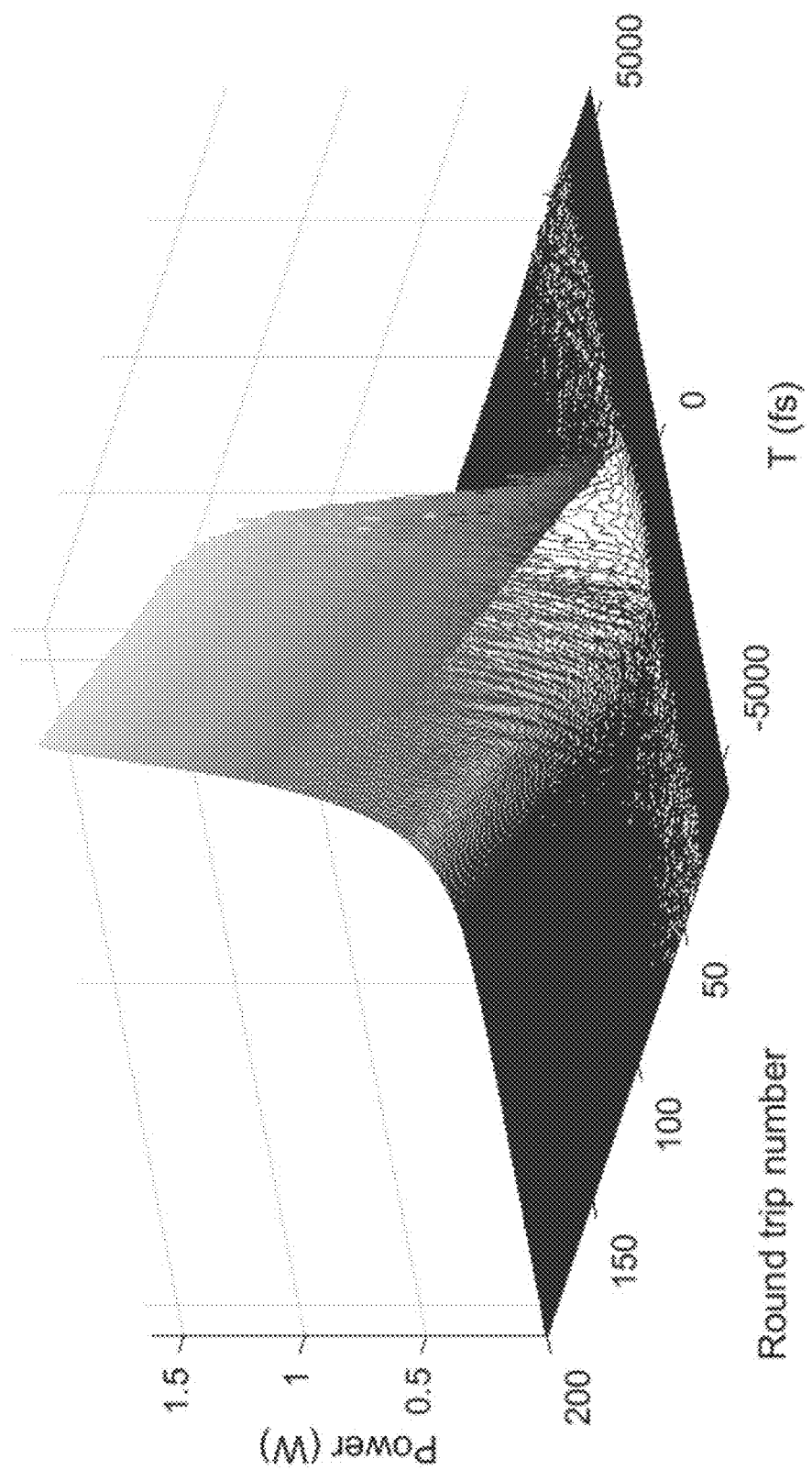
FIGS. 7A-7C depict the mode-locking of the chip-integrated MLL based on TFLN by incorporating the designs presented in FIG. 1-6.
Figure 7B:
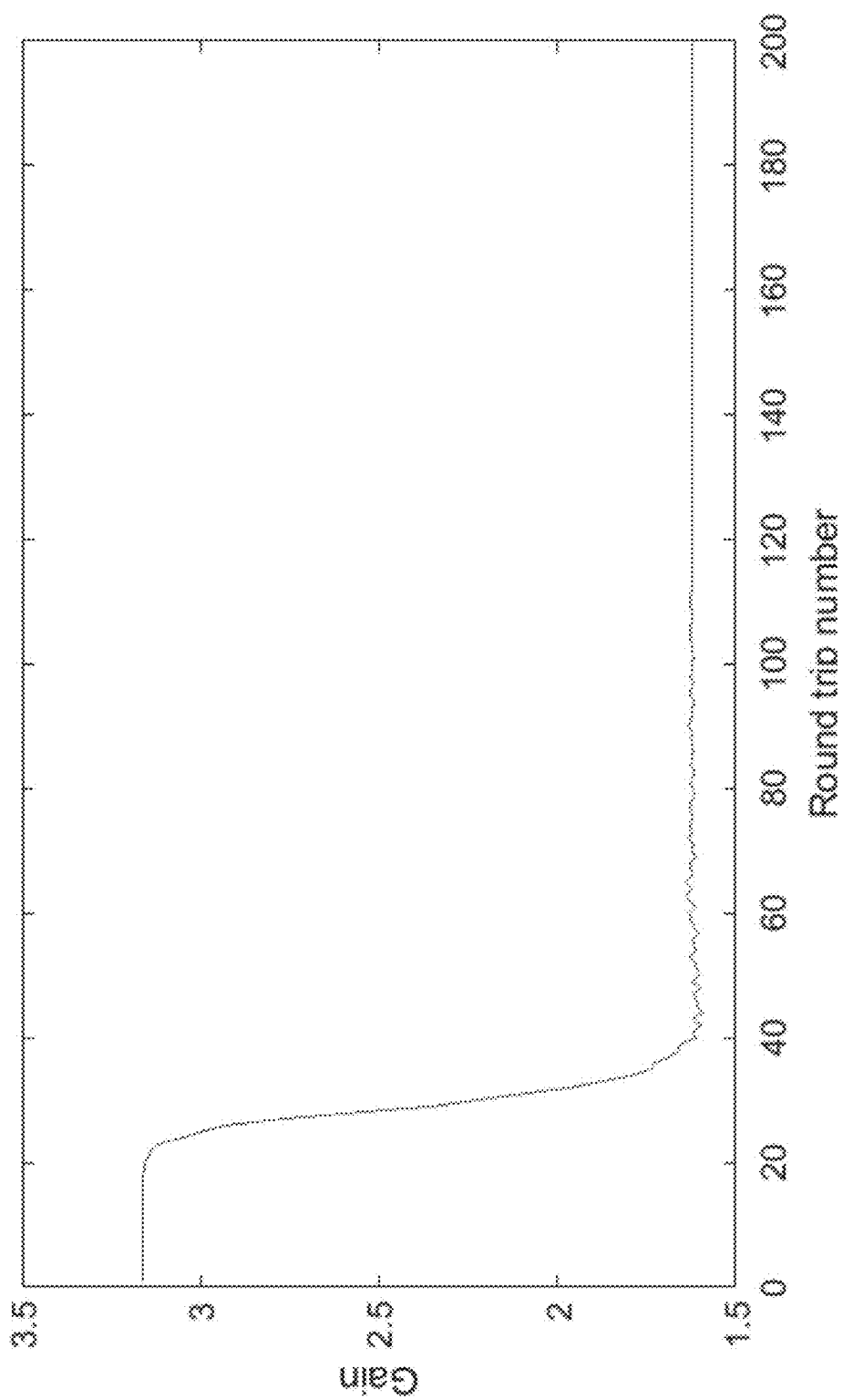
Figure 7C:
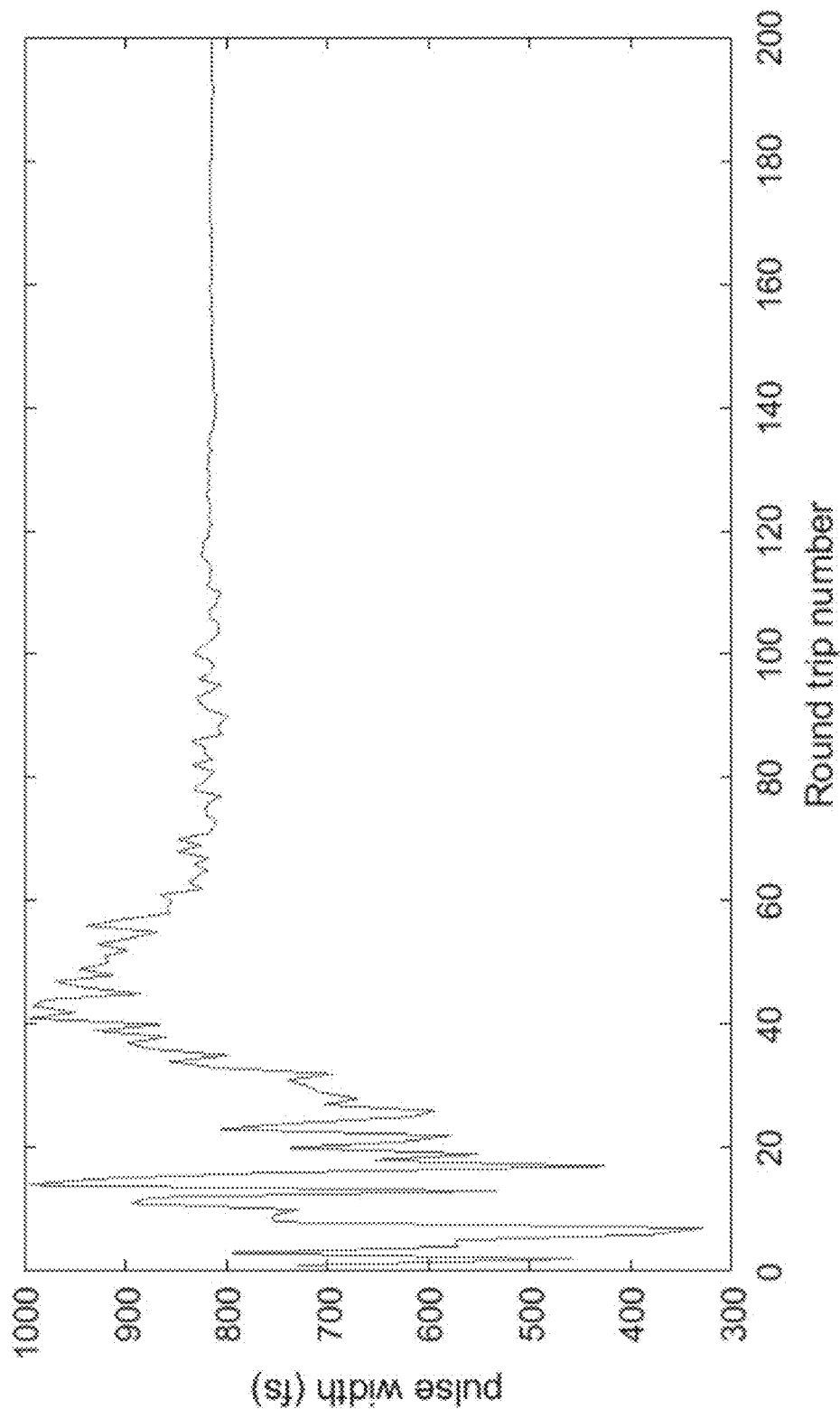

FIG. 7A illustrates the pulse evolution of the pulse in the time domain for 200 roundtrips. The mode-locking is self-starting from the amplified spontaneous emission (ASE) noise. FIG. 7B shows the evolution and saturation of the laser gain. FIG. 7C shows the evolution of the pulse duration.

Second Example: Mode-Locking Using a Waveguide Coupled to a Semiconductor Optical Amplifier FIGS. 8 and 9 depict examples of MLL modules by integrating an integrated nonlinear mirror mode-locking device with a semiconductor optical amplifier (SOA) chip. FIG. 8 depicts a passively mode-locked lasers 800 based on this implementation. The integrated nonlinear mirror mode-locking device 802 is composed of a periodically poled lithium niobate (PPLN) waveguide 804, an output coupler 806 and an electro-optic phase modulation section 808 that controls the relative phase between the fundamental 810 and second harmonic signals 812. The output facet 814 of the waveguide output may be polished. An optical coating 816 may be deposited on the output facet, which ensures total reflection of the second harmonic signal 812 and partial reflection of the fundamental signal 810. The input facet 816 of the waveguide is butt-coupled to the SOA chip 818 comprising the gain medium 820. In the electro-optic phase modulation region, metal electrodes 822 are deposited alongside the LN waveguide 804. By applying an electric field Φ across the electrodes, the effective refractive index of the LN waveguide 804 may be changed due to the Pockels effect and the phases of both fundamental and second harmonic signals are tuned. At some particular voltages, the phase difference between the reflected fundamental and second harmonic signals will be 180°, and therefore the device functions as a nonlinear mirror mode-locking device 802 outputting pulses 824 of electromagnetic radiation having the signal wavelength.

FIG. 9 depicts an actively mode-locked laser 900. The mode locking device 901 comprises a waveguide 902 composed of a loop mirror 904 at one end, which serves as a broadband reflector for the laser signal 906, and an electro-optic modulator or phase modulation section 908. By applying an RF voltage modulation signal 910 across the electro-optic modulator 908 comprising electrodes 912, the refractive index of the waveguide is periodically modulated, which in turn synchronizes the phases of the laser modes inside the cavity 914 so that the laser 900 outputs a train of mode-locked pulses 916. Also shown is a semiconductor optical amplifier comprising the gain medium 918. The gain medium can be electrically or optically pumped using pump electromagnetic radiation.

FIGS. 8 and 9 further illustrate the thin-film waveguides 802, 902 comprises a ridge 826, 926 having a width W and the thickness T guiding a mode associated with the pump or signal 906 electromagnetic radiation with most of the mode's energy confined in a transverse cross-sectional area A smaller than 3 micrometres by 3 micrometres.

Third Example: Femtojoule, Femtosecond all-Optical Switching in Waveguides with Engineered Quasi-Phase-Matching and Dispersion Central to the all-optical switching device is the highly efficient nonlinear frequency conversion in dispersion-engineered quasi-phase-matched (QPM) LN nanophotonic waveguides together with its QPM-engineering. FIG. 10 illustrates the concept of the QPM-engineering in our device: a uniform periodically poled lithium niobate waveguide (periodicity=Λ) is perturbed by a localized "poling defect" i.e., an isolated domain of extension L=Λ in the center. The poling defect locally changes the phase relationship between the first harmonic (FH) and the second harmonic (SH) waves by the amount $\Delta\varphi=\pi$[1]. Since the direction of power flow between the FH and the SH is dependent on the relative phase between them, the π phase shift exerted by the poling defect switches the nonlinear process from the second harmonic generation (SHG) to degenerate optical parametric amplification (DOPA), in which the generated SH serves as the pump to amplify the FH.

Figure 10A:
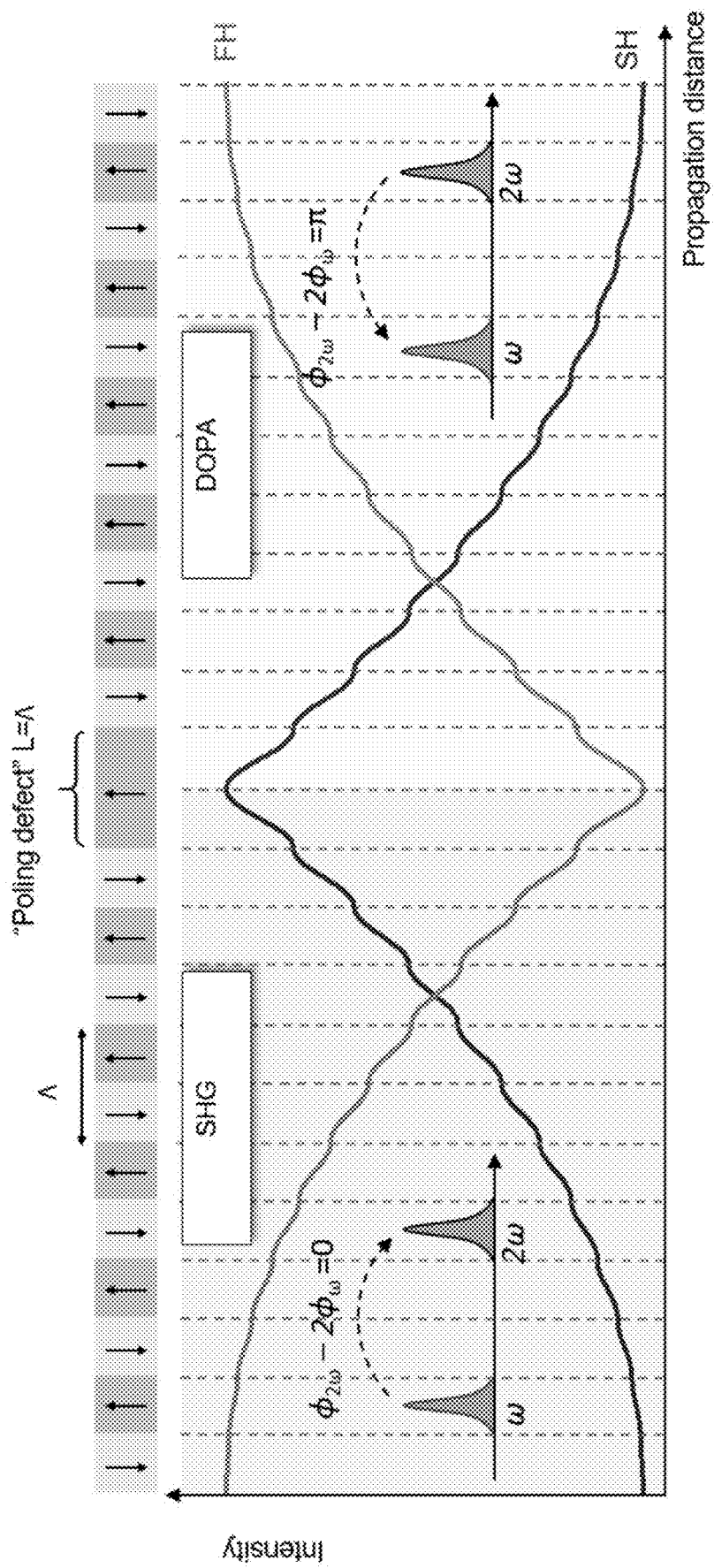
FIG. 10A is an illustration of the QPM engineering in PPLN waveguide. The poling defect (a longer ferroelectric domain with a length L=A) shifts the phase difference between the FH and SH by 180 degrees. As a result, the poling defect switches the SHG process to the degenerate optical parametric amplification (DOPA) in the second half of the PPLN waveguide.
Figure 10C:
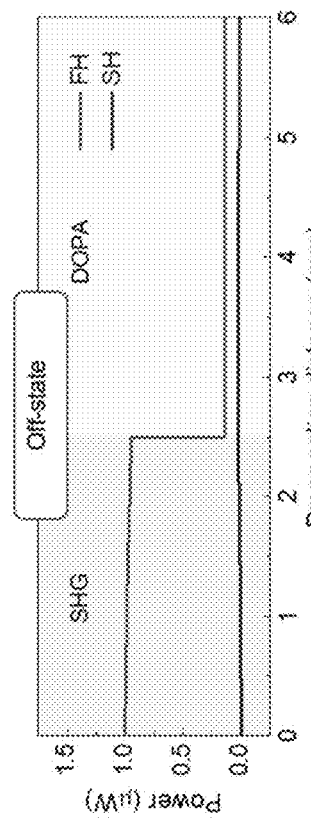
FIG. 10C shows the simulated evolution of the FH and SH optical power along the main waveguide for the off-state, in which the transmittance of the FH is low (15%).
Figure 10E:
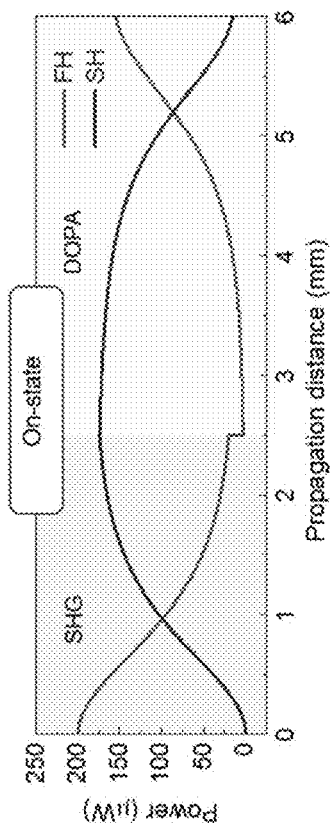
FIG. 10E shows simulated evolution of the FH and SH optical power along the main waveguide for the "on-state", in which the transmittance of the FH is high (85%). The simulations in FIG. 10C and 10E assume 46 fs input pulses at 2.09 μm and the device has a 2.5-mm-long SHG region, a 3.5-mm-long DOPA region, and 85% of outcoupling of the FH in the directional coupler.
Figure 10B:
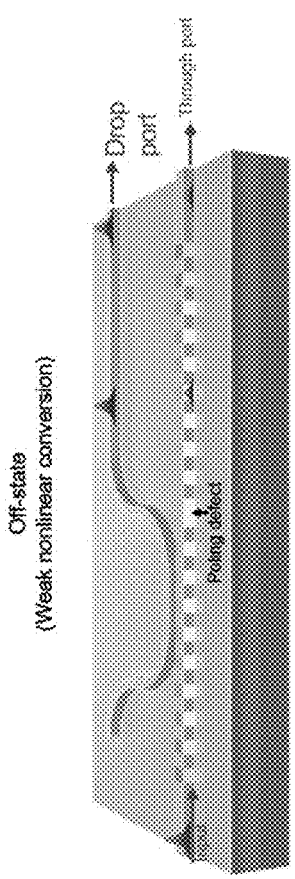
FIG. 10B shows the schematic of the integrated nonlinear splitter device and its operation in the "off-state" when the input pulse energy is low.
Figure 10D:
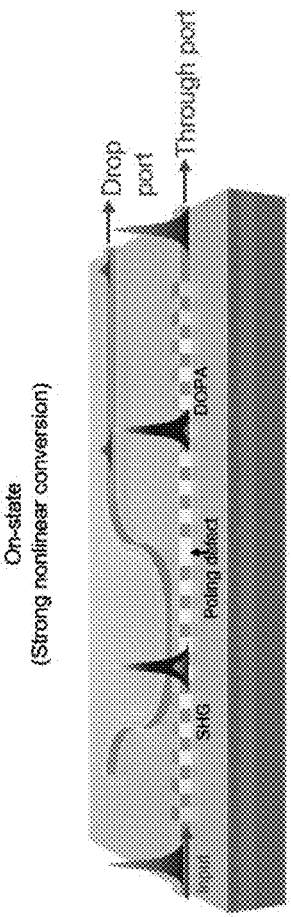
FIG. 10D shows the schematic of the integrated nonlinear splitter device and its operation in the "on-state" when the input pulse energy is high.

Based on the concept of QPM engineering, we designed our all-optical switch as illustrated in FIGS. 10B and C. The switch is an integrated nonlinear splitter that shows a strong intensity-dependent splitting ratio. The device is composed of a QPM-engineered main waveguide and a neighboring directional coupler. The directional coupler evanescently couples out most of the FH, while leaving most of SH freely propagating in the main waveguide. When the input FH intensity is low (or the "off-state" shown in FIG. 10B), most of the input FH does not convert to SH, and hence is directed to the coupler. This is illustrated by the simulated power evolution of both FH and SH in the main waveguide in FIG. 10C. In this "off-state", the transmittance of FH in the main waveguide is low. However, when the input FH intensity is high (or in the "on-state" as shown in FIG. 10D, E), due to the strong SHG at the beginning of the waveguide, most of the FH can convert to the SH and the remaining FH is directed to the coupler. The poling defect switches the SHG process to the DOPA in the second half of the PPLN waveguide, through which the SH converts back into FH. As shown in FIG. 10E, in the "on-state", the device favors the transmission of the FH to the main waveguide since most of input pulse energy can be "stored" in (i.e. converted to) the SH, which is free from the outcoupling. Since the FH transmission strongly depends on the input pulse energy of FH, the intensity-dependent nonlinear splitter functions as an all-optical switch.

a. Device Fabrication and Measurements

Figure 11A:
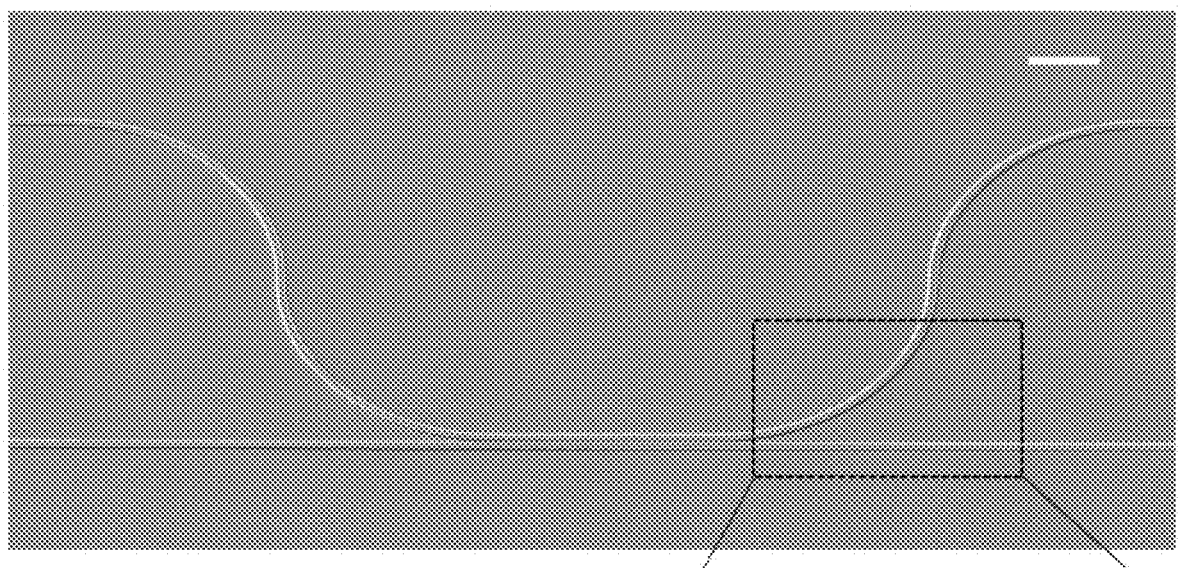
FIGS. 11A-11D. Integrated nonlinear splitter and its linear optical characteristics.
Figure 11C:
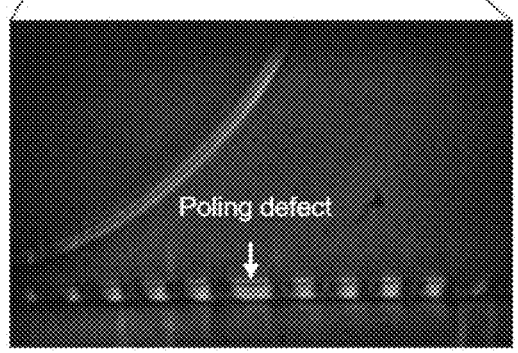
Figure 11B:
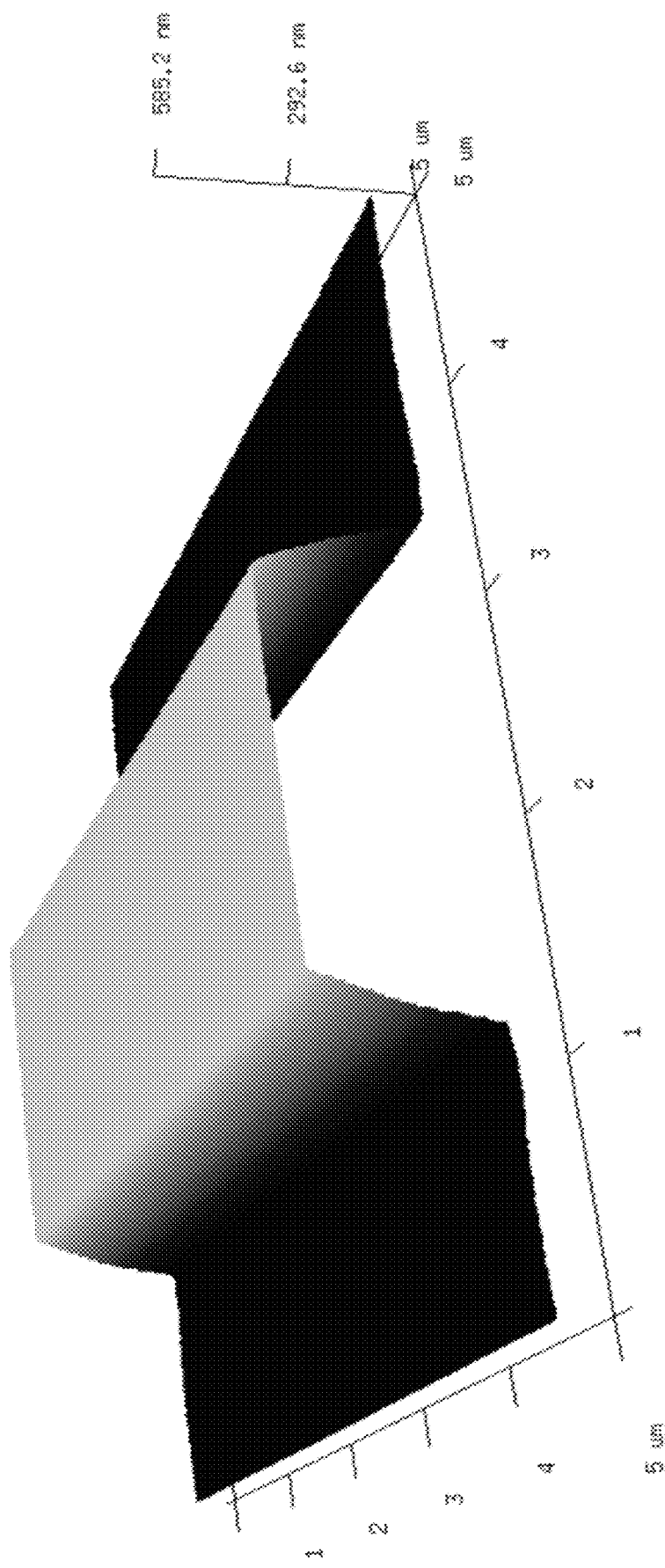

We fabricated the nonlinear splitter device on a 700 nm thick X-cut magnesium-oxide (MgO) doped LN thin film on a 2-µm-thick silicon dioxide layer on top of a LN substrate (NANOLN). The nonlinear splitter devices were fabricated on a 700-nm-thick X-cut MgO-doped LN thin-film on 2-µm-thick SiO2 (NANOLN). We first patterned the poling electrodes (15 nm Cr/55 nm Au) with varied electrode finger periodicities using the e-beam lithography. Then the electrodes were formed by e-beam evaporation and metal lift-off. We performed the domain inversion by applying several 380 V, 5-ms-long pulses at room temperature with the sample submerged in oil. We visually inspected the poling quality using the two-photon microscope. The metal electrodes were removed by wet chemical etching. We patterned the waveguides using the e-beam lithography. The pattern was transferred to the LN layer by dry etching with Ar+ plasma. Finally, the waveguide facets were polished to reduce the coupling losses. As shown in the scanning electron microscope image (FIG. 11 A) and the atomic force microscope image (FIG. 11 B), the Ar-based dry etching process yields a smooth waveguide sidewall and a sidewall slope angle of 60 degrees. The inverted domains and the poling defect along the main waveguide can be clearly seen in the colorized two-photon microscope image shown in FIG. 11C. The device has a 2.5-mm-long SHG region and a 3.5-mm-long DOPA region.

Figure 11D:
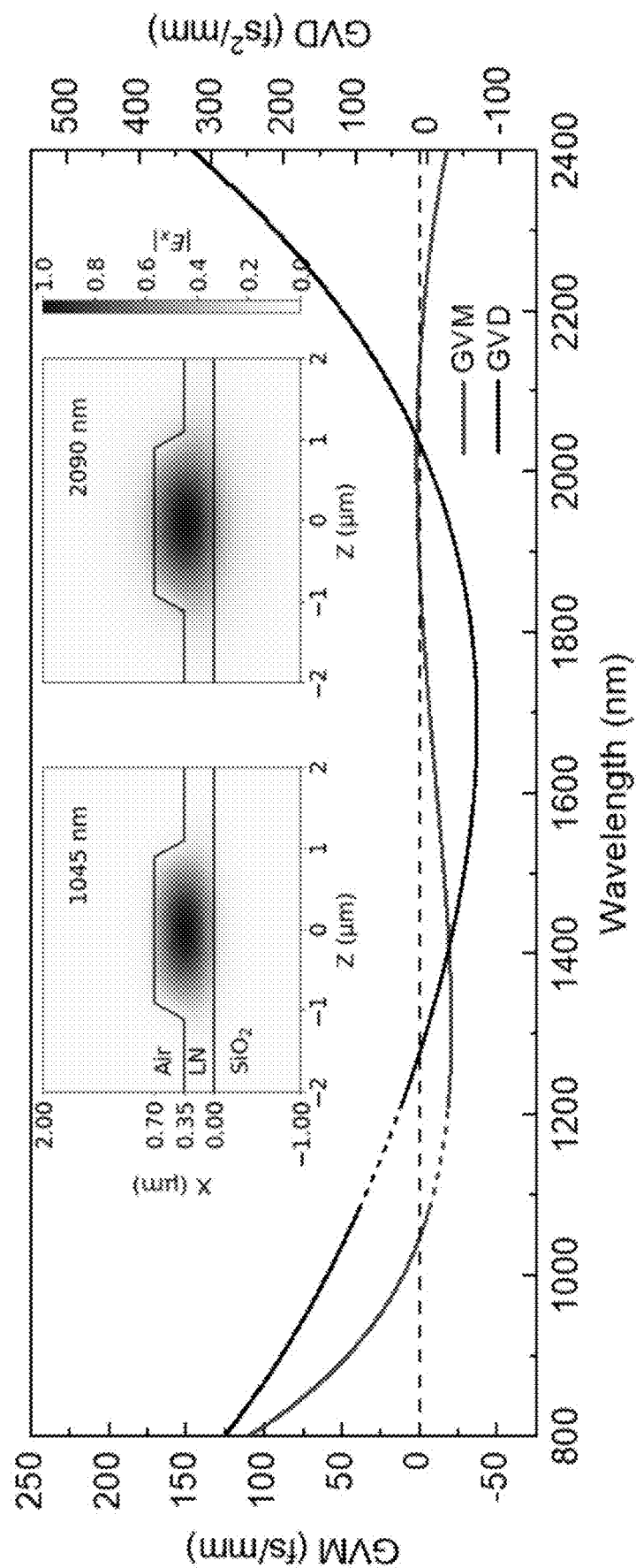

The LN ridge waveguide cross-section were judiciously designed to engineer both the group velocity mismatch (GVM) and the group-velocity dispersion (GVD) of the interacting waves. In fact, negligible GVD at the FH and SH wavelengths are required to preserve the temporal confinement of these pulses and hence their high peak intensities along the waveguide, thereby ensuring the efficient short-pulse SHG and DOPA. Additionally, to maximize the parametric interaction between the SH and FH, the GVM between the FH and SH waves needs to be minimized so that both pulses travel together along the waveguide [2]. Specifically, as shown in FIG. 11D, with a waveguide top width of 1650 nm, a ridge height of 350 nm and a thin-film thickness of 700 nm, the fundamental quasi-TE modes at FH (2090 nm) and the SH (1045 nm) wavelengths have a very low group velocity mismatch (GVM) of 0.8 fs/mm. In addition, the optimized waveguide geometry yields low group velocity dispersion (GVD) for both the FH and SH waves, which are 40 $fs^2$/mm and 114 $fs^2$/mm, respectively. For a 35-fs-long input pulse at 2.09 µm, the optimized waveguide has a dispersion length of more than 50 mm and a walk-off length of 115 mm. In order to ensure that the directional coupler has the right coupling ratio and it is resilient to fabrication errors, we adopted an adiabatic design in which the main waveguide is uniform with a fixed width, while the coupler waveguide width is adiabatically tapered [3].

Figure 11E:
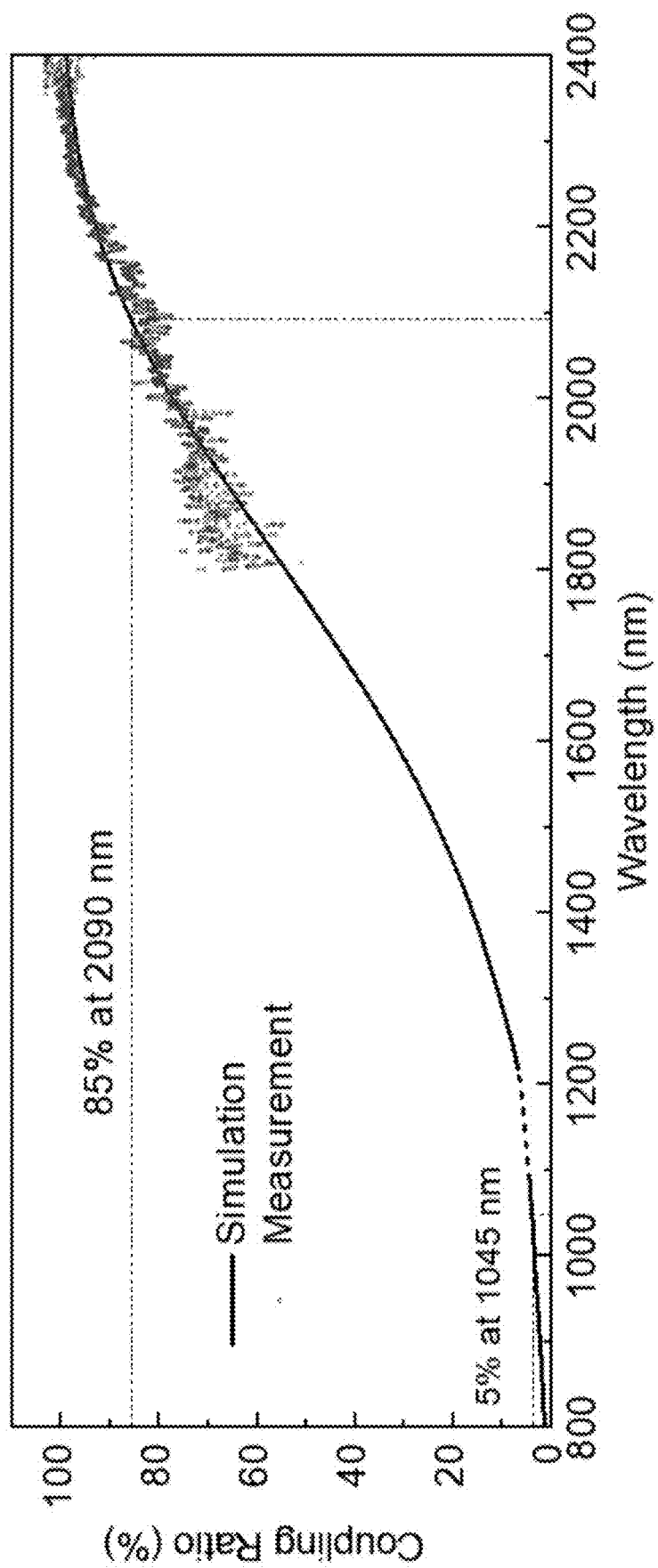
FIG. 11E shows measured (red symbols) and simulated (blue solid curve) out-coupling ratio of the directional coupler as a function of wavelength.

FIG. 11E shows the coupling ratio as a function of wavelength. The measured (red symbols) results agree well with the simulation (blue solid curve). Due to the large mode area difference between the fundamental TE modes at 2090 nm and 1045 nm, the 70-µm-long directional coupler exhibits a large coupling ratio over 85% for wavelengths beyond 2090 nm and a small coupling ratio less than 5% for wavelengths below 1045 nm.

We characterized the nonlinear optical behavior of the device using 46-fs-long pulses at 2.09 µm from a synchronously pumped degenerate optical parametric oscillator (OPO) with a repetition frequency of 250 MHz. At the QPM condition, we measured the output power at 2.09 µm both at the output ports of the main waveguide and the directional coupler. As shown in FIG. 12A, the transmittance from input to the directional coupler output shows a clear reduction (~7 dB) when the on-chip input pulse energy increases from 0 to 600 fJ. This behavior is well captured by the simulation (blue solid line). Such a reduction in transmittance is a result of the strong depletion of FH waves during the SHG process since the directional coupler only couples out the FH in the first half of the main waveguide.

Figure 12B:
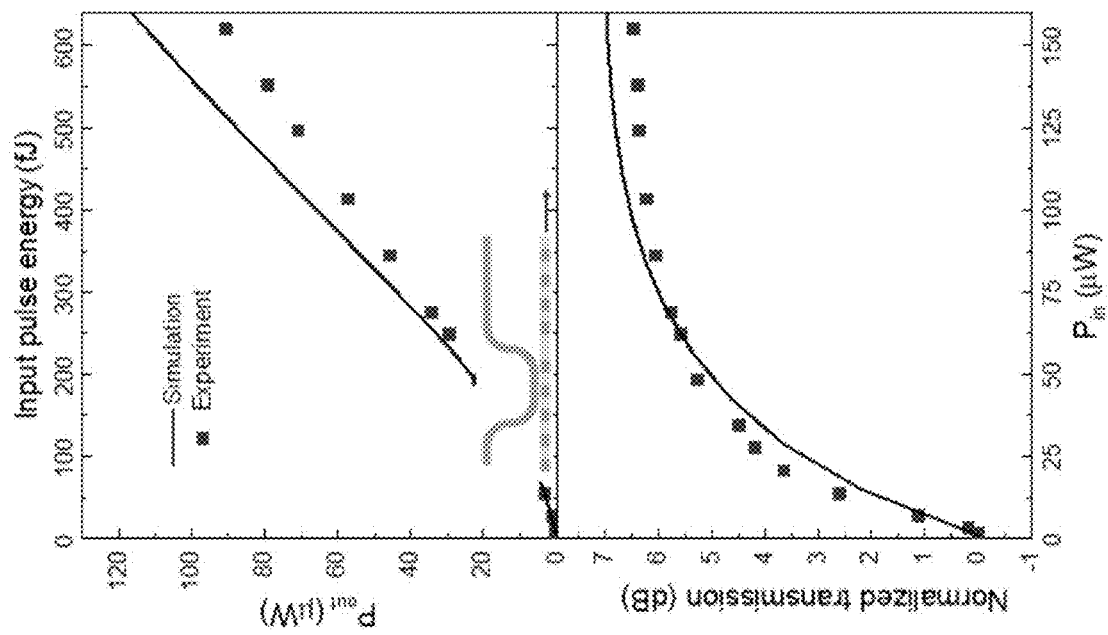
FIGS. 12A-12B. Ultra-low energy nonlinear optical transmission in integrated nonlinear splitter (FIG. 12A), Upper panel: average output power of 2.09 μm FH from the output coupler as a function of on-chip input average power/pulse energy. Lower panel: normalized transmittance of the FH from the output coupler.
Figure 12A:
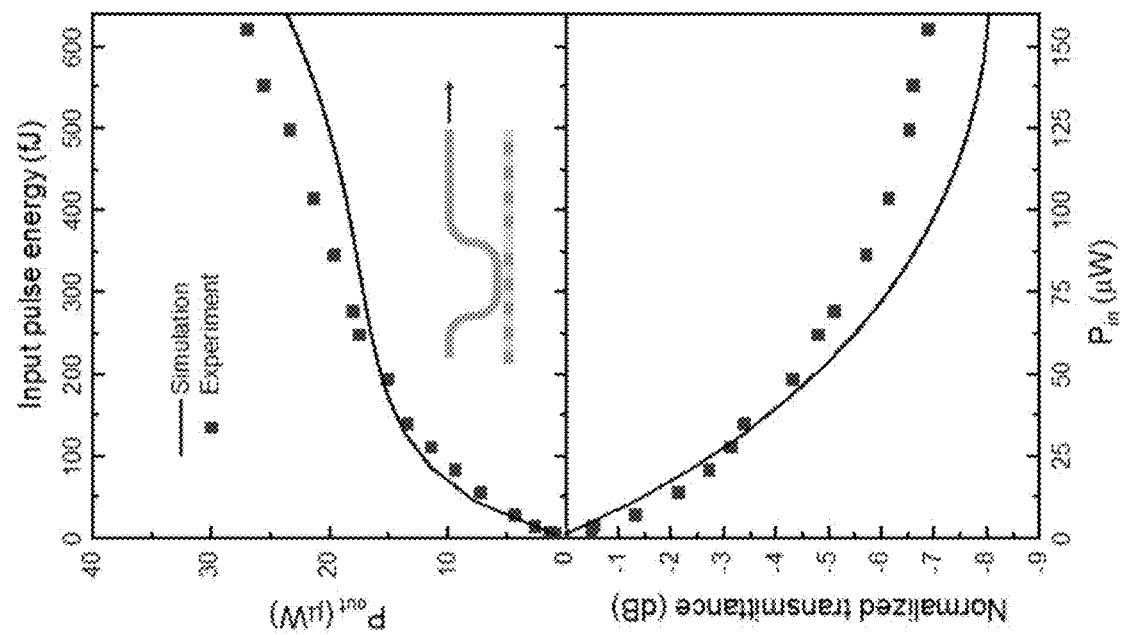

As shown in FIG. 12B, the output of the main waveguide shows more than 5 dB increase in the FH transmittance when we increase the input pulse energy. This indicates that the poling defect indeed switches the SHG to the DOPA process in the second half of the main waveguide, thereby converting the generated SH back into FH. The experimental result agrees well with the simulation (blue solid line), despite showing a slightly lower peak transmittance, which can be ascribed to the slightly lower SHG efficiency in the first half of the device or the imperfect phase shift imposed by the poling defect. Moreover, the measured power output at the coupler and the main waveguide also agrees well with the simulation.

Figure 13A:
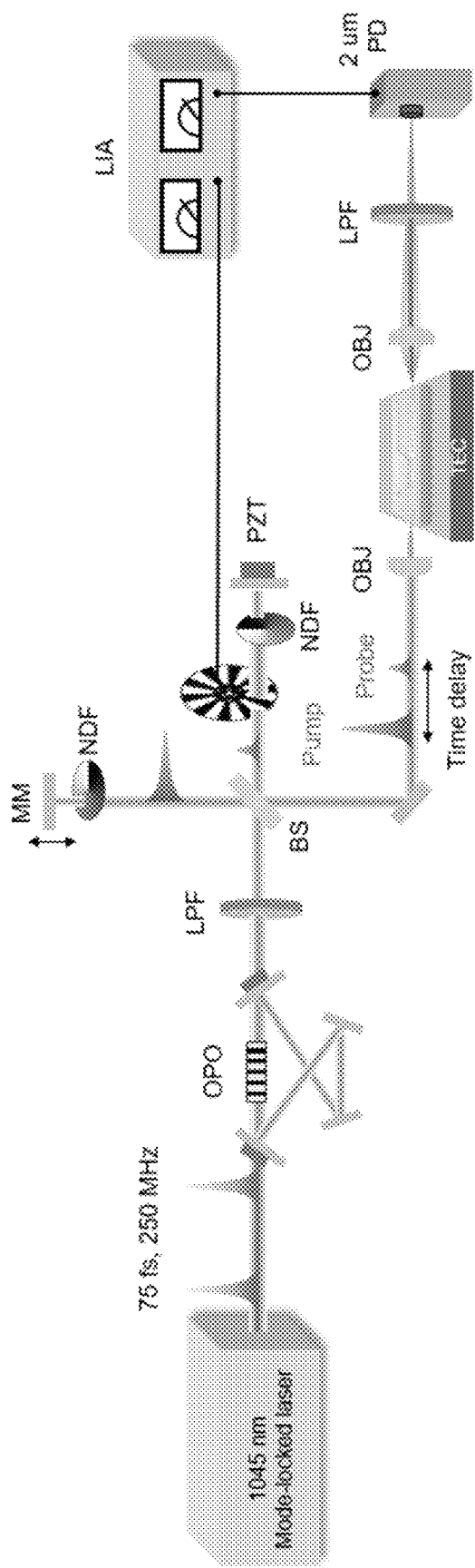
FIGS. 13A-13E. All-optical switching measurement.
Figure 13B:
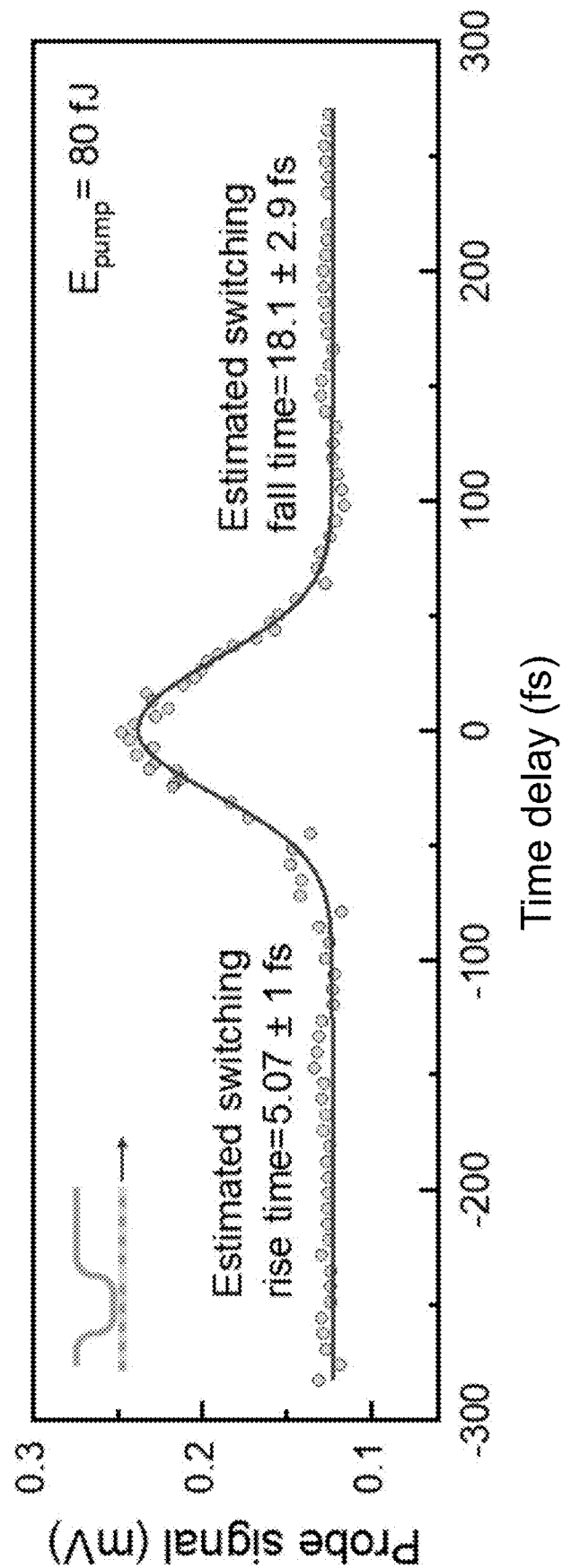
Figure 13C:
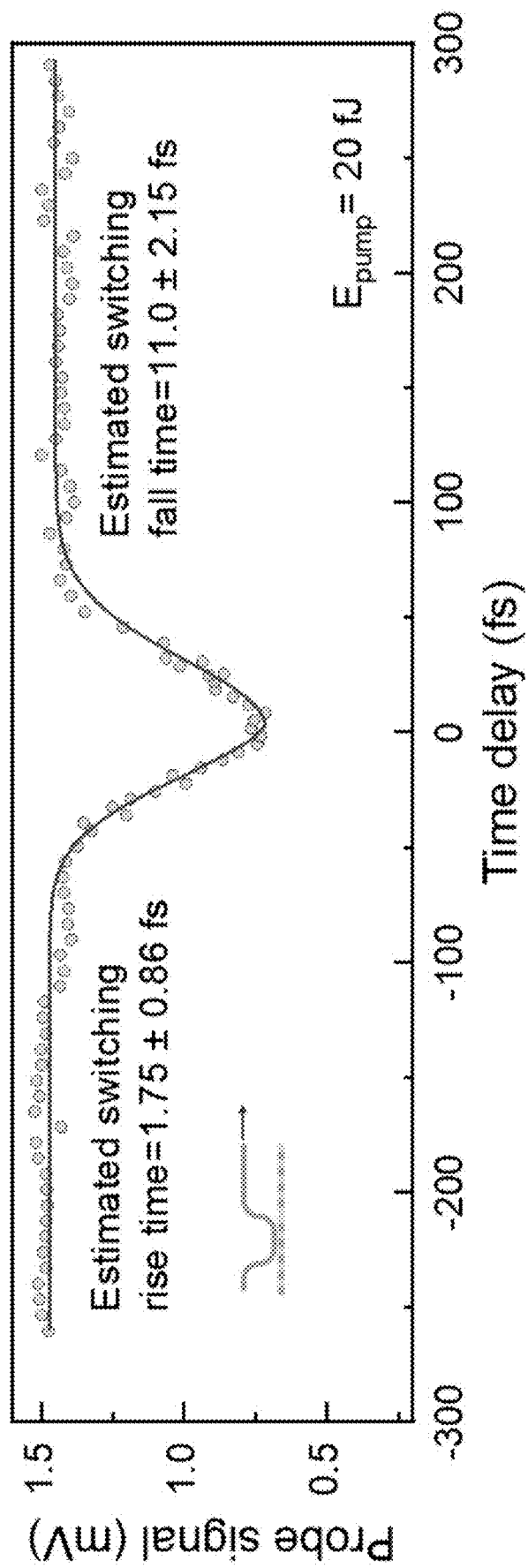
Figure 13D:
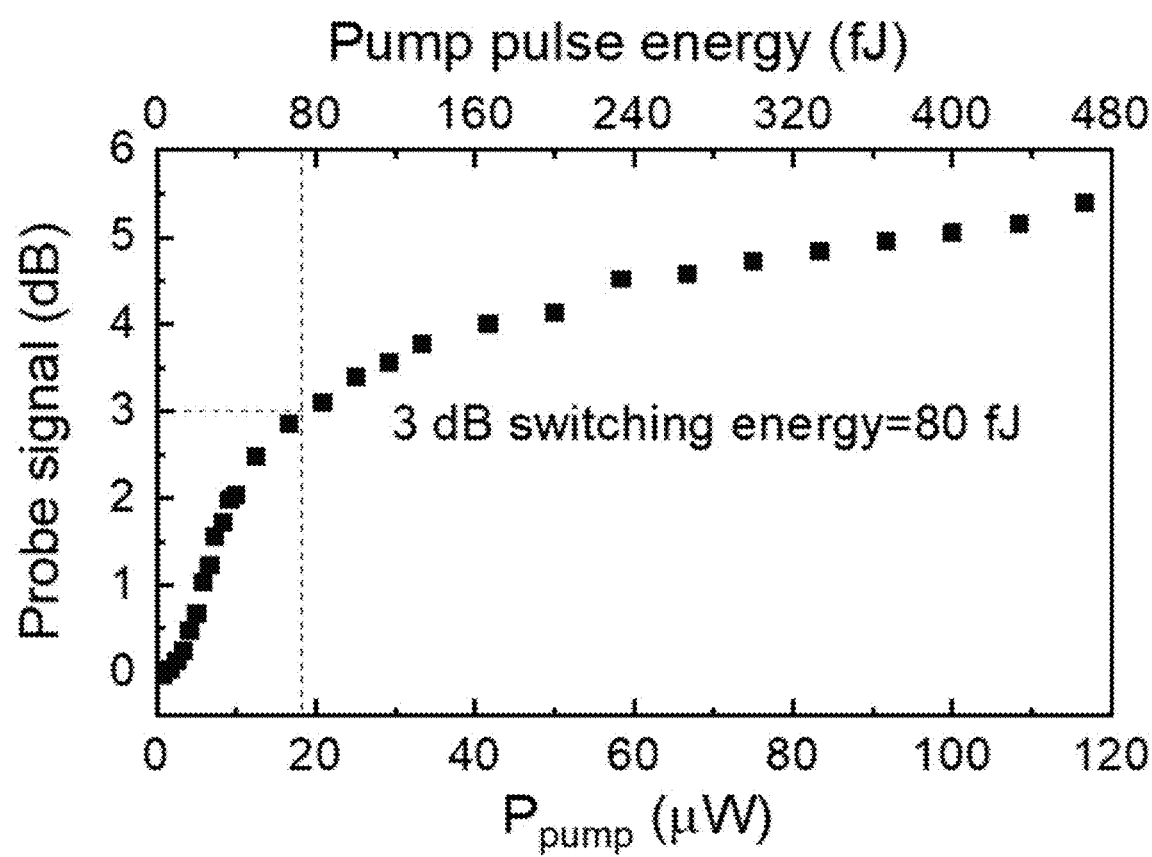
Figure 13E:
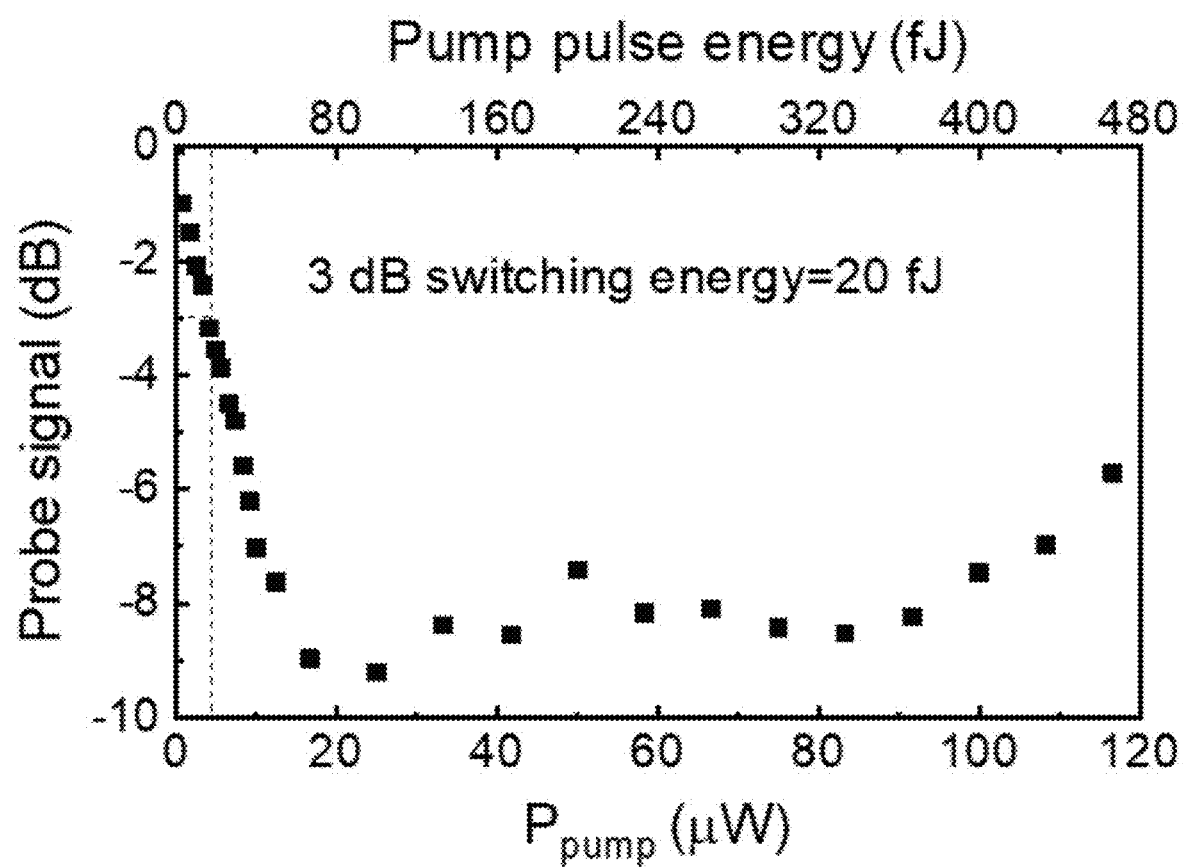
Figure 14:
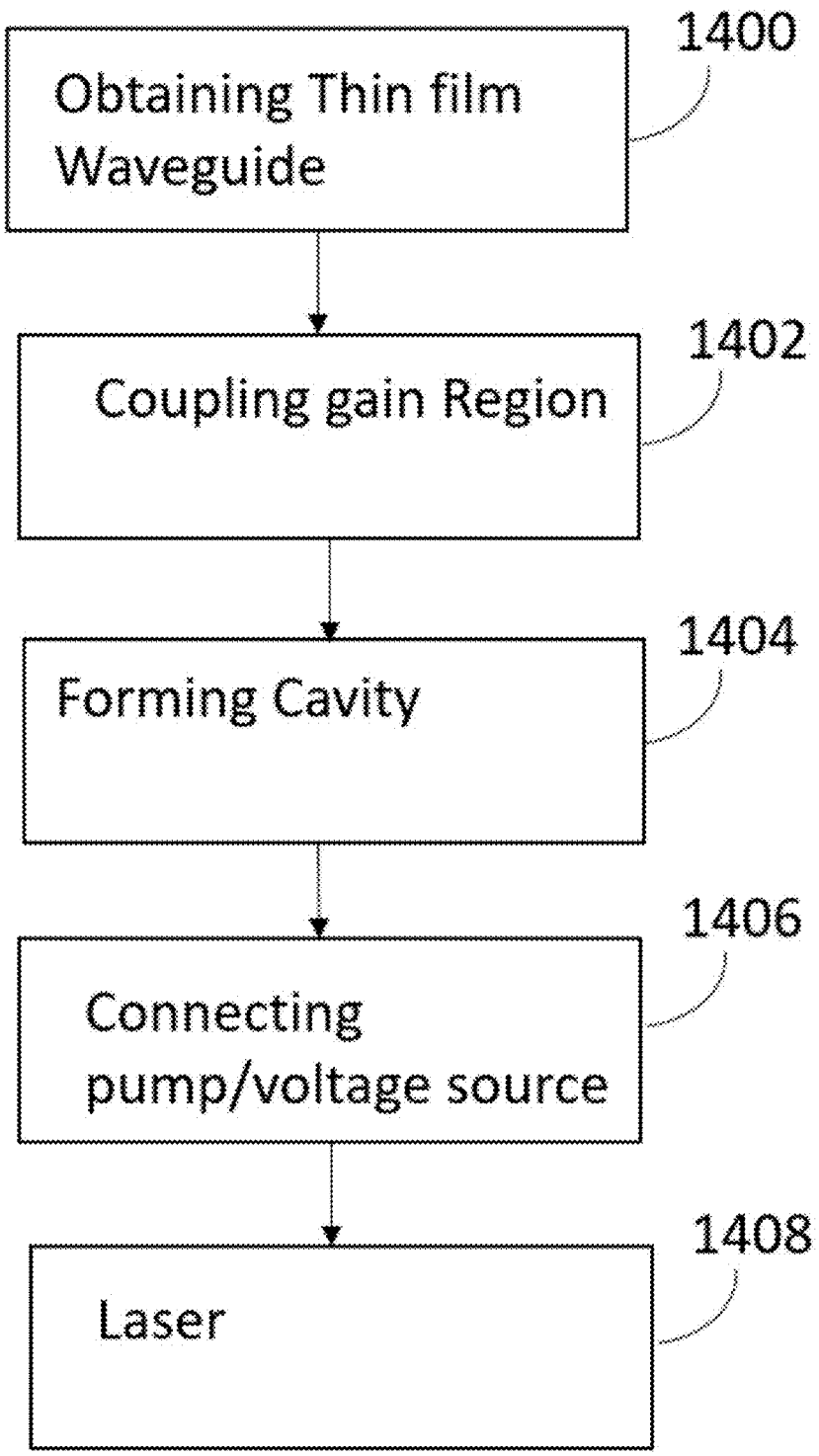
FIG. 14 is a flowchart illustrating a method of making a mode-locked laser.

We further characterize the switching dynamics and the switching energy of the nonlinear splitter device using a degenerate pump-probe technique [4]. As shown in FIG. 13A, the beam containing ~46-fs-long pules centered at 2090 nm generated from a table-top degenerate optical parametric oscillator is split into two beams by the beam splitter in the Michaelson interferometer. One beam with a weak optical fluence (3 fJ, 770 nW on-chip average power) is defined as the probe beam, another beam with a high/tunable optical fluence and adjustable time delay (controlled by a motorized delay stage) is defined as the pump beam. In the measurement, we guided both the pump and the probe beams into our device via the objective lens and switch the transmission of the probe signal by the pump pulse. In order to suppress the interferences between the pump and the probe beams, we inserted a piezoelectrically actuated mirror resonating at 350 Hz in the optical path of the probe beam since it randomizes the phase of the probe pulses. Additionally, we employed the lock-in modulation and demodulation scheme to acquire the output probe signal only, rather than acquiring both the pump and probe signals.

The switching dynamics of the probe signal from the output ports of the main waveguide and the directional coupler are plotted in FIGS. 13 B and C, respectively. At the main waveguide output, we observe that the probe pulse is clearly "switched on" when the pump pulse temporally overlaps it, while at the coupler output the probe pulse is "switched off". To extract rise and decay times, we fitted the data with exponential growth and decay functions for relative time delay $\Delta\tau<0$ fs and $\Delta\tau>0$ fs, respectively, convolved with the autocorrelation of the input pulse, which was approximated by a Gaussian profile with an FWHM of 65 fs. (see supplementary information for details). For the switch-on measurement, a rise time of (18.1±2.9) fs and a decay time of (5.1±1) fs were attained. The switch-off measurement shows a rise time of (1.75±0.86) fs and a decay time of (11.0±2.15) fs. Such an ultrafast response would allow all-optical modulation bandwidths as large as 8 THz. FIGS. 13D and 13E show the normalized extinction ratio at different input pulse energies for the "switch-on" and "switch-off" operations when Δτ=0. We estimated a switching pump energy of 80 fJ (20 fJ) for realizing a switching-on (-off) contrast of 3 dB. Within 500 fJ input pulse energy, we also obtained an extinction ratio over 5 dB for the "switch-on" operation and an extinction ratio over 8 dB for the "switch-off" operation.

b. Methods for the Third Example

For the linear and nonlinear optical measurements, we employed a free-space light coupling setup shown in FIG. 13A. The 1045 nm source is a 1 W Yb mode-locked laser that produces nearly transform-limited 75-fs-long pulses at a 250 MHz repetition rate (Menlo Systems Orange). The output 1045 nm beam was fed into a near-synchronously pumped degenerate OPO to produce-46-fs-long pulses centered at 2090 nm. The output 2090 nm beam was split into two beams by a beam splitter in a Michelson interferometer. Then the two beams were recombined and coupled into the nonlinear splitter chip by a reflective objective (Newport 50102-02). The average off-chip input power was calibrated by a thermal power meter (ThorlabsPM16-401). The input/output coupling losses at 2090 nm were estimated to be 21.6 dB/4 dB. For the power-dependent transmittance measurements in FIG. 12, only one output beam from the Michelson interferometer was used. The chip was placed on a thermoelectric cooling stage (TEC). For adjusting the QPM condition, temperature tuning was used. For the results in FIGS. 12 A and B, the output power was measured by an optical spectrum analyzer (OSA) covering 1200-2400 nm (YokogawaAQ6375B) with a 2 nm resolution bandwidth. For the result in FIG. 13B-E, the output power was measured by an IR 2-μm photoreceiver (Newport 2034). We used commercial software (Lumerical Inc.) to solve for the waveguide modes shown in FIG. 11D, as well as to obtain the dispersion characteristics. We solved an analytical nonlinear envelope equation (NEE) in the frequency domain using a split-step Fourier technique to simulate the pulse propagation and nonlinear dynamics in the waveguide. The nonlinear step was solved with a fourth-order Runge-Kutta method.

Process Steps

Block 1400 represents providing or obtaining a thin film waveguide, e.g., on a substrate, the thin film including a material having a second order nonlinear susceptibility. The step can comprise defining or patterning (e.g., etching) a waveguide in the thin film, so that the waveguide has a thickness on the order of the signal being guided by the waveguide. The step may comprise structuring or spatially modulating the waveguide so as to form the waveguide comprising a phase matched structure.

Block 1402 represents coupling a gain medium to the waveguide, e.g., by depositing rare earth ions or coupling a semiconductor gain region.

Block 1404 represents connecting couplers to the gain medium and the waveguide so as to form a cavity. In one or more examples, the couplers comprise an input coupler and an output coupler.

Block 1406 represents optionally connecting a voltage source to electrically pump or provide active mode-locking, and/or a pump to optically pump the gain medium.

Block 1408 represents the end result, a chip scale mode-locked laser. Illustrative embodiments of the mode-locked laser include, but are not limited to, the following.

1. A chip-scale mode-locked laser 100, 800, 900, comprising a cavity 102, 914, comprising a gain medium 104, 820, 918 for amplifying signal electromagnetic radiation (signal 106, 810, 906) through stimulated emission, the signal electromagnetic radiation having a signal wavelength; and a passive or active mode-locking device 108, 802, 901 to enforce pulse formation in the laser. The mode-locking device 108, 802, 901 comprises a thin-film waveguide 110, 804, 902 having a thickness T on the order of the signal wavelength so as to (e.g., tightly) confine and guide the signal 106, 810, 906 along the thin-film waveguide. The waveguide comprises a material (e.g., TFLN or PPLN) comprising a second-order nonlinear susceptibility to enable active or passive mode-locking. The mode-locking device leads to generation of pulses 114, 824, 916 of electromagnetic radiation of the signal by the mode-locked laser.

Figure 1B:
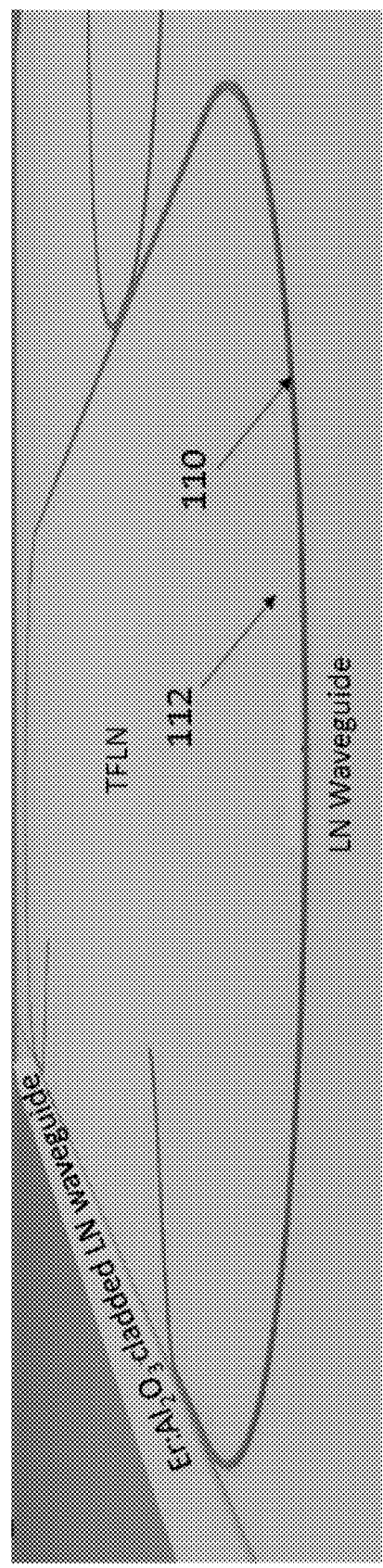

2. The mode-locked laser 100 of example 1 wherein the gain medium 104 comprises a material 118 deposited on or integrated with the thin-film waveguide 110, providing stimulated emission of the signal 106 in the presence of, or in response to, a pump electromagnetic radiation (pump) 122 pumping (e.g., optically pumping) the material 118 (e.g., the gain medium outputs fluorescence comprising the signal 106 in response to the pump 122). FIGS. 1A-1B and 2A illustrate one such example.

3. The mode-locked laser 100 of example 2, wherein the gain medium 104 or the material 118 comprises rare-earth ions or a rare-earth ion-doped oxide 120, such as but not limited to, Erbium (Er) doped $Al_2O_3$, Thulium (Tm) doped $Al_2O_3$, or Ytterbium (Yd) doped $Al_2O_3$. FIGS. 1A-1B and 2A illustrate one such example.

4. The mode-locked laser 100 of example 2 or example 3, wherein the material 118 comprising rare earth ion doped oxide 120 is grown on top of the waveguide 110 by an atomic layer deposition (ALD) process (see e.g., FIG. 2A), or wherein the rare-earth ions are diffused into the waveguide 110 at one or more high temperatures.

5. The mode-locked laser 100, 800, 900 of any of the examples 1-4, wherein the thin-film waveguide 110 comprises a ridge 200, 826, 826 having a width W and the thickness T guiding a mode 202 associated with the pump 122 or signal 906, 106 electromagnetic radiation with most of the mode's energy confined in a transverse cross-sectional area A smaller than 3 micrometers by 3 micrometers.

6. The mode-locked laser 100, 800, 900 of any of the examples 1-5, wherein the input pump 122 is continuous wave and/or the train of output mode-locked pulses 114, 824, 816 each have a pulse width of less than 100 picoseconds.

7. The mode-locked laser 100, 800, 900 of any of the examples 1, 5-6, wherein the gain medium 820, 918 comprises a semiconductor material that can be pumped either by electromagnetic radiation or electric current, and wherein the gain medium is integrated with the thin-film waveguide 902, 804, either through evanescent coupling or butt coupling (see e.g., FIG. 8 or 9).

8. The mode-locked laser 900 of example 7, wherein the thin-film waveguide 902 is butt-coupled to the semiconductor gain medium 918 and an input port of the thin-film waveguide 902 is adiabatically tapered in width in order to match the mode sizes in the thin-film waveguide 902 and the semiconductor gain medium 908 (see e.g., FIG. 9). In one or more examples, for the adiabatic taper, we define the width changes from a few micrometers to around one micrometer with a tapering length of 50-200 micrometers. In other examples, the adiabatic taper is such that the width changes with a gradient less than 0.1.

9. The mode-locked laser 900 of example 7, wherein the thin-film waveguide is heterogeneously integrated with the gain medium comprising a semiconductor through wafer bonding or a micro-transfer-printing process. In one or more examples, the transfer of the signal 106 between the thin-film waveguide 902 and the semiconductor gain medium 918 is through evanescent coupling.

10. The mode-locked laser 100, 800 of any of the examples 1-9, wherein the mode-locking device 108, 802 is a passive mode-locking device that provides an intensity-dependent transmission or reflection for the signal 106, comprising:
  a thin-film waveguide 110, 804 having a thickness T on the order of the signal wavelength so as to tightly confine and guide the signal 106 along the thin-film waveguide, the thin film waveguide 110, 804 further comprising a material comprising a second-order nonlinear susceptibility enabling second harmonic generation and optical parametric amplification of the signal along the waveguide no, 804; and an output directional coupler 116 providing different coupling ratios for the signal 810, 106 and the second harmonic 812, 130 of the signal 106. Illustrative examples are shown in FIGS. 1 and 8.

11. The mode-locked laser 100, 800 of any of the examples 1-10, wherein the mode-locking device comprises an external nonlinear mirror 116, 850 to enforce or cause pulse formation and passive mode-locking of the signal electromagnetic radiation 106. Illustrative examples are shown in FIG. 8 and FIG. 1.

12. The mode-locked laser of example 11, wherein the nonlinear mirror 850 comprises metal electrodes 822 next to the thin-film waveguide 804. The relative phase between the signal 810 and the second harmonic 812 of the signal can be adjusted by applying voltage on the electrodes 822 according to an electro-optical effect. An illustrative example is shown in FIG. 8.

13. The mode-locked laser of example 11, wherein the output facet 814 of the nonlinear mirror 850 is mechanically polished and coated with a dielectric coating. The dielectric coating ensures partial reflection of the signal 810 and unity reflection of the second harmonic 812. FIG. 8 illustrates an example.

14. The mode-locked laser 900 of any of the examples 1 or 5-9, wherein the mode-locking device 901 is an active mode-locking device comprising an electro-optic modulator 908 comprising (e.g., metal) electrodes 912 next to the thin-film waveguide 902, wherein a radio-frequency voltage from a source and applied across the electrodes applies an electric field across the thin-film waveguide 902 so as to periodically modulate the refractive index of the thin-film waveguide 902 according to an electro-optical effect. FIG. 9 is an illustrative example.

15. The mode-locked laser of example 14, wherein the waveguide 902 further comprises or is coupled to the output coupler comprising a loop mirror 904. FIG. 9 shows an illustrative example.

16. The mode-locked laser 100, 800, 900 of any of the examples 1-15, wherein the thin-film waveguide 110, 902 comprises lithium niobate, lithium tantalate, Potassium Titanyl Phosphate (KTP), aluminum nitride, gallium arsenide, indium phosphide, or aluminum gallium arsenide.

17. The mode-locked laser 100, 800 of any of the examples 1-13, wherein: the mode-locking device 108, 802 comprises a passive mode-locking device;
  the waveguide 110, 804 comprises a plurality of quasi-phase-matched regions 124, 126 through spatially varying nonlinear susceptibility, for instance through ferroelectric poling or orientation patterning, that ensures phase-matched second-order nonlinear interactions:
  in a first region 124 of the waveguide 110, 804, so that the device 108, 802 generates a second harmonic 130, 812 of the signal wavelength electromagnetic radiation 106, 810 (second harmonic),
  in a second region 126, so that the device 108, 802 down-converts at least a portion of the second harmonic 812, 130 back into the signal 106, 810 through optical parametric amplification;
  the device 108, 802 further comprising an output coupler 116, 806 that preferentially couples the signal 106, 810 out of the laser cavity 102, as compared to the second harmonic 812, 130, so as to selectively enhances resonance of the higher intensity signal modes while suppressing resonance of the lower-intensity signal modes in the cavity due to the stronger second harmonic generation processes in the first region 124 of the waveguide 110, 804 and the stronger optical parametric amplification process in the second region 126 of the waveguide 110, 804, as compared to the second harmonic generation processes and the optical parametric amplification processes for the lower intensity signal modes;
  and the electromagnetic radiation 810 coupled out of the cavity 102 through the output coupler 116, 806 comprises a train of the mode-locked pulses 824, 114 each having a pulse duration of less than 100 picoseconds. Examples are illustrated in FIGS. 1A-1B and 8.

18. The mode-locked laser 100, 800 of example 11, wherein the waveguide comprises:
  a first quasi-phase-matched region 124 wherein the phase-matched nonlinear process is the second harmonic generation of a second harmonic 810, 130 from the signal 106, 810,
  a second quasi-phase-matched region 126 wherein the signal 106, 810 is parametrically amplified by the second harmonic,
  a third region 128 between the first region 124 and the second region 126 to provide an approximately 180 phase shift in the relative phase of the signal 106, 810 and the second harmonic 812, 130. Examples are illustrated in FIGS. 1A-1B and 8.

19. The mode locked laser of any of the examples 1-18, wherein the signal wavelength comprises a wavelength in a range of 400 nanometers to 10 micrometers and the thickness T of the waveguide is equal to or within a factor of 10 of the signal wavelength.

20. A chip-scale mode-locked laser including a gain medium for amplifying signal electromagnetic radiation by the external pump electromagnetic radiation; a mode-locking device comprising a thin-film waveguide and an output directional coupler with wavelength-dependent out-coupling ratio; and a cavity. The thin-film waveguide is made of a material comprising a second-order nonlinear susceptibility which enables a strong and precise interplay between second-harmonic generation and parametric amplification of the signal. The waveguide has a thickness on the order of the signal wavelength so as to tightly confine the pump electromagnetic radiation along the thin-film waveguide. The cavity includes directional couplers that allow for multiple passes of the signal electromagnetic radiation through the mode-locking device and the gain medium, and a single pass of pump electromagnetic radiation through the gain medium. The mode-locking device mode locks the signal electromagnetic radiation by providing strong intensity-dependent transmission of the signal electromagnetic radiation at a femtojoule energy level. The output directional coupler outputs a train of mode-locked pulses of the pump electromagnetic radiation.

21. In another mode-locked laser design, the mode-locking device can be butt-coupled with an external gain medium such as a semiconductor optical amplifier (SOA), thus enabling the realization of a compact MLL module. Given the diverse light-emitting spectral ranges of the SOAs, this design can provide diversity in operational wavelength.

22. The mode-locking device of any of the examples 1-21 functioning as an all-optical switch. The switch can operate at an energy level of femtojoule with a switching time of femtoseconds.

23. The mode-locked laser of any of the examples 1-22, wherein the signal electromagnetic radiation has an energy of 100 femtojoules or less in the cavity.

24. The mode-locked laser of any of the examples 1-23, wherein the gain medium is pumped with a pump having an energy less than 100 femtojoules.

25. The mode-locked laser of any of the examples, wherein chip-scale is defined as the laser cavity, the gain medium and the mode-locking devices are all made of chip-scale components within 10 mm in size, and can be mass produced in wafer scale by semiconductor foundries.

Figure 15:
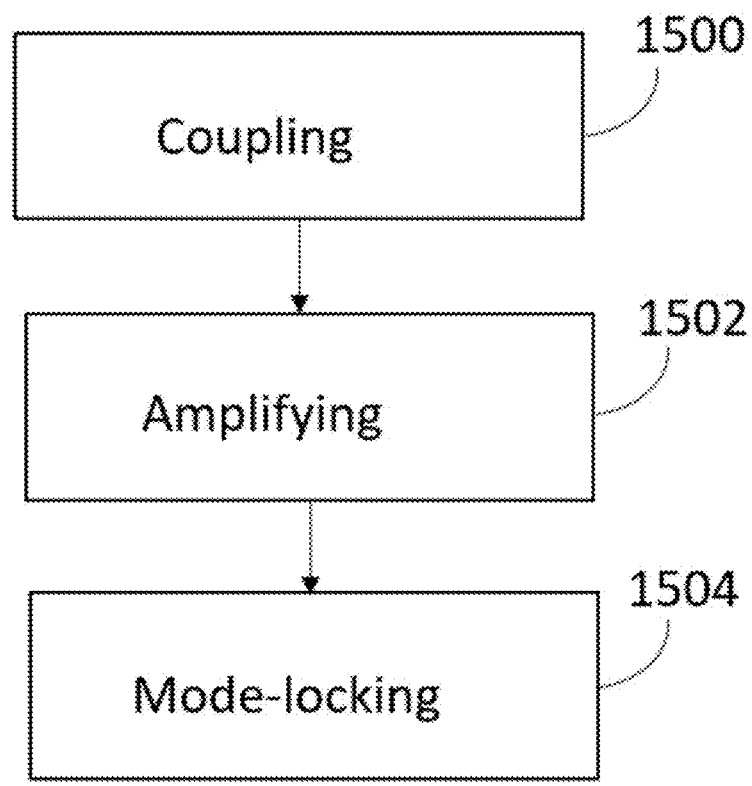
FIG. 15 is a flowchart illustrating a method of operating a mode-locked laser.

FIG. 15 illustrates a method of operating a mode-locking device.

26. A method of operating a chip-scale mode-locked laser, comprising:
Block 1500 represents coupling a gain medium and a mode-locking device in a cavity.
Block 1502 represents amplifying signal electromagnetic radiation (signal) through stimulated emission in the gain medium, the signal comprising a signal wavelength; and
Block 1504 represents actively or passively mode-locking the signal using the passive or active mode-locking device so as to enforce pulse formation in the laser, wherein the mode-locking device comprises:
a thin-film waveguide having a thickness on the order of the signal wavelength so as to confine and guide the signal along the thin-film waveguide,
a material comprising a second-order nonlinear susceptibility to enable active or passive mode-locking of the signal, and
wherein operation of the mode-locking device leads to generation of pulses of the signal outputted from the mode-locked laser.

27. The method of example 26 using the laser of any of the examples 1-25.

Figure 16:
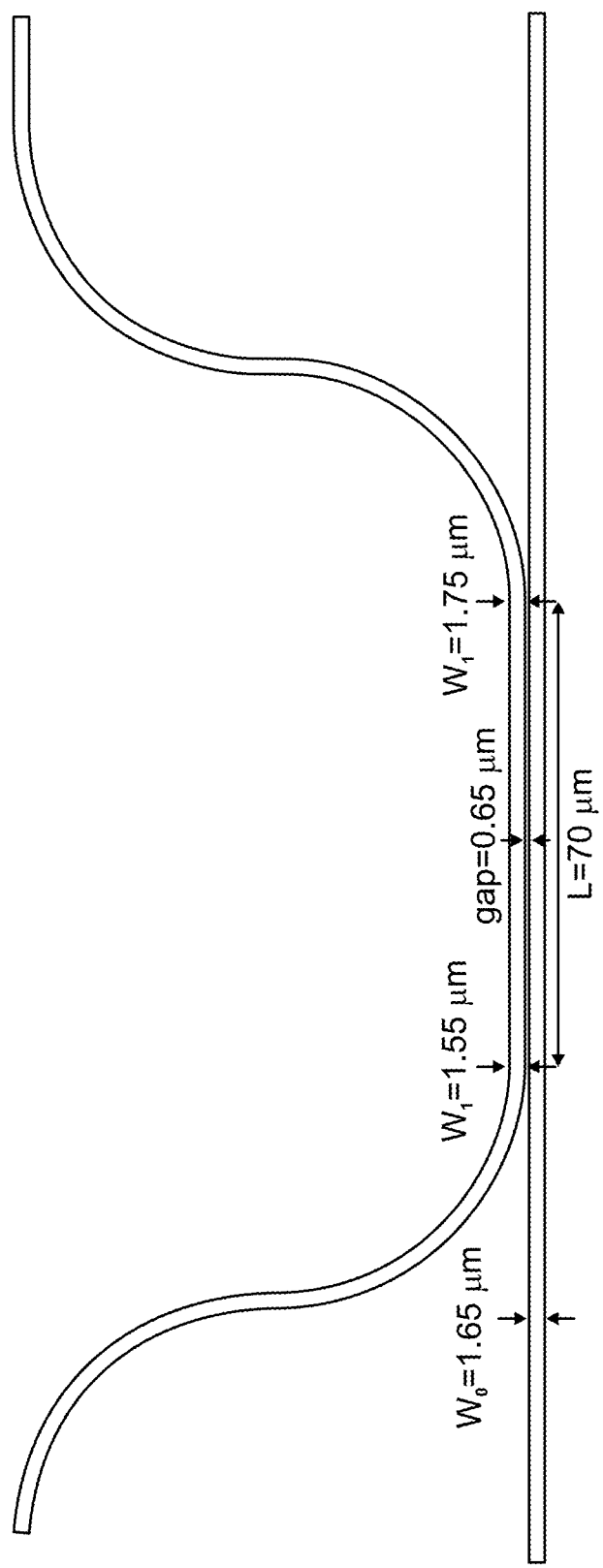
FIG. 16. Design of the adiabatically tapered directional coupler. The directional coupler is composed two neighbouring waveguides. The top width of the top waveguide is linearly tapered from $W_1=1.55$ μm to $W_2=1.75$ μm, whereas the bottom waveguide is not tapered, with a constant top width of $W_0=1.65$ μm. The coupling length L is 70 μm.

Supplementary Information for the Third Example
I. Design of the Adiabatically Tapered Directional Coupler During the device fabrication process, the waveguide width, height, and coupling gap can vary. As a result, the effective index $n_{eff}$ of the waveguide, as well as the coupling strength between the waveguides, will change. The coupling efficiency of the conventional directional coupler, which has neighboring waveguides of identical size, usually suffers from poor tolerance to fabrication errors and can hardly be used as broadband component[1]. Here we adopt an adiabatically tapered directional coupler design[1], which ensures broadband operation and good tolerance to fabrication errors. FIG. 16 shows the design of the directional coupler, which is composed of a tapered top waveguide (linearly tapered from $W_1$ to $W_2$ and a non-tapered bottom waveguide with a width of $W_0$. The dimensions, including $W_1$, $W_2$, $W_0$, the coupling length L and the coupling gap are labeled in the figure. The gap is fixed throughout the tapered region. Note that the etched LN waveguide has ~60° slant angle, the geometry shown in FIG. 16 corresponds to the top surface of the etched ridge waveguide. For an adiabatic coupler shown in FIG. S1, the power coupling efficiency ζ can be estimated by the Landau-Zener formula[1, 2]:

$$\zeta = 1 - \exp\left(\frac{-2\pi g^2}{\partial n_{eff}/\partial z} \frac{2\pi}{\lambda}\right)$$

where the coupling strength g equals to the half of the $n_{eff}$ index difference between the even mode and the odd mode at the center of coupler, the $\partial n_{eff}/\partial z$ is the changing rate of the $n_{eff}$ when varying the waveguide width along the propagation direction z, and λ is the wavelength. For very small g, light can hardly be coupled to neighboring waveguide since ζ≈0, while for large g the coupling efficiency ζ≈1.

Figure 17:
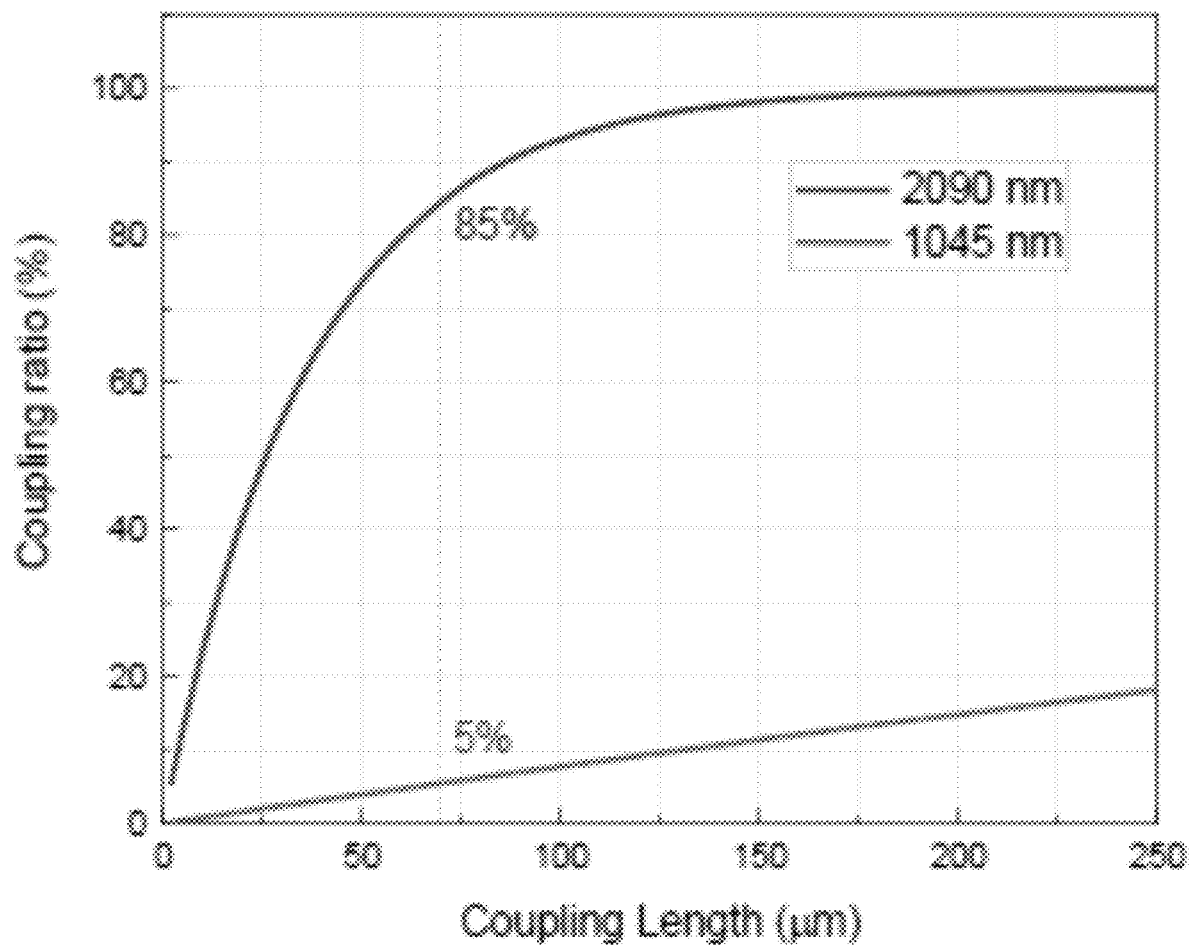
FIG. 17. Coupling efficiency as a function of coupling length for 2090 nm and 1045 nm light. When the coupling length is 70 μm, the coupling efficiency for 2090 nm and 1045 nm are 85% and 5%, respectively.
Figure 18A:
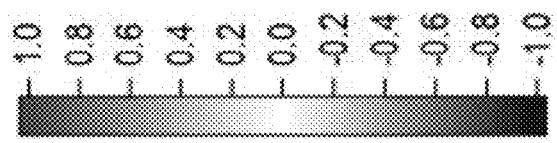
FIG. 18A-18B. Simulated light field propagation for λ=2090 nm (FIG. 18A) and λ=1045 nm (FIG. 18B). Fundamental TE mode at 2090 nm can be efficiently coupled from the bottom waveguide to the top waveguide, while the fundamental TE mode at 1045 nm mostly remains in the bottom waveguide.
Figure 18A:
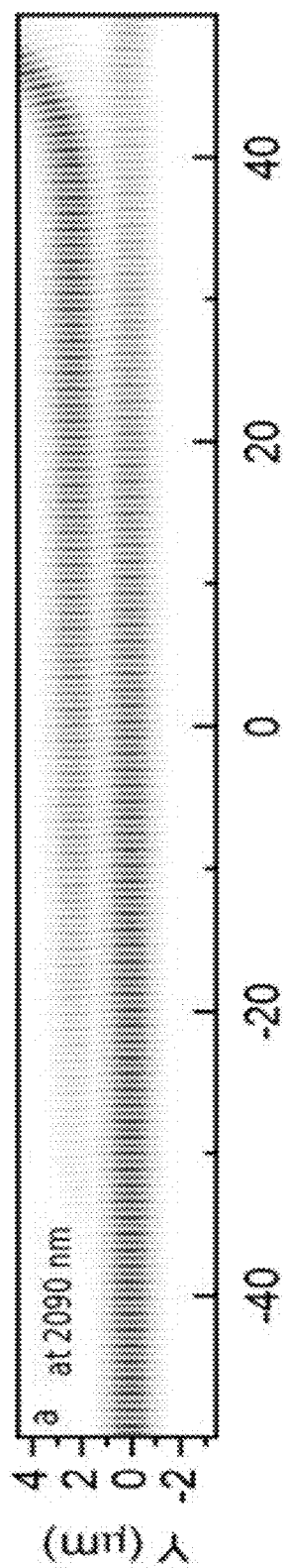
Figure 18B:
Figure 18B:
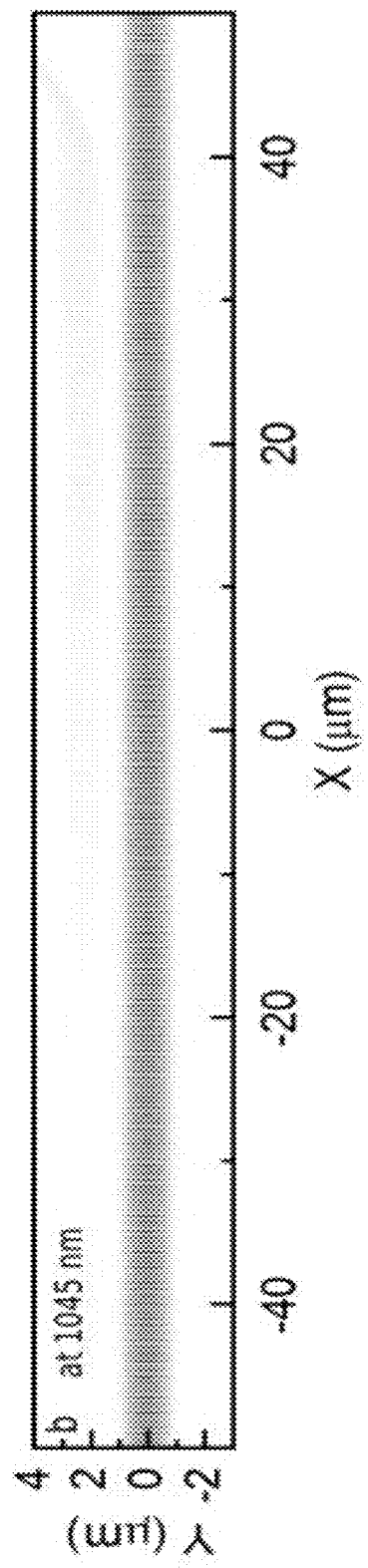

Based on Eq. 1, in FIG. 17 we plot the coupling efficiency of the adiabatically tapered directional coupler with the design parameters shown in FIG. 16. When the coupling length is 70 μm, the coupling efficiency for the fundamental TE mode at 2090 nm and the fundamental TE mode at 1045 nm are 85% and 5%, respectively. By performing a frequency dependent analysis (FIG. 11c in the main text). we have verified that the coupler is broadband around 2090 nm, and has a low coupling ratio for light at 1000 nm. FIG. 18 shows a 3-D FDTD (Lumerical) simulation of the wave propagation for the fundamental TE mode at 2090 nm and 1045 nm. Due to the large difference in the mode sizes, the fundamental TE mode at 2090 nm can be efficiently coupled from the bottom waveguide to the top waveguide, while the fundamental TE mode at 1045 nm mostly remains in the bottom waveguide.

II. Characterization of Input Pulses

Figure 19B:
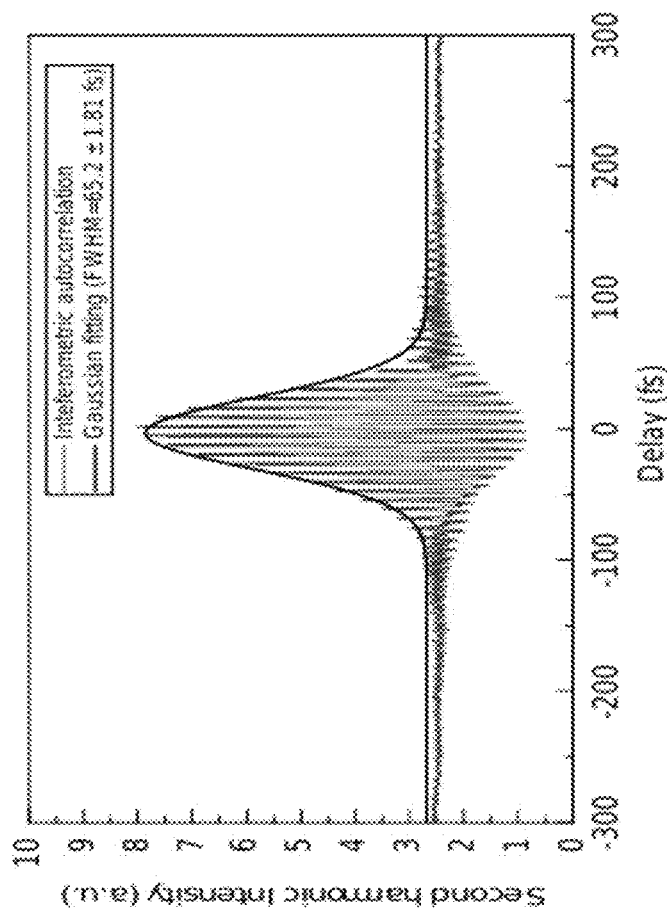
FIG. 19B. Autocorrelation of the input pulses. The Gaussian fit (black) of the envelop of the interferometric autocorrelation has a FWHM of 65.2 fs.
Figure 19A:
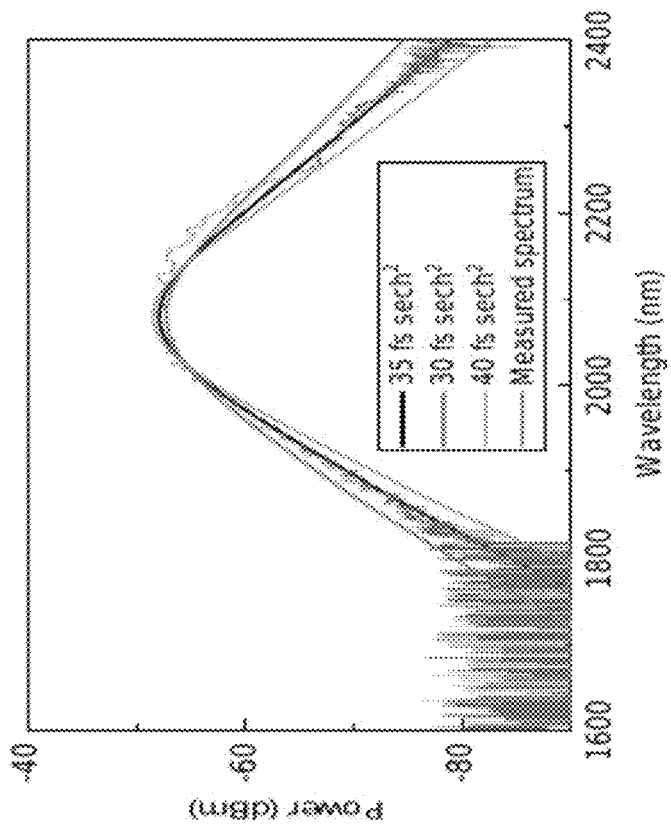
FIG. 19A shows measured spectrum of input 2.09 μm pulses (red) compared with the spectra of 30- (green), 35- (blue) and 40-fs (orange) pulses.

The quantitative analysis of our switching device including the nonlinear dynamics, the input/output coupling loss, the switching time and energy necessitates an accurate measurement of the input pulses. In FIG. 19a, we plot the measured spectrum of input pulses (red solid line). By comparing it with the spectra of 30-fs, 35-fs and 40-fs pulses centered at 2.09 μm, we found that the 35-fs pulse has the best agreement with our experimental spectrum. We also performed the interferometric autocorrelation measurement of the input pulses, as shown in FIG. S4b. The Gaussian fitting of the peaks of the autocorrelation has a FWHM of 65.2 fs, indicating that the actual pulse length is close to 46.2 fs. The slightly longer pulse length obtained from the autocorrelation measurement indicates that the input pulse is chirped, presumably due to the dispersive elements in our setup such as the pellicle, the long-pass filter and the neutral density (ND) filter. The relation between temporal profile of the pulse before ($\alpha(t)$) and after ($\alpha''(t)$) the dispersive element is given by 3]

$$a''(t) \approx \left(1 + j\frac{\beta_2 L}{2}\frac{d^2}{dt^2}\right)a(t)$$

where L is length of the dispersive medium and $\beta_2$ is the group velocity dispersion (GVD) of the dispersive medium. Based on the results in FIGS. S1a and b, we can estimate a total group dispersion delay (GDD) of $\beta_2 L = \pm 362$ fs$^2$. We determine the sign of GDD in section V.

III. Single Envelope Simulation

We used a method similar to that described in [4] to simulate quadratic interactions over a large bandwidth using a single envelope in the frequency domain. We write a spectral component of the electric field propagating in the z-direction on a single waveguide mode as:

$$E(x, y, \omega) = A(z, \Omega) e(x, y, \omega) e^{-i(\beta_0 - \omega_o/v_{ref})z}$$

where $\omega$ and $\Omega = \omega - \omega_0$ are the optical and envelope angular frequencies, $\omega_0$ is the simulation center frequency, $\beta_0$ is the waveguide propagation constant at $\omega_0$, $v_{ref}$ is the simulation reference frame velocity, x, y are the transversal waveguide coordinates, e(x, y, $\omega$) is the mode transversal field distribution, and A(z, $\omega$) is the complex amplitude of the field that evolves during propagation. Note that A(z, $\omega$) is a rapidly-varying envelope, i.e. it includes the phase factor $e^{-i\beta(\omega)z}$ acquired during linear propagation. Furthermore, A(z, $\omega$) is an analytic signal, i.e., it only contains positive frequencies (A(z, $\omega$<0)=0).

We obtained an equation of motion for A(z, $\Omega$) by ignoring counter-propagating terms (which are usually phase mismatched), and assuming a constant nonlinear coefficient and mode overlap integral, both of which are weak functions of frequency away from any material resonances. No limitations are placed upon the maximum spectral bandwidth of the simulation. The resulting propagation equation is, $$\frac{\partial A}{\partial z} = -i\left[\beta(\omega) - \beta_0 - \frac{\Omega}{v_{ref}} - i\frac{\alpha}{2}\right]A - \frac{i\omega\epsilon_0 X_0}{8} d(z)\mathcal{F}_\Omega\{a^2(z,t)e^{j\phi(z,t)} + 2a(z,t)a^*(z,t)e^{-j\phi(z,t)}\}$$

where d(z)=$\pm$1 is the sign of the quadratic nonlinear coefficient that is modulated in quasi-phase matching, $\alpha$(z, t) is the time domain representation of A(z, $\Omega$), $\phi$(z, t)=$\omega_0$t-($\beta_0$-$\omega_0$/$v_{ref}$)z, $\mathcal{F}_\Omega$ is the Fourier transform in the $\Omega$ variable. The effective nonlinear coefficient $X_0$ is defined as:

$$X_0 = \sum_{ijk} \chi^{(2)}_{ijk} \int e_i^*(\omega)e_j(\omega_2)e_k(\omega_1 - \omega_2)dS$$

where $\chi_{ijk}^{(2)}$ is the quadratic nonlinear susceptibility tensor, j, k, l are Cartesian components of the corresponding vectors, and $\omega_1$ and $\omega_2$ are two suitable chosen frequencies, e.g., the signal and pump frequencies in our case.

The time domain terms inside the Fourier transform of Eq. (4) represent the processes of sum frequency generation ($\propto \alpha(t)^2$) and difference frequency generation ($\propto \alpha(t)\alpha(t)^*$), which combined can predict all classical second order interactions, such as second harmonic generation and parametric amplification. Since A(z) is fast varying, carrier dynamics can be resolved. In particular, phase mismatch is automatically included and the term d(z) can be used to accurately simulate different quasi-phase matching gratings. This also means that the spatial domain needs to be sampled finely enough to resolve these dynamics. We solve the evolution equation (4) with the split-step Fourier technique using the fourth-order Runge-Kutta method for the nonlinear step.

IV. Deterministically Finding the Quasi-Phase-Matching Condition

In this section, we introduce the experimental methods that we used to deterministically find the quasi-phase matching condition. Although we can determine the required poling period for a particular LN waveguide cross-sectional geometry by performing the numerical simulations, the fabrication errors in terms of the waveguide width, height, and the variation of the thin film thickness can shift the nominal poling period. To account for the fabrication errors, we fabricated 20 nonlinear splitter devices on the same chip including 20 poling periods ranging from 4.97 to The shift between consecutive poling periods is 10 nm. By monitoring the second harmonic generation of all the devices at the output coupler ports, we found that a period of 5.11 μm is closest to quasi-phase-matching.

In addition, we used a thermoelectric cooler (TEC) underneath the chip to change the temperature of the device and coated thin organic materials, thereby fine-tuning the refractive index and the nominal poling period of the LN waveguides[5]. Based on our earlier experiments [6], we found that 1° C. temperature increase of LN nanophotonic waveguide can offset the nominal poling period by ~0.2 nm. Therefore, one can account for the 10-nm poling period interval by applying ~50° C. temperature change to our device. Since the output coupler evanescently couples out ~85% of FH power right after the SHG process, by monitoring the FH power out of the outcoupler, we can have a knowledge of the efficiency of the SHG process and the amount of phase mismatch, which are essential for determining the optimal operating temperature of the device.

Figure 20B:
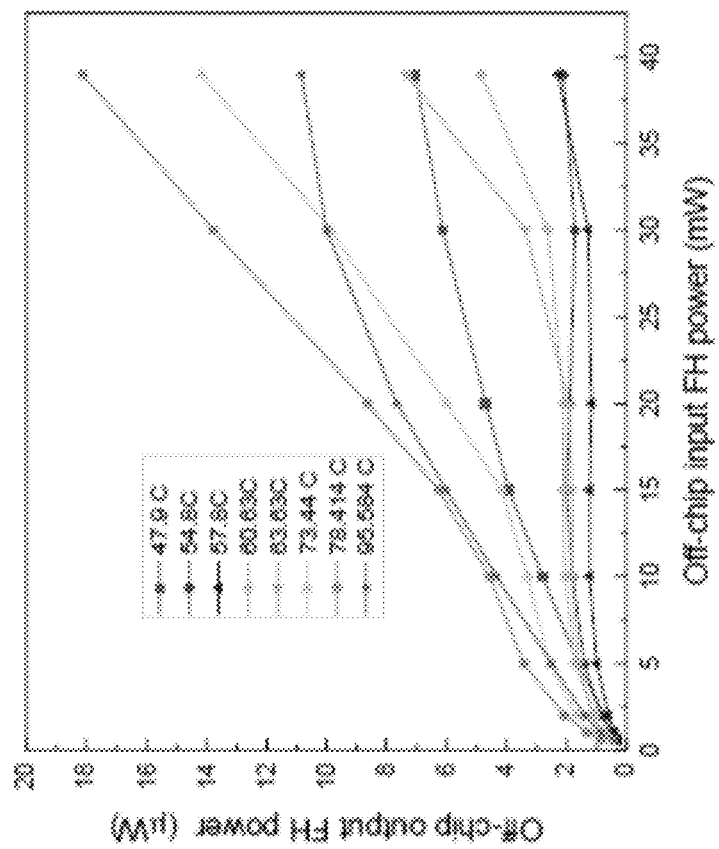
Figure 20A:
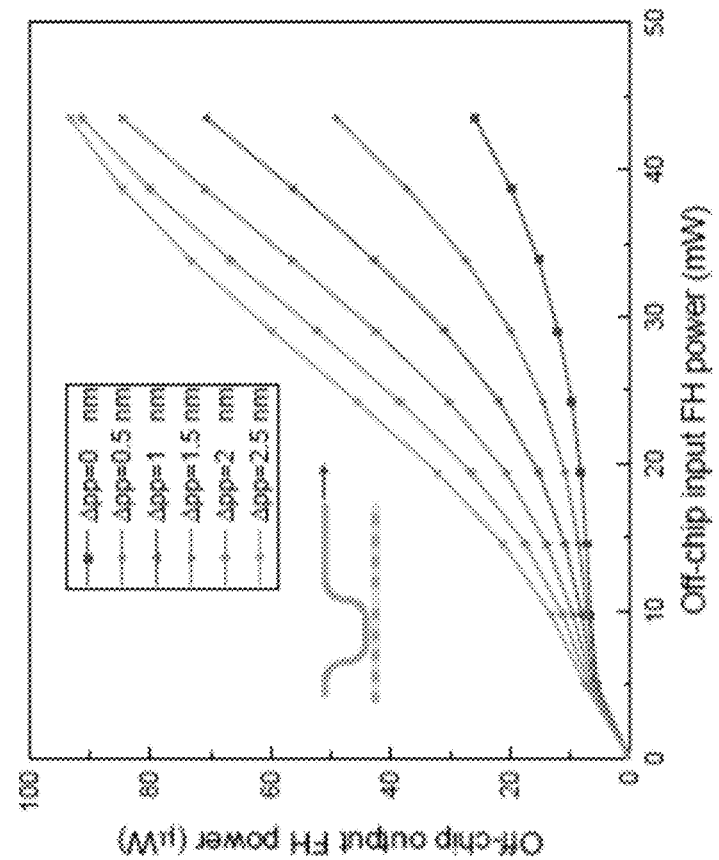

FIG. 20A shows the simulated output FH power at the drop port as a function of input FH power. When the phase mismatch is zero ($\Delta$pp=0 nm, black), the output FH power exhibits a strong saturation as input FH power increases, since the SHG process depletes the FH power strongly. Also, the output FH power is low since most of the FH is converted to the SH, which is not strongly coupled out. When the input power is higher (e.g. beyond 30 mW), the saturation becomes less pronounced due to the back-conversion from the SH to FH, which will be discussed in the following sections. When the phase mismatch increases, the output-input becomes steadily closer to a linear relation since less FH will be depleted. Experimentally, using the 5.11-μm poling period device, we observed a similar trend, as shown in FIG. S5b. When the device temperature is either too high (>70° C.) or too low (<50° C.), the output-input curves exhibit insignificant saturation of FH and higher output FH power. By comparing the experimental curves with the simulation, we found that the optimal temperature range for achieving phase-matching is 60-65° C.

V. Calibration of the Input/Output Coupling Loss

Quantifying the input/output coupling loss during our LN nonlinear splitter measurement is critical for determining the on-chip input pulse energy and evaluating the device efficiency as an all-optical switch. Although we can accurately measure the total loss (throughput), it is still difficult to disentangle the losses imposed by the input coupling, the waveguide propagation and the output coupling. In our optical parametric amplification (OPA) measurements [6], of a similar LN nanophotonic waveguide on the same free-space light coupling setup we used in this work, we have extrapolated that the input coupling loss is ~25 dB and the output coupling loss is ~5.8 dB. In our free-space coupling scheme, the input coupling has much lower efficiency compared to the output because we need to couple a free space beam to the single fundamental TE mode in the LN waveguide, whereas on the output side nearly all the outcoupled light can be collected by a large objective and then be readout by the detector. Here, we determine the input/outcoupling loss in our measurements by comparing the simulated phase-matched SHG process with the measurement results.

Figure 21B:
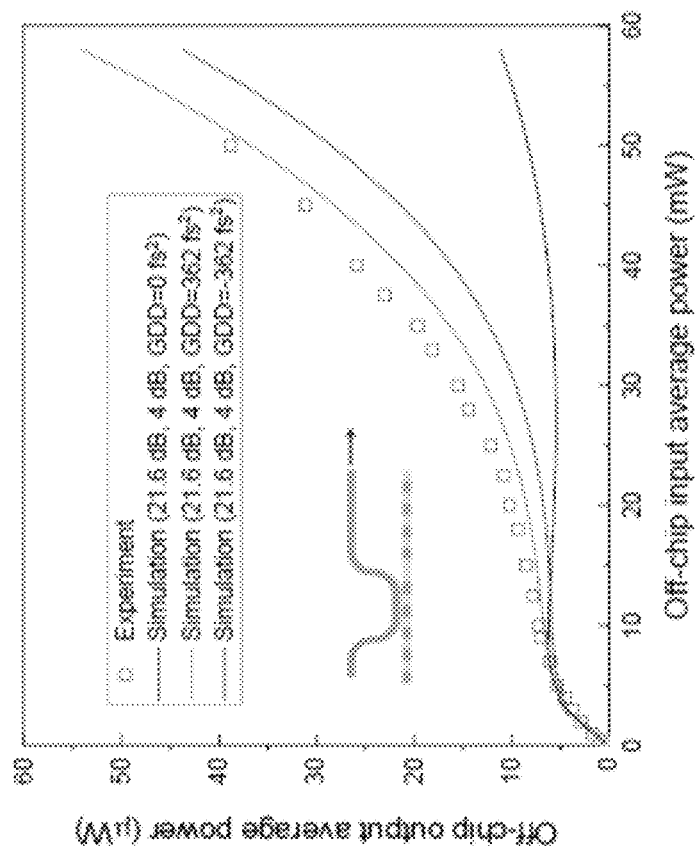
FIGS. 21A-21B. Determining the input/output coupling loss.
Figure 21A:
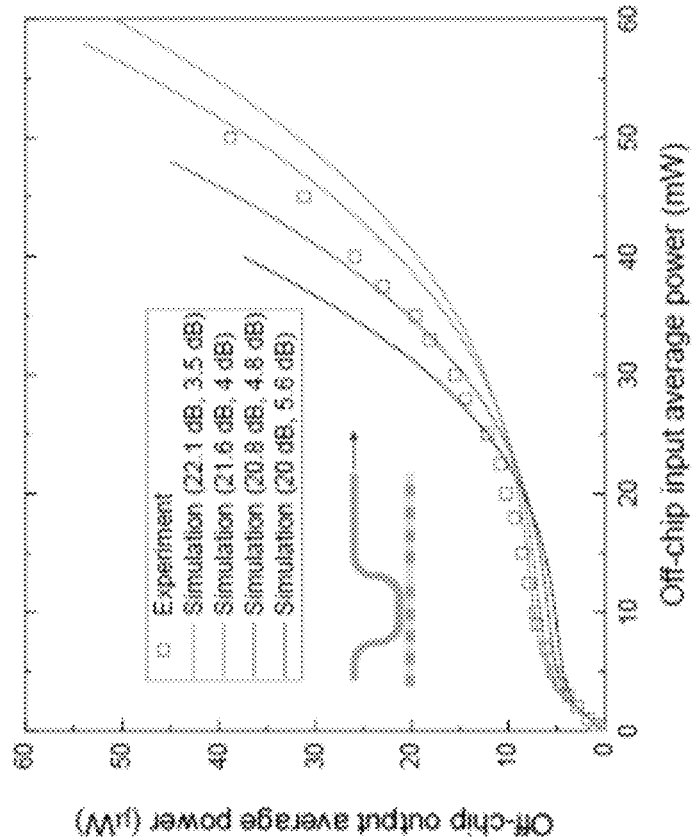

FIG. 21 black symbols show the measured output FH power at the drop port as a function of input FH power. The power values are measured off the chip. The total loss we experimentally measured is 26.6 dB. Assuming there is ~1 dB waveguide propagation loss, the total coupling loss is ~25.6 dB. In FIG. 21a, we also plot the simulated results with different combinations of input/output coupling losses. The simulation assumes 46.2 fs 2.09 μm chirped input FH pulses with a GDD of 362 fs$^2$, according to the analysis in section II. It can be seen from FIG. 21a *that the simulation with* 21.6 dB input coupling loss and 4 dB output coupling loss has the best agreement with the experimental results (green solid line). Moreover, it is clear from FIG. 21b that only the positive GDD can lead to good agreement with the experimental results.

VI. Nonlinear Dynamics

In this section, we discuss the ultrafast and the strong nonlinear dynamics of the FH and SH pulses in our device. The nonlinear dynamics in the time domain can help us understand the spectral features we experimentally observed, as well as the operating regime for all-optical switching. We also show that when the input pulse energy is below 600 fJ, the temporal shape of the FH pulse is minimally perturbed at the through output in both on- and off-states.

A. Nonlinear Dynamics in the SHG Region

Figure 22A:
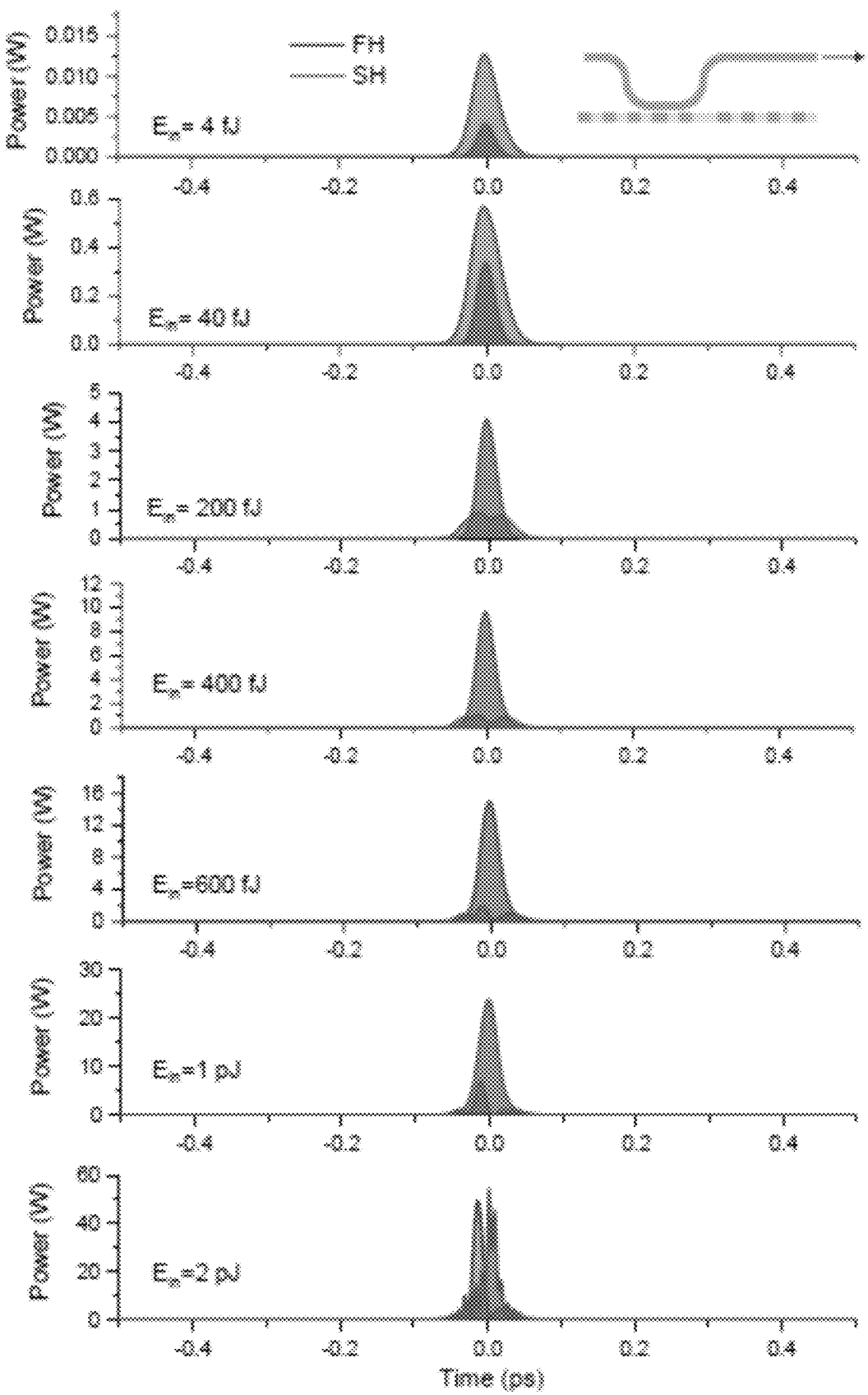
FIG. 22A: simulated time-domain output of the fundamental (FH) and the second harmonic (SH) under various input pulse energies. The FH and SH pulses are represented by the red and the blue pulses.
Figure 22B:
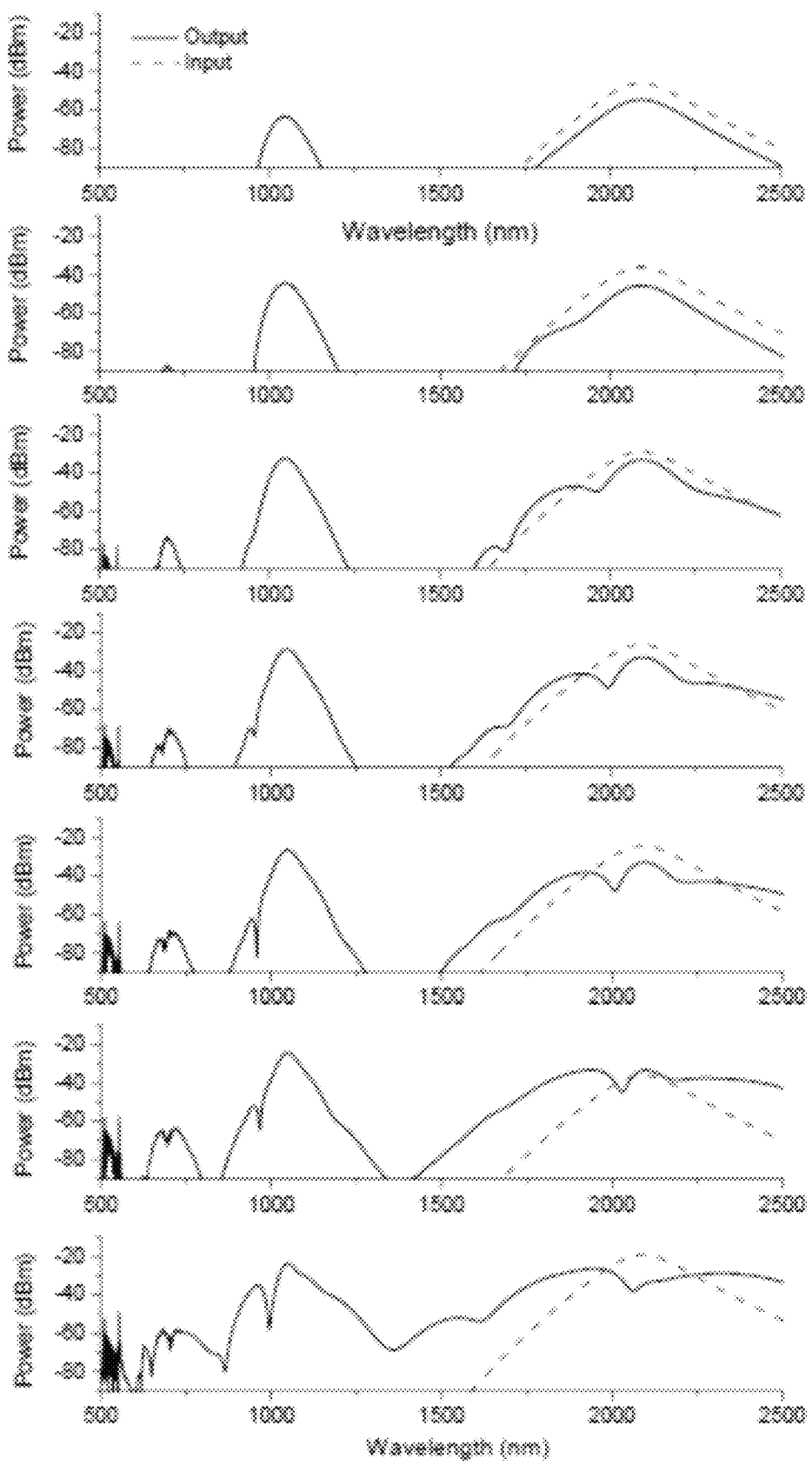
FIG. 22B: simulated output spectra under various input pulse energies (blue solid lines). The dashed lines are the spectra of input pulses. The spectral features around 700 nm and 522 nm correspond to the sum frequency generation (SFG) between FH and SH and the fourth harmonic of the FH.

We first discuss the nonlinear dynamics in the first 2.5-mm-long SHG region. FIG. 22 left panels show the simulated "snapshots" of the FH (red) and SH (blue) pulses right after the SHG process (before the poling defect) under various input pulse energies (4 fJ to 2 pJ). The right panel show the corresponding spectra. Due to the very small GVM (−0.41 fs/mm), it can be seen that the FH and SH pulses are still temporally overlapped after the 2.5-mm-long SHG process, showing negligible temporal walk-off. As shown in FIG. 22 A and 22B, during the conversion process, the FH pulse is slightly broadened since the higher intensity part of the FH pulse has higher SHG conversion efficiency, and the wings of the FH pulse has a lower conversion efficiency.

Further increasing the input FH pulse energy results in stronger depletion of the FH pulse. The strong depletion can even lead to a temporal dip in the FH pulse, as shown in FIG. 22c. However, due to the complexities such as the chirp of the input pulses, the GDD accumulated along the waveguide propagation, and the non-zero GVM between the FH and SH, the temporal dip may not necessarily occur at the center of the FH pulse. The corresponding spectrum, which is the Fourier transform of the pulses in the time domain, also shows the spectral dips around the center wavelength (2090 nm) of the FH pulse.

In the presence of a temporal dip, the output FH pulse can be regarded as being split into two neighboring pulses, which are shorter than the input FH pulse. Therefore, some spectral broadening can be seen (FIG. 22 *c*). By further increasing the input FH energy, the higher intensity part of the two neighboring FH pulses can still transfer energy to the SH, thus leading to the generation of additional temporal dips and further broadening of the spectrum (FIG. 22 *d-g*).

B. Nonlinear Dynamics in the Entire Device

Figure 23A:
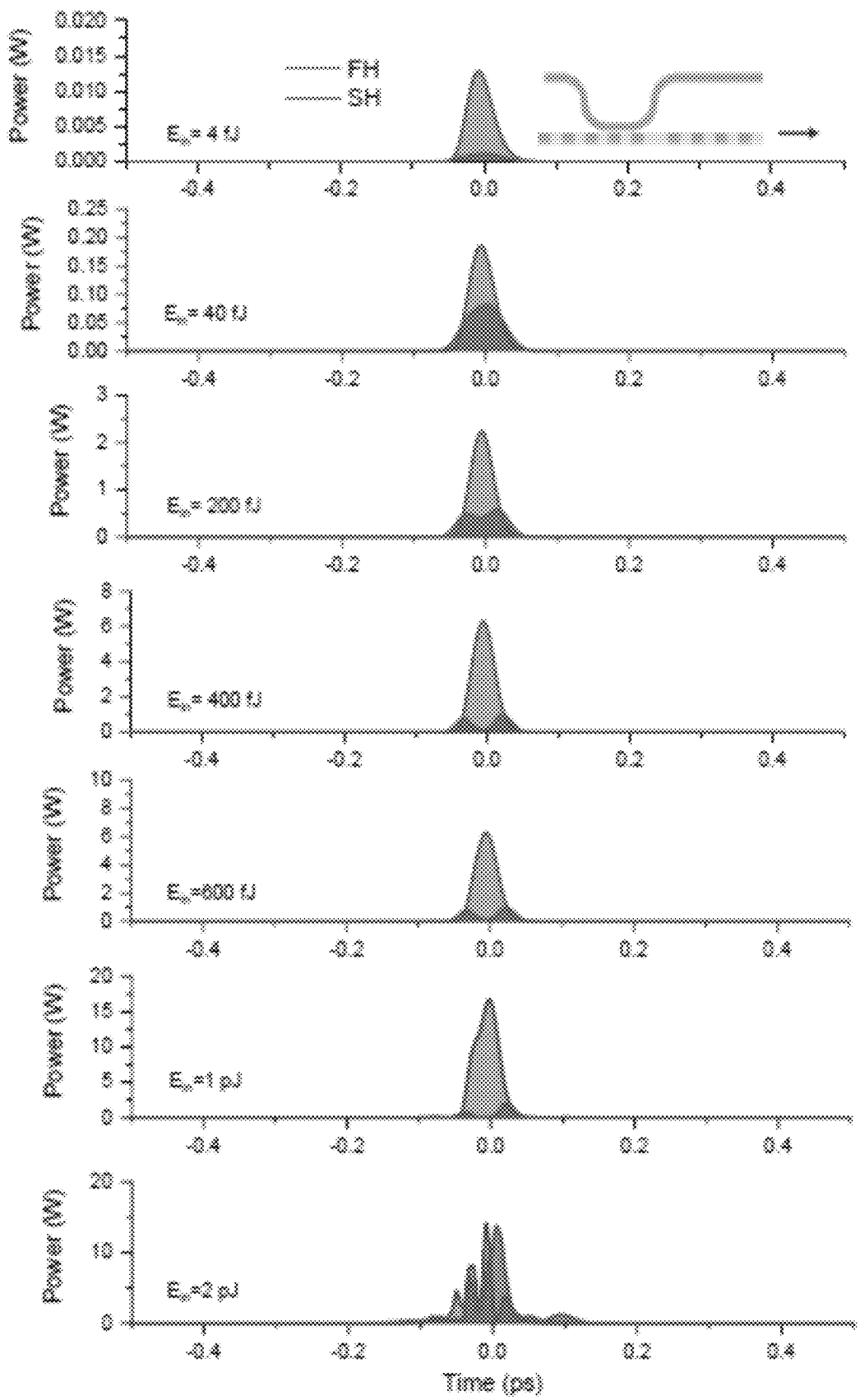
FIG. 23A-23B. Ultrafast nonlinear dynamics in the entire nonlinear splitter device.
Figure 23B:
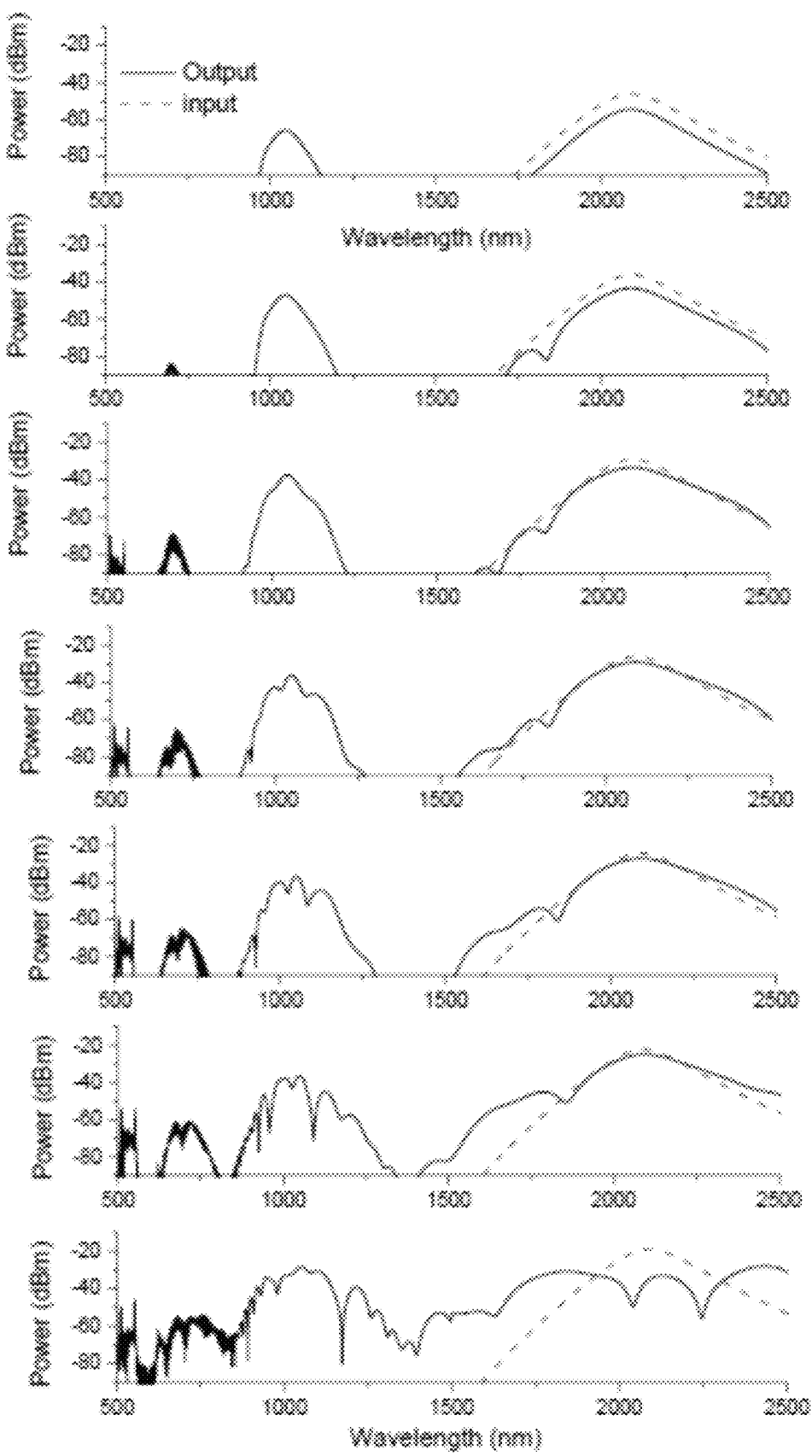

FIG. 23 illustrates the ultrafast nonlinear dynamics in the entire device. By comparing it with FIG. 17. it is evident that after the poling defect and the 3.5-mm DOPA section, the depleted FH pulses (red pulses) recovers in power, without showing obvious temporal dips. Such power recovery is more pronounced when the input pulse energy is higher since both the SHG and DOPA processes become stronger, as revealed by FIG. 23 *a-e*. It can be seen that the recovery of the FH power also eliminates the spectral dips around 2.09 μm. In addition, during the DOPA process, the FH extracts the power from the SH. As a result, the SH pulse (blue) can be depleted. When the DOPA process is strong enough, temporal dips can occur on the SH pulse, as shown in FIG. 23 *c-f*. This results in the spectral dips and the spectral broadening around 1045 nm. Therefore, compared to the results shown in section A, it is evident that the occurrence of temporal and spectral dips is indicative of the power flow direction between the FH and the SH.

Figure 24A:
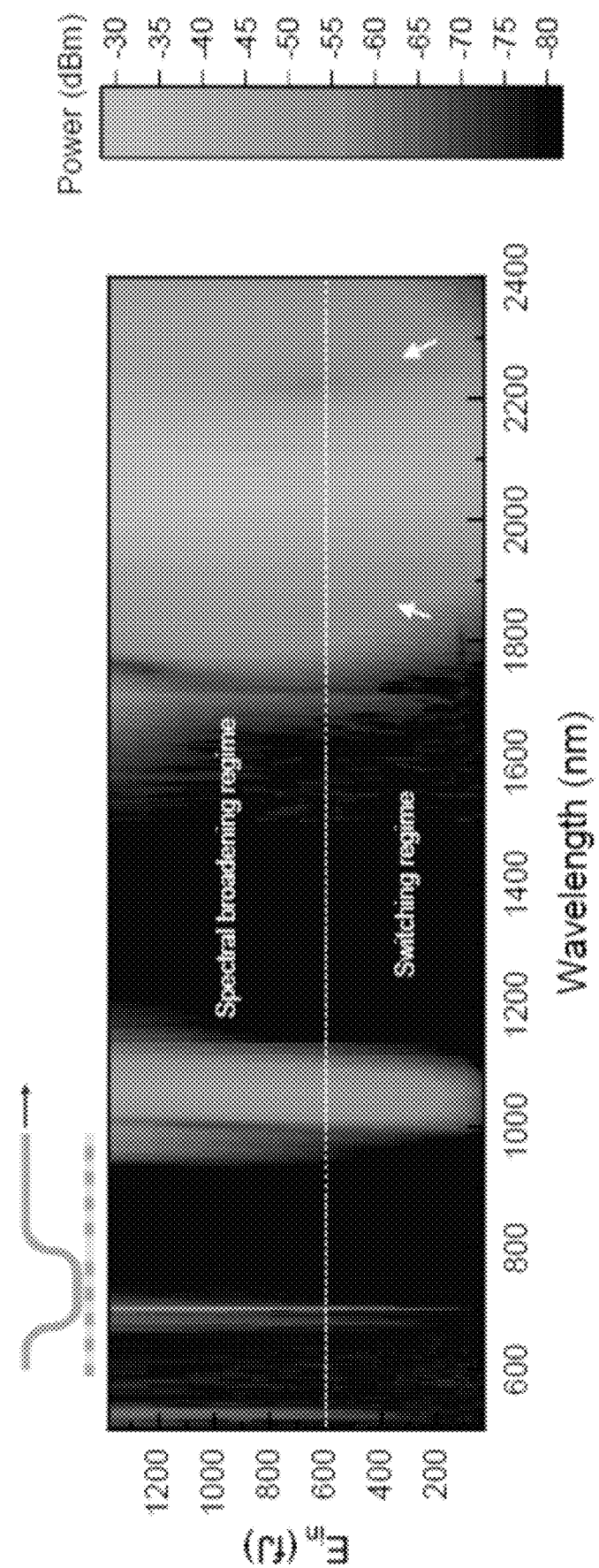
FIG. 24A-24B. Measured output power spectral density output at the drop port (FIG. 24A) and the through port (FIG. 24B) as a function of the input pulse energy ($E_{in}$). The spectral dips are labelled by the white arrows. The dashed white line separates the all-optical switching regime and the spectral broadening regime. Note that in (FIG. 24A) the power of the SH spectrum is much lower than the power of the FH spectrum due to much lower out-coupling ratio (~5%).
Figure 24B:
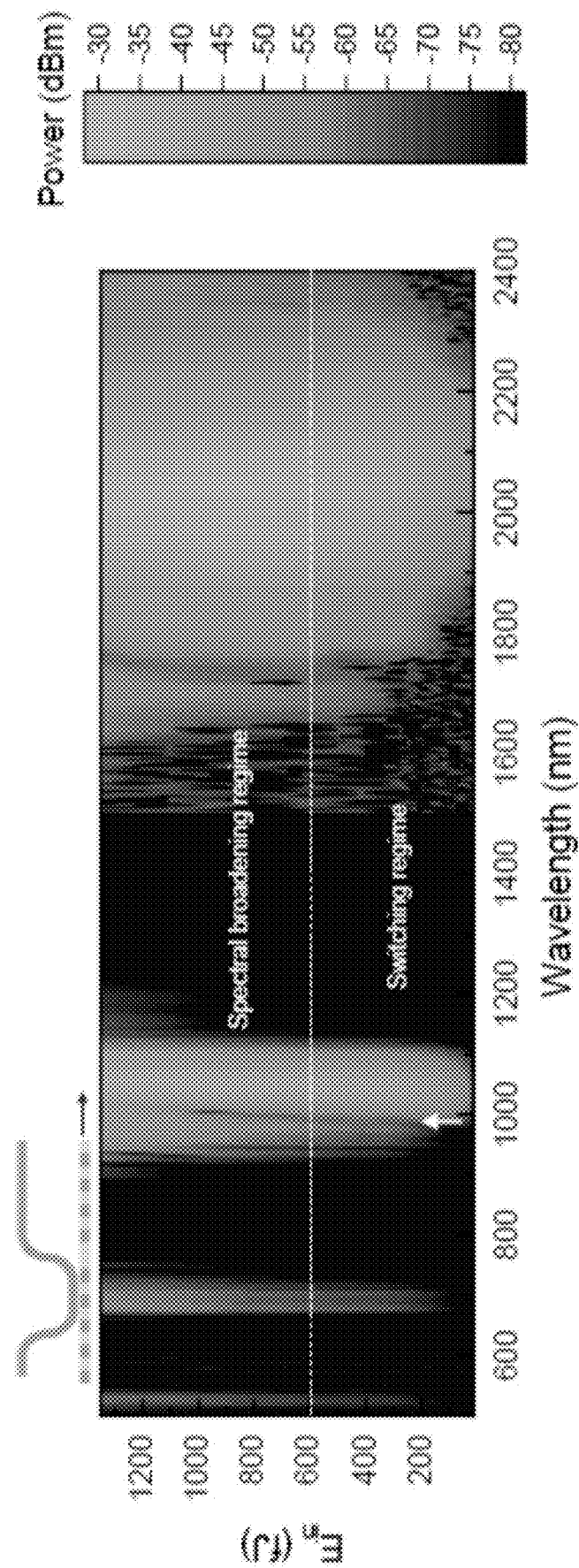

FIG. 24 shows the spectra that we experimentally collected both at drop port and the through port. When the input pulse energy is less than 600 fJ, at the drop port (FIG. 24a), spectral dips (labeled by the white arrows) can be found around 2.09 μm, whereas the no clear spectral dips can be found around 1.045 μm. This indicates the power is flowing from the FH to the SH. At the through port, spectral dips (labeled by the white arrows) can be found around the 1.045 μm and no spectral dips can be found around 2.09 μm, which means that the power is flowing from the SH to the FH. However, when the input pulse energy exceeds 6000, the power flow directions discussed above are no longer valid, as spectral dips and significant spectral broadening emerges around 1.045 μm in FIG. 24a. This behavior is a result of the power flowing back from the SH to the FH in the 2.5-mm-long SHG region, which will be elaborated in the following section.

C. Operating Regime for the All-Optical Switching

In the third example, we discussed the nonlinear transmittance at low input FH pulse energies (0-600 fJ). Here in FIGS. 25A and 25B, we plot the measured power dependent transmittance when the input pulse energy is varied from 0 to 1400 fJ (black symbols). The blue solid lines are the simulated results, showing good agreement with the experimental results. In the simulation, we assumes 35 fs input pulses with chirp at 2.09 μm. The device has a 2.5-mm-long SHG region, a 3.5-mm-long DOPA region, 85%(5%) of outcoupling of the FH (SH) in the directional coupler. We also assume the propagation loss of the FH and the SH are both 1 dB/cm.

Figure 25A:
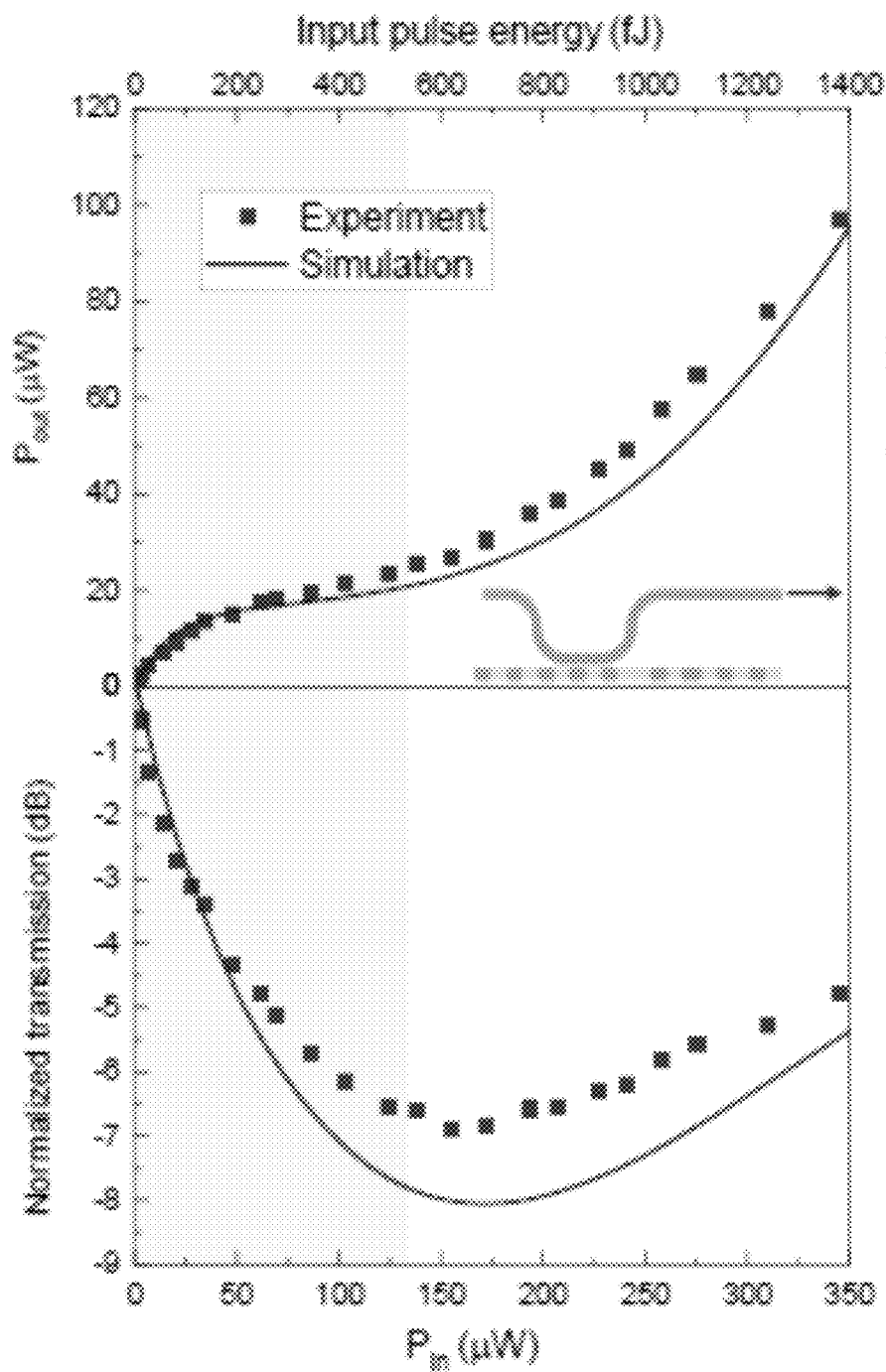
FIG. 25A-25B. Nonlinear optical transmission in the integrated nonlinear splitter.
Figure 25B:
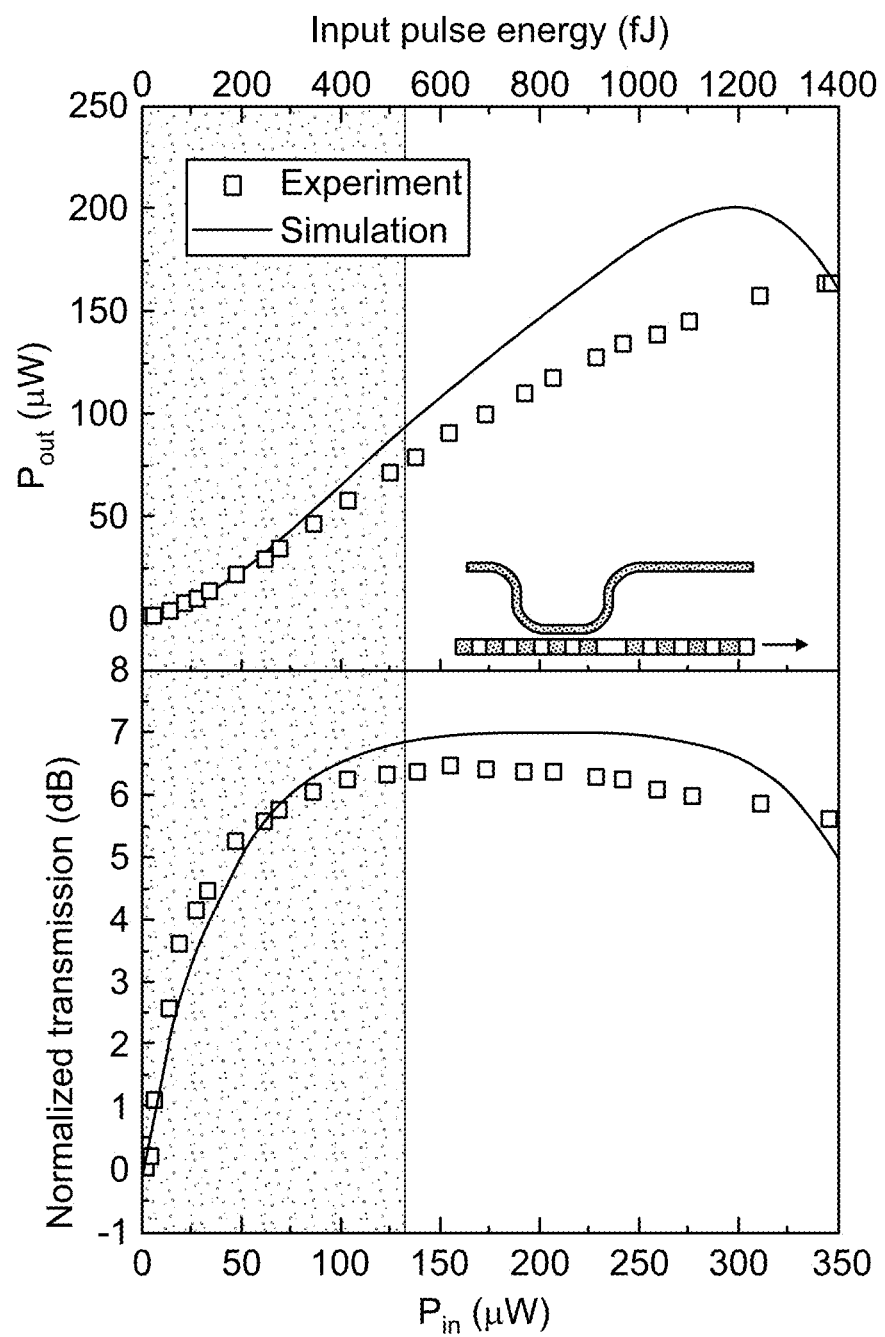
Figure 25C:
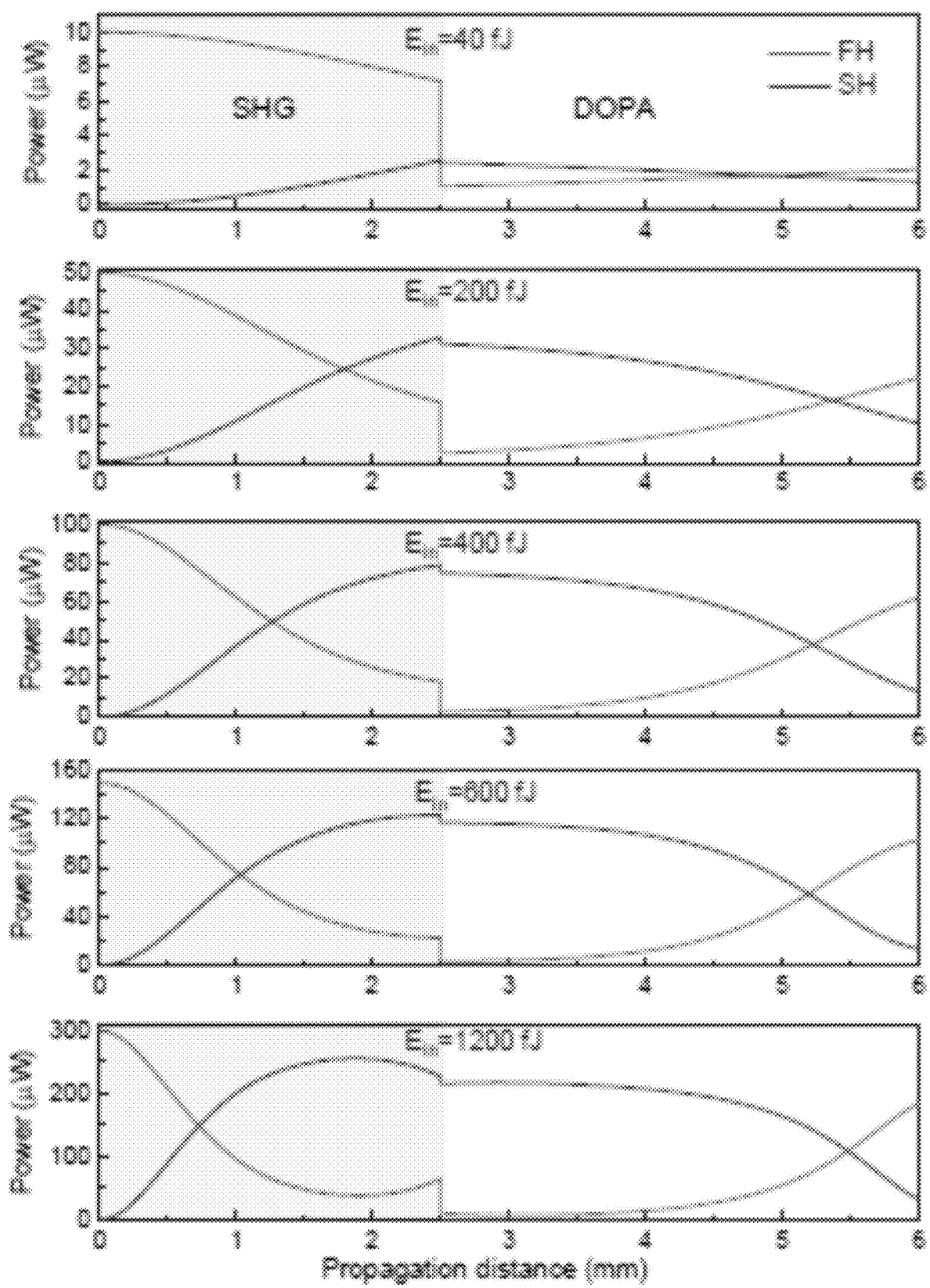
FIG. 25C. Simulated evolution of the FH and the SH optical power along the main waveguide at various input pulse energies.

The regime that the nonlinear splitter can function as an all-optical switch is highlighted by the yellow color. When the input FH pulse energy exceeds 600 fJ, the strong depletion of FH during the SHG process leads to the splitting of FH pulse and therefore significant spectral broadening, as shown in section A. Meanwhile, the phase difference between the FH and the SH is altered. As a result, in the SHG region, the SH energy can even flow back into the FH, which is evident by the increased FH transmission at higher input pulse energy shown in FIG. 25a. The change of the phase difference between the FH and SH during the SHG process can also lower the parametric gain of the DOPA. This explains why the transmittance of the FH at the through port is no longer increasing, as shown in FIG. 25b. FIG. 25 *c* shows the simulated power evolution of the FH and the SH along the entire device. Clearly, when the input pulse energy is high (e.g. 1200 fJ), significant back-conversion can happen in the SHG region.

D. Pulse Shortening Effect

Figure 26:
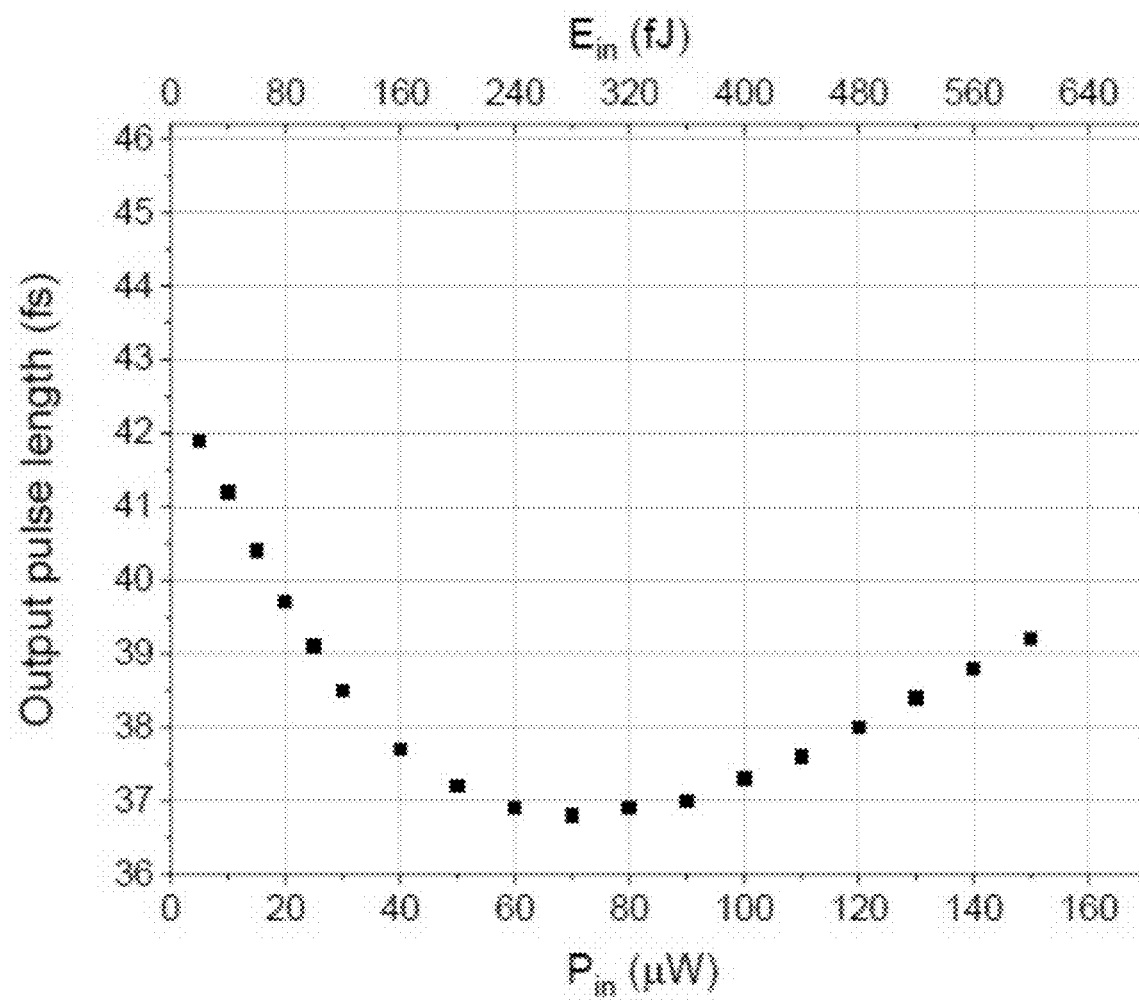
FIG. 26. Simulated pulse shortening effect of the nonlinear splitter

At low input pulse energies, the nonlinear splitter shows an increased FH transmittance with higher input FH pulse energy. Therefore in principle, the nonlinear splitter device can function as an artificial saturable absorber which can be utilized to shorten the input FH pulses. In FIG. 26 we plot the simulated output FH pulse length as a function of input pulse energy. Given that the input pulse length is 46.2 fs, it is evident that the nonlinear splitter can significantly shorten the pulse by more than 9 fs. However, when the input FH pulse energy is higher, the pulse shortening effect becomes weaker due to the aforementioned strong depletion of FH during the SHG process.

VII. Performance Comparison of On-Chip All-Optical Switches

Figure 27:
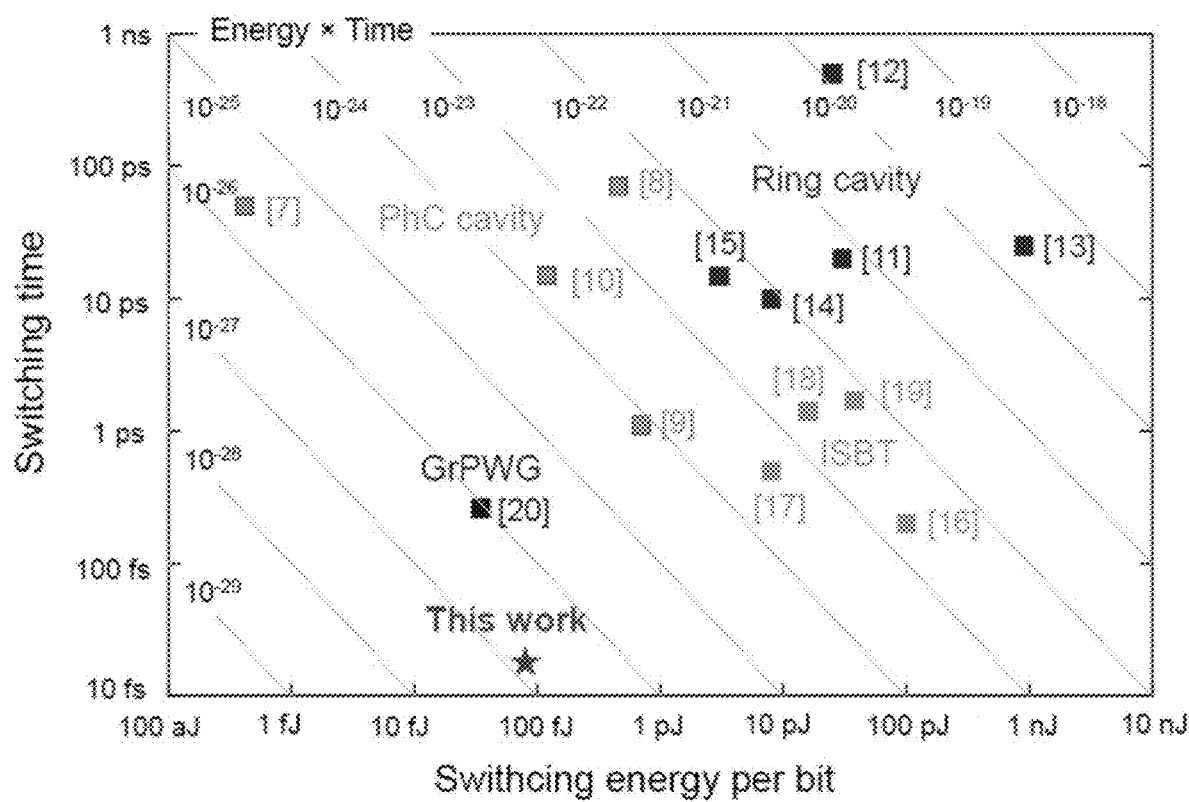
FIG. 27. Performance comparison of various on-chip all-optical switches operating at room temperature. The data points dictate the switching time and switching energy per bit for switches based on photonic crystal (PhC) cavity[7-10], ring cavity[11-15], inter-subband transition (ISBT)[16-19], and graphene loaded plasmonic waveguide (GrPWG) [20]. Our device features the record-low switching energy-time product of 1.4 $10^{-27}$ J s, representing around an order of magnitude improvement over the previous all-optical switch based on graphene-loaded plasmonic waveguides.

FIG. 27 summarizes the switching time and energy per bit of various all-optical switching devices. The references are labeled in the figure. To make a fair comparison, here we mainly focus on comparing on-chip all-optical switches operating at room temperature.

VIII. Attojoule All-Optical Switching

Figure 28A:
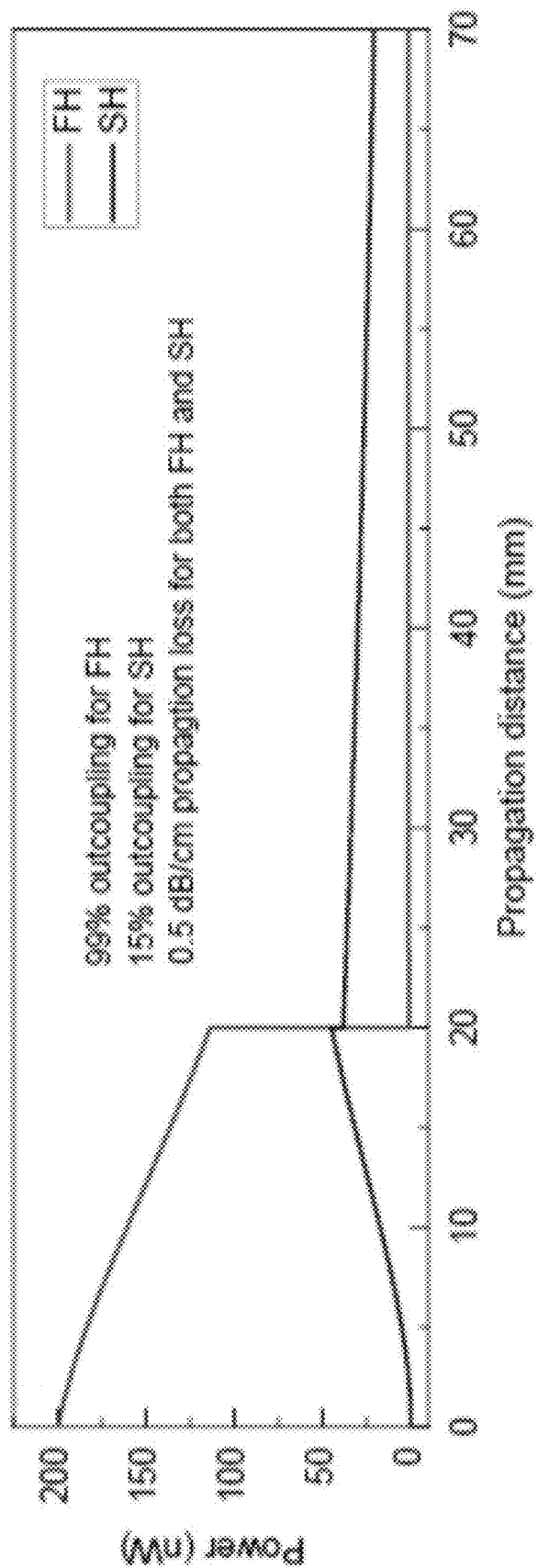
FIG. 28A-28C Attojoule all-optical switching.
Figures 28B, 28C:
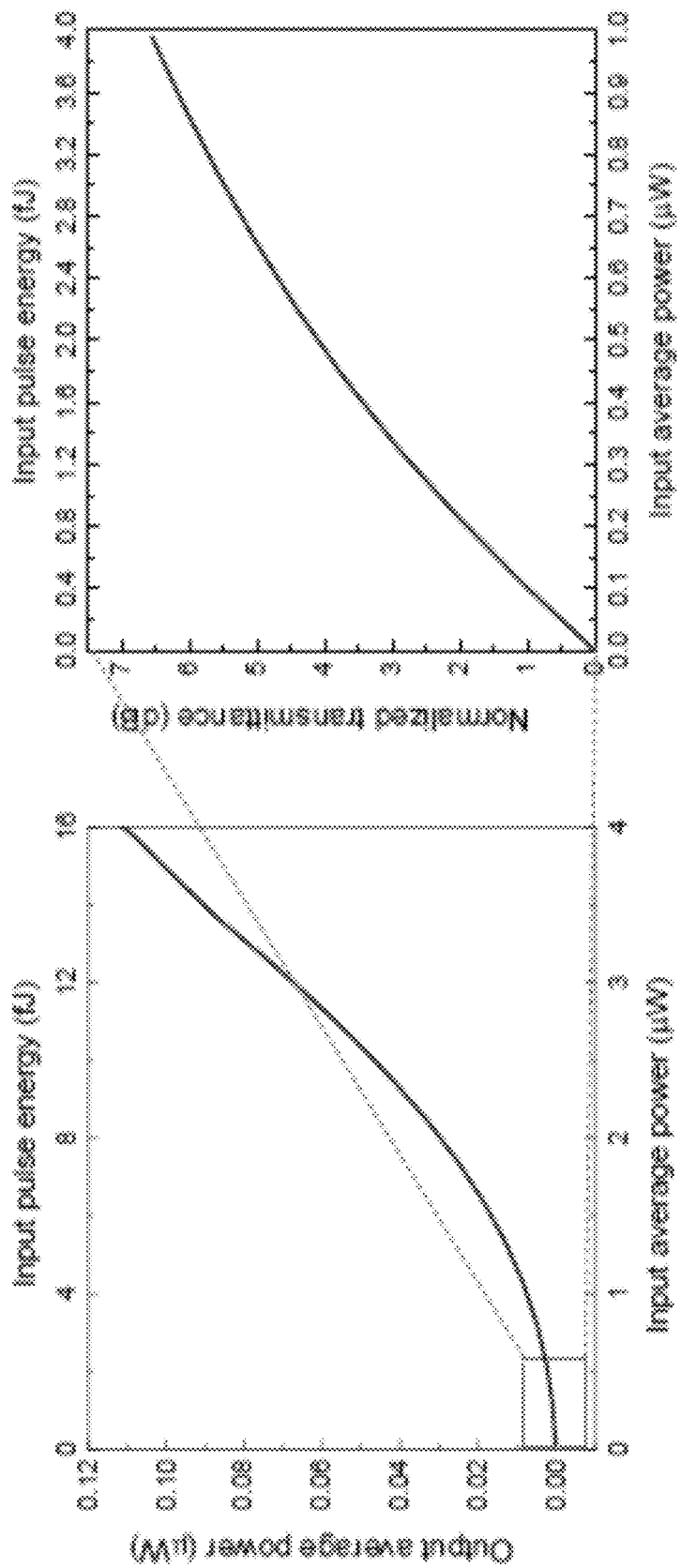

In this section, we showcase an example device design which enables non-resonant sub-femtojoule all-optical switching. As mentioned in the main text, our dispersion engineered LN nanophotonic waveguide offers ultra-low group velocity mismatch (GVM=−0.41 fs/mm) and low group velocity dispersion (GVD) both at the FH and the SH frequencies. We can therefore engineer the length of the nonlinear splitter device to further lower the required pulse energy for all-optical switching. FIG. 28 shows that for a nonlinear splitter with 20-mm-long SHG region, 50-mm long DOPA region, 99% output coupling for the FH, 15% output coupling for the SH, and 0.5 dB/cm propagating loss for the FH and the SH, one can achieve ~2 dB switching with only 800 aJ input pulse energy.

REFERENCES FOR EXAMPLES 1-2

The following references are incorporated by reference herein:

[1] T. Schibli, K. Minoshima, F.-L. Hong, H. Inaba, Y. Bitou, A. Onae, et al., "Phase-locked widely tunable optical single-frequency generator based on a femtosecond comb," Optics letters, vol. 30, pp. 2323-2325, 2005.
[2] S. A. Diddams, T. Udem, J. Bergquist, E. Curtis, R. Drullinger, L. Hollberg, et al., "An optical clock based on a single trapped 199Hg+ion," Science, vol. 293, pp. 825-828, 2001.
[3] P. L. McMahon, A. Marandi, Y. Haribara, R. Hamerly, C. Langrock, S. Tamate, et al., "A fully programmable 100-spin coherent Ising machine with all-to-all connections," Science, vol. 354, pp. 614-617, 2016.
[4] T. Inagaki, Y. Haribara, K. Igarashi, T. Sonobe, S. Tamate, T. Honjo, et al., "A coherent Ising machine for 2000-node optimization problems," Science, vol. 354, pp. 603-606, 2016.
[5] N. Picqué and T. W. Hänsch, "Frequency comb spectroscopy," Nature Photonics, vol. 13, pp. 146-157, 2019.
[6] H. C. Frankis, H. M. Mbonde, D. B. Bonneville, C. Zhang, R. Mateman, A. Leinse, et al., "Erbium-doped TeO 2-coated Si 3 N 4 waveguide amplifiers with 5 dB net gain," Photonics Research, vol. 8, pp. 127-134, 2020.
[7] P. Kik and A. Polman, "Erbium-doped optical-waveguide amplifiers on silicon," MRS bulletin, vol. 23, pp. 48-54, 1998.
[8] N. Singh, E. Ippen, and F. X. Kärtner, "Towards CW modelocked laser on chip—large mode area and NLI for stretched pulse mode locking," arXiv preprint arXiv: 2006.00942, 2020.
[9] J. Rönn, W. Zhang, A. Autere, X. Leroux, L. Pakarinen, C. Alonso-Ramos, et al., "Ultra-high on-chip optical gain in erbium-based hybrid slot waveguides," Nature communications, vol. 10, pp. 1-9, 2019.
[10] M. Demirtaş and F. Ay, "High-Gain Er 3+: Al2O3 On-Chip Waveguide Amplifiers," IEEE Journal of Selected Topics in Quantum Electronics, vol. 26, pp. 1-8, 2020.

REFERENCES FOR EXAMPLE 3

The following references are incorporated by reference herein.

[1] K. Gallo, G. Assanto, K. R. Parameswaran, and M. M. Fejer, Applied Physics Letters 79, 314 (2001).
[2] L. Ledezma, R. Sekine, Q. Guo, R. Nehra, S. Jahani, and A. Marandi, arXiv preprint arXiv:2104.08262 (2021).
[3] X. Guo, C.-L. Zou, and H. X. Tang, Optics Express 24, 21167 (2016).
[4] M. Ono, M. Hata, M. Tsunekawa, K. Nozaki, H. Sumikura, H. Chiba, and M. Notomi, Nature Photonics 14, 37 (2020).
[5] C. Wang, C. Langrock, A. Marandi, M. Jankowski, M. Zhang, B. Desiatov, M. M. Fejer, and M. Lončar, Optica 5, 1438 (2018).
[6] J. Zhao, M. Rüsing, U. A. Javid, J. Ling, M. Li, Q. Lin, and S. Mookherjea, Optics Express 28, 19669 (2020).
[7] J.-Y. Chen, Z.-H. Ma, Y. M. Sua, Z. Li, C. Tang, and Y.-P. Huang, Optica 6, 1244 (2019)
[8] M. Jankowski, C. Langrock, B. Desiatov, A. Marandi, C. Wang, M. Zhang, C. R. Phillips, M. Lončar, and M. M. Fejer, Optica 7, 40 (2020).
[9] Y. He, Q.-F. Yang, J. Ling, R. Luo, H. Liang, M. Li, B. Shen, H. Wang, K. Vahala, and Q. Lin, Optica 6, 1138 (2019).
[10] M. Zhang, B. Buscaino, C. Wang, A. Shams-Ansari, C. Reimer, R. Zhu, J. M. Kahn, and M. Lončar, Nature 568, 373 (2019).

REFERENCES FOR SUPPLEMENTARY INFORMATION

The following references are incorporated by reference herein.

[1] X. Guo, C.-L. Zou, and H. X. Tang. Optics express 24. 21167 (2016).
[2] C. Wittig, The Journal of Physical Chemistry B 109, 8428(2005).
[3] A. Weiner, Ultrafast optics, Vol. 72 (John Wiley & Sons, 2011).
[4] C. Phillips, C. Langrock, J. Pelc, M. Fejer, I. Hard, and M. E. Fermann, Optics Express 19, 18754(2011).
[5] D. H. Jundt, Optics letters 22, 1553(1997).
[6] L. Ledezma, R Sekine, Q. Guo, R. Nehra, S. Jahani, and A. Marandi, arXiv preprint arXiv:2104.08262 (2021).
[7] K. Nozaki, T. Tanabe, A. Shinya, S. Matsuo, T. Sato, H. Taniyama, and M. Notomi, Nature Photonics 4,477 (2010).

[8] T. Tanabe, K. Nishiguchi, A. Shinya, E. Kuramochi, H. Inokawa, M. Notomi, K. Yamada, T. Tsuchizawa, T. Watanabe, H. Fukuda, et al., Applied Physics Letters 90, 031115 (2007).

[9] X. Hu, P. Jiang, C. Ding. H. Yang, and Q. Gong. Nature Photonics 2,185(2008)

[10] C. Husko, A. De Rossi, S. Combrié, Q. V. Tran, F Raineri, and C. W. Wong, Applied Physics Letters 94, 021111(2009).

[11] T. A. Ibrahim, W. Cao, Y. Kim, J. Li, J. Goldhar, P.-T. Ho, and C. H. Lee, IEEE Photonics Technology Letters 15, 36 (2003)

[12] V. R. Almeida, C. A. Barrios, R. R. Panepucci, and M. Lipson, Nature 431, 1081 (2004).

[13] M. Waldow, T. Plötzing, M. Gottheil, M. Frirst, J Bolten, T. Wahlbrink, and H. Kurz, Optics Express 16, 7693(2008).

[14] A. Martinez, J. Blasco, P. Sanchis, J. V. Galán, J. Garcia-Rupérez, E. Jordana, P. Gautier, Y. Lebour, S. Hernandez, R. Spano, et al., Nano letters 10, 1506 (2010).

[15] J. S. Pelc, K. Rivoire, S. Vo, C. Santori, D. A. Fattal, and R. G. Beausoleil, Optics express 22, 3797 (2014).

[16] N. Tizuka, K. Kaneko, and N. Suzuki, IEEE journal of quantum electronics 42,765(2006).

[17] G. Cong, R. Akimoto, K. Akita, T. Hasama, and H. Ishikavva, Optics express 15, 12123(2007).

[18] T. Simoyama, S. Sekiguchi, H. Yoshida, J.-i. Kasai, T. Mozume, and H. Ishikawa, IEEE Photonics Technology Letters 19, 604(2007)

[19] Y. Li, A. Bhattacharyya, C. Thomidis, T. D. Moustakas, and R. Paiella, Optics express 15, 17922(2007).

[20] M. Ono, M. Hata, M. Tsunekawa, K. Nozaki, H. Sumikura, H. Chiba, and M. Notomi, Nature Photonics 14, 37 (2020).

Conclusion

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A chip-scale mode-locked laser, comprising:
a cavity comprising:
   a gain medium for amplifying signal electromagnetic radiation (signal) through stimulated emission, the signal comprising a signal wavelength; and
   a passive mode-locking device that provides an intensity-dependent transmission or reflection for the signal to enforce pulse formation in the laser, the passive mode-locking device comprising:
      a thin-film waveguide having a thickness on the order of the signal wavelength so as to confine and guide the signal along the thin-film waveguide,
      a material comprising a second-order nonlinear susceptibility enabling at least one of second harmonic generation or optical parametric amplification of the signal along the waveguide, and
   an output directional coupler providing different coupling ratios for the signal and a second harmonic of the signal (second harmonic), wherein the mode-locking device leads to generation of pulses of the signal outputted from the mode-locked laser.

2. The mode-locked laser of claim 1, wherein the gain medium comprises a second material deposited on or integrated with the thin-film waveguide, providing the stimulated emission of the signal in a presence of a pump electromagnetic radiation (pump) pumping the second material.

3. The mode-locked laser of claim 2, wherein the gain medium comprises a rare-earth ion-doped oxide.

4. The mode-locked laser of claim 2, wherein the second material comprises a rare-earth ion-doped oxide gain grown on top of the waveguide by atomic layer deposition (ALD) process or rare-earth ions diffused into the waveguide at a high temperature.

5. The mode-locked laser of claim 1, wherein the thin-film waveguide comprises a ridge having a width and the thickness guiding a mode associated with the signal, or a pump electromagnetic radiation optically pumping the gain medium to form the signal, with most of the mode's energy confined in a transverse cross-sectional area of the waveguide smaller than 3 micrometers by 3 micrometers.

6. The mode-locked laser of claim 1, wherein:
the signal is formed in response to an input pump electromagnetic radiation pumping the gain medium,
the input pump is continuous wave, and
the pulses each have a pulse width of less than 100 picoseconds.

7. The mode-locked laser of claim 1, wherein:
the gain medium comprises a semiconductor material that can be pumped either by pump electromagnetic radiation or electric current, and
the gain medium is integrated with the thin-film waveguide either through evanescent coupling or butt coupling.

8. The mode-locked laser of claim 7, wherein the thin-film waveguide is butt-coupled to the gain medium and an input port of the thin-film waveguide is adiabatically tapered in width in order to match one or more mode sizes of the pump electromagnetic radiation in the thin-film waveguide and in the gain medium.

9. The mode-locked laser of claim 7, wherein the thin-film waveguide is heterogeneously integrated with the gain medium through wafer bonding or micro-transfer-printing process and so that a transfer of the signal between the thin-film waveguide and the gain medium is through evanescent coupling.

10. The mode-locked laser of claim 1, wherein:
the mode-locking device is configured as a nonlinear mirror to enforce the pulse formation and passive mode-locking of the signal electromagnetic radiation;
the nonlinear mirror further comprises metal electrodes next to the thin-film waveguide; and
a relative phase between the signal and the second harmonic of the signal can be adjusted by applying a voltage on the electrodes according to an electro-optical effect.

11. The mode-locked laser of claim 10, wherein an output facet of the nonlinear mirror is mechanically polished and coated with a dielectric coating, and the dielectric coating ensures partial reflection of the signal and unity reflection of the second harmonic of the signal.

12. The mode-locked laser of claim 1, wherein the mode-locking device further comprises an electro-optic modulator comprising metal electrodes next to the thin-film waveguide, wherein a radio-frequency voltage source applied on the electrodes applies an electric field across the thin-film waveguide so as to periodically modulate a refractive index of the thin-film according to an electro-optical effect.

13. The mode-locked laser of claim 1, wherein the output directional coupler comprises a loop mirror.

14. The mode-locked laser of claim 1, wherein the material of the thin-film waveguide comprises lithium niobate, lithium tantalate, Potassium Titanyl Phosphate (KTP), aluminum nitride, gallium arsenide, indium phosphide, or aluminum gallium arsenide.

15. The mode-locked laser of claim 1, wherein:
the waveguide comprises a plurality of quasi-phase-matched regions through spatially varying nonlinear susceptibility, for instance through ferroelectric poling or orientation patterning, that ensures phase-matched second-order nonlinear interactions:
in a first region of the waveguide, wherein the mode locking device generates the second harmonic electromagnetic radiation comprising the second harmonic of the signal wavelength through the non-linear interaction comprising second harmonic generation,
in a second region, wherein the device down-converts at least a portion of the second harmonic electromagnetic radiation into the signal wavelength through the nonlinear interaction comprising the optical parametric amplification;
the device further comprising the output directional coupler that preferentially couples the signal out of the laser cavity, as compared to the second harmonic, so as to selectively enhance resonance of higher intensity signal modes of the signal while suppressing resonance of lower-intensity signal modes in the cavity due to the stronger second harmonic generation processes in the first region of the waveguide and the stronger optical parametric amplification process in the second region of the waveguide for the higher intensity modes as compared to the lower intensity signal modes,
and the electromagnetic radiation coupled out of the cavity through the output directional coupler comprises a train of the mode-locked pulses each having a pulse duration of less than 100 picoseconds.

16. The mode-locked laser of claim 1, wherein the waveguide comprises:
a first quasi-phase-matched region wherein a phase-matched nonlinear process is the second harmonic generation of signal,
a second quasi-phase-matched region wherein the signal is parametrically amplified by the second harmonic,
a third region between the first region and the second region to provide an approximately 180 phase shift in the relative phase of the signal and the second harmonic.

17. A method of making a chip-scale mode-locked laser, comprising:
providing a cavity comprising:
a gain medium for amplifying signal electromagnetic radiation (signal) through stimulated emission, the signal comprising a signal wavelength; and
a passive mode-locking device that provides an intensity-dependent transmission or reflection for the signal to enforce pulse formation in the laser, the mode-locking device comprising:
a thin-film waveguide having a thickness on the order of the signal wavelength so as to confine and guide the signal along the thin-film waveguide,
a material comprising a second-order nonlinear susceptibility enabling at least one of second harmonic generation or optical parametric amplification of the signal along the waveguide, and
an output directional coupler providing different coupling ratios for the signal and a second harmonic of the signal (second harmonic), wherein the mode-locking device leads to generation of pulses of the signal outputted from the mode-locked laser.

18. A method of operating a chip-scale mode-locked laser, comprising:
coupling a gain medium and a passive mode-locking device in a cavity;
amplifying signal electromagnetic radiation (signal) through stimulated emission in the gain medium, the signal comprising a signal wavelength; and
passively mode-locking the signal using the passive mode-locking device that provides an intensity-dependent transmission or reflection for the signal so as to enforce pulse formation in the laser, wherein the passive mode-locking device comprises:
a thin-film waveguide having a thickness on the order of the signal wavelength so as to confine and guide the signal along the thin-film waveguide,
a material comprising a second-order nonlinear susceptibility enabling at least one of second harmonic generation or optical parametric amplification of the signal along the waveguide, and
an output directional coupler providing different coupling ratios for the signal and a second harmonic of the signal (second harmonic), wherein operation of the mode-locking device leads to generation of pulses of the signal outputted from the mode-locked laser.

* * * * *